(12) United States Patent
Miyazaki et al.

(10) Patent No.: US 9,466,689 B2
(45) Date of Patent: Oct. 11, 2016

(54) METHOD FOR MANUFACTURING A SEMICONDUCTOR DEVICE AND SEMICONDUCTOR DEVICE MANUFACTURED THEREBY

(71) Applicant: FUJI ELECTRIC CO., LTD., Kawasaki-shi (JP)

(72) Inventors: Masayuki Miyazaki, Matsumoto (JP); Takashi Yoshimura, Matsumoto (JP); Hiroshi Takishita, Matsumoto (JP); Hidenao Kuribayashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/372,451

(22) PCT Filed: Mar. 29, 2013

(86) PCT No.: PCT/JP2013/059776
§ 371 (c)(1),
(2) Date: Jul. 16, 2014

(87) PCT Pub. No.: WO2013/147275
PCT Pub. Date: Oct. 3, 2013

(65) Prior Publication Data
US 2015/0024556 A1 Jan. 22, 2015

(30) Foreign Application Priority Data
Mar. 30, 2012 (JP) .................................. 2012-080685

(51) Int. Cl.
*H01L 29/739* (2006.01)
*H01L 29/66* (2006.01)
(Continued)

(52) U.S. Cl.
CPC ......... *H01L 29/66348* (2013.01); *H01L 21/26* (2013.01); *H01L 21/26513* (2013.01);
(Continued)

(58) Field of Classification Search
CPC .................. H01L 21/3223; H01L 29/66007; H01L 29/66234; H01L 29/70
See application file for complete search history.

(56) References Cited

U.S. PATENT DOCUMENTS

| 7,956,419 B2 | 6/2011 | Francis et al. |
| 2002/0117712 A1 | 8/2002 | Matsudai et al. |

(Continued)

FOREIGN PATENT DOCUMENTS

| CN | 101494223 A | 7/2009 |
| JP | 09-260662 A | 10/1997 |

(Continued)

OTHER PUBLICATIONS

Japanese Office Action with translation dated Mar. 3, 2015.
(Continued)

*Primary Examiner* — Cheung Lee
(74) *Attorney, Agent, or Firm* — Rabin & Berdo, P.C.

(57) ABSTRACT

A semiconductor device includes an input electrode provided on a front surface of a semiconductor substrate of a first conductivity type and an output electrode provided on a rear surface of the semiconductor substrate. The device has reduced deterioration of electrical characteristics when manufactured by a method including introducing impurities into the rear surface of the semiconductor substrate; activating the impurities using a first annealing process to form a first semiconductor layer, which is a contact portion in contact with the output electrode, in a surface layer of the rear surface; radiating protons to the rear surface; and activating the protons radiated using a second annealing process to form a second semiconductor layer of the first conductivity type, which has a higher impurity concentration than the semiconductor substrate, in a region that is deeper than the first semiconductor layer from the rear surface of the semiconductor substrate.

23 Claims, 53 Drawing Sheets

(51) Int. Cl.
  *H01L 21/26* (2006.01)
  *H01L 29/32* (2006.01)
  *H01L 21/265* (2006.01)
  *H01L 21/30* (2006.01)
  *H01L 29/36* (2006.01)
  *H01L 29/861* (2006.01)

(52) U.S. Cl.
  CPC ........... *H01L21/3003* (2013.01); *H01L 29/32* (2013.01); *H01L 29/36* (2013.01); *H01L 29/66128* (2013.01); *H01L 29/66333* (2013.01); *H01L 29/7393* (2013.01); *H01L 29/7397* (2013.01); *H01L 29/8611* (2013.01)

(56) References Cited

U.S. PATENT DOCUMENTS

| | | |
|---|---|---|
| 2002/0130331 A1 | 9/2002 | Nemoto et al. |
| 2004/0041225 A1 | 3/2004 | Nemoto |
| 2006/0035436 A1 | 2/2006 | Schulze |
| 2006/0081923 A1 | 4/2006 | Mauder et al. |
| 2006/0138607 A1 | 6/2006 | Nemoto |
| 2006/0205122 A1 | 9/2006 | Schulze et al. |
| 2008/0054369 A1 | 3/2008 | Schulze et al. |
| 2009/0184340 A1 | 7/2009 | Nemoto et al. |
| 2012/0267681 A1 | 10/2012 | Nemoto et al. |

FOREIGN PATENT DOCUMENTS

| | | |
|---|---|---|
| JP | 2002-261282 A | 9/2002 |
| JP | 2002-299346 A | 10/2002 |
| JP | 2003-152198 A | 5/2003 |
| JP | 2003-318412 A | 11/2003 |
| JP | 2007-173675 A | 7/2007 |
| JP | 2007-266233 A | 10/2007 |
| JP | 2008-227414 A | 9/2008 |
| JP | 2009-099705 A | 5/2009 |
| JP | 2009-176892 A | 8/2009 |
| WO | WO 2011-052787 A1 | 5/2011 |

OTHER PUBLICATIONS

Extended European Search Report dated Jul. 20, 2015.
Japanese Office Action with translation dated Jul. 28, 2015.

FIG. 44

| RATED VOLTAGE (V) | BREAKDOWN VOLTAGE (V) | TOTAL THICKNESS OF SUBSTRATE $W_0$ (μm) | SPECIFIC RESISTANCE (Ωcm) | AVERAGE CONCENTRATION OF DRIFT LAYER (/cm³) | RATED CURRENT DENSITY (A/cm²) | DENSITY INDEX L (μm) | FS LAYER WHICH DEPLETION LAYER REACHES FIRST : DISTANCE FROM REAR SURFACE X (μm) |||||||||||
|---|---|---|---|---|---|---|---|---|---|---|---|---|---|---|---|---|
| | | | | | | | $W_0$-0.7L | $W_0$-0.8L | $W_0$-0.9L | $W_0$-1.0L | $W_0$-1.1L | $W_0$-1.2L | $W_0$-1.3L | $W_0$-1.4L | $W_0$-1.5L | $W_0$-1.6L |
| 600 | 700 | 60 | 30 | $1.5 \times 10^{14}$ | 300 | 31.9 | 37.7 | 34.5 | 31.3 | 28.1 | 24.9 | 21.7 | 18.5 | 15.3 | 12.1 | 8.9 |
| 1200 | 1400 | 120 | 60 | $7.7 \times 10^{13}$ | 200 | 58.2 | 79.2 | 73.4 | 67.6 | 61.8 | 55.9 | 50.1 | 44.3 | 38.5 | 32.7 | 26.8 |
| 1700 | 1900 | 170 | 85 | $5.4 \times 10^{13}$ | 150 | 80.8 | 113.4 | 105.3 | 97.3 | 89.2 | 81.1 | 73.0 | 64.9 | 56.9 | 48.8 | 40.7 |
| 3300 | 3500 | 330 | 165 | $2.8 \times 10^{13}$ | 80 | 155.0 | 221.5 | 206.0 | 190.5 | 175.0 | 159.5 | 144.0 | 128.5 | 113.0 | 97.5 | 82.0 |
| 4500 | 4700 | 450 | 225 | $2.0 \times 10^{13}$ | 50 | 223.1 | 293.8 | 271.5 | 249.2 | 226.9 | 204.6 | 182.3 | 160.0 | 137.7 | 115.4 | 93.1 |
| 6500 | 6700 | 650 | 325 | $1.4 \times 10^{13}$ | 30 | 337.3 | 413.9 | 380.1 | 346.4 | 312.7 | 278.9 | 245.2 | 211.5 | 177.7 | 144.0 | 110.3 |

METHOD FOR MANUFACTURING A SEMICONDUCTOR DEVICE AND SEMICONDUCTOR DEVICE MANUFACTURED THEREBY

BACKGROUND OF THE INVENTION

1. Field of the Invention

The present invention relates to a method for manufacturing a semiconductor device.

2. Background of the Related Art

For example, an insulated gate bipolar transistor (IGBT) or a diode with a breakdown voltage of 400 V, 600 V, 1200 V, 1700 V, 3300 V, or more has been known as a power semiconductor device. The power semiconductor device is used in a power conversion device, such as a converter or an inverter.

The following method has been known as a method for manufacturing the power semiconductor device. First, a front surface element structure is formed on a front surface of a semiconductor substrate. Then, a rear surface of the semiconductor substrate is removed by, for example, grinding to reduce the thickness of the semiconductor substrate. Then, impurity ions are implanted into the ground rear surface of the semiconductor substrate. Then, a heat treatment is performed to activate the impurities implanted into the rear surface of the semiconductor substrate to form a rear surface element structure. In addition, as this type of method, various methods have been proposed which radiate protons to the semiconductor substrate and perform a heat treatment to form an $n^+$ layer with high concentration in the semiconductor substrate, using a hydrogen induced donor (or simply a hydrogen donor) obtained by changing a composite defect of radiated (implanted) hydrogen atom and a peripheral vacancy into a donor.

A method for manufacturing a trench gate IGBT, which is an example of the semiconductor device, using the activation of the proton by the heat treatment will be described. FIGS. 26 to 31 are cross-sectional views illustrating the semiconductor device according to the related art which is being manufactured. FIG. 32 is a cross-sectional view illustrating the semiconductor device after a process which follows the process illustrated in FIG. 31. First, as illustrated in FIG. 26, an $n^-$ semiconductor substrate which will be an $n^-$ drift layer 101 is prepared. Then, as illustrated in FIG. 27, a trench-gate-type MOS gate (metal-oxide-semiconductor insulated gate) structure including a p base region 102, an $n^+$ emitter region 103, a trench 104, a gate oxide film 105, and a gate electrode 106 are formed on the front surface of the semiconductor substrate. Reference numeral 108 is an interlayer insulating film.

Then, as illustrated in FIG. 28, an emitter electrode 107 is formed so as to come into contact with the p base region 102 and the $n^+$ emitter region 103. Then, the rear surface of the semiconductor substrate is removed by, for example, grinding to reduce the thickness of the semiconductor substrate. Then, a proton ($H^+$) 121 is radiated to the ground rear surface of the semiconductor substrate. In FIG. 28, an "x" mark in the vicinity of the rear surface of the semiconductor substrate indicates the radiated proton (which holds for FIGS. 7, 11, 18, 22, 48, 50, and 52). Then, as illustrated in FIG. 29, the proton 121 radiated to the semiconductor substrate is activated by annealing to form an n field stop (FS) layer 110 in the $n^-$ drift layer 101 in the vicinity of the rear surface.

Then, as illustrated in FIG. 30, boron ions ($B^+$) 122 are implanted into a region that is shallower than the n field stop layer 110 from the rear surface of the semiconductor substrate. In FIG. 30, a dotted line in the vicinity of the rear surface of the semiconductor substrate indicates the implanted impurity ion (which holds for FIGS. 5, 9, 16, 20, 37, and 53). Then, as illustrated in FIG. 31, the boron ions 122 implanted into the semiconductor substrate are activated by annealing to form a $p^+$ collector layer 109 in a surface layer of the rear surface of the semiconductor substrate. Then, as illustrated in FIG. 32, a collector electrode 111 is formed so as to come into contact with the $p^+$ collector layer 109. In this way, the trench gate IGBT is completed.

A method for manufacturing a diode, which is an example of the semiconductor device, using the activation of the proton by the heat treatment will be described. FIGS. 33 to 38 are cross-sectional views illustrating another example of the semiconductor device which is being manufactured. FIG. 39 is a cross-sectional view illustrating the semiconductor device after a process which follows FIG. 38. First, as illustrated in FIG. 33, an $n^-$ semiconductor substrate 131 is prepared. Then, as illustrated in FIG. 34, a p anode region 132 is formed in a front surface of the semiconductor substrate 131. Reference numeral 134 is an interlayer insulating film.

Then, as illustrated in FIG. 35, an anode electrode 133 is formed on the front surface of the semiconductor substrate 131 so as to come into contact with the p anode region 132. Then, as illustrated in FIGS. 35 and 36, similarly to the IGBT manufacturing method, a rear surface of the semiconductor substrate 131 is ground and proton irradiation and annealing are performed to an n field stop layer 136 in the semiconductor substrate 131 in the vicinity of the rear surface. Then, as illustrated in FIG. 37, phosphorus ions ($P^+$) 123 are implanted into a region that is shallower than the n field stop layer 136 from the rear surface of the semiconductor substrate 131.

Then, as illustrated in FIG. 38, the phosphorus ions 123 implanted into the semiconductor substrate 131 are activated by annealing to form an $n^+$ cathode layer 135 in a surface layer of the rear surface of the semiconductor substrate 131. Then, as illustrated in FIG. 39, a cathode electrode 137 is formed so as to come into contact with the $n^+$ cathode layer 135. In this way, the diode is completed. That is, in both the IGBT manufacturing method and the diode manufacturing method, after proton irradiation and annealing for forming the n field stop layer are performed, ion implantation and annealing for forming the rear surface element structure on the rear surface of the semiconductor substrate are performed.

As the semiconductor device manufacturing method, a method has been proposed which radiates protons to a semiconductor substrate, performs a heat treatment to form a high-concentration $n^+$ buffer layer (field stop layer), and implants p-type impurities, such as phosphorus (P), to form a $p^-$ collector region, for example, see U.S. Pat. No. 7,956, 419 (Patent Document 1). In Patent Document 1, the dose of the p-type impurities, such as phosphorus or arsenic (As), is intentionally reduced and annealing is performed at an annealing temperature lower than the annealing temperature which is most suitable to form a high-concentration collector region to form the $p^-$ collector region.

US 2006/0081923 A (Patent Document 2) discloses the structure of an IGBT in which protons are radiated to a rear surface of a semiconductor substrate a plurality of times to form a plurality of field stop layers including hydrogen donors and, particularly, the depth of the field stop layer, which is arranged at the deepest position from the rear surface of the substrate, from the rear surface of the substrate is 15 µm. In this structure, a plurality of field stop layers are formed in the region extending from the rear surface of the substrate to a depth of 15 µm and, particularly, the field stop layer close to the rear surface of the substrate has a high impurity concentration of about $1\times10^{16}/cm^3$. Therefore, the field stop layer can reliably prevent the spreading of a depletion layer and it is possible to prevent the depletion layer from reaching the p collector layer.

US 2006/0035436 A (Patent Document 3) discloses the following method as the IGBT manufacturing method. A MOS gate structure is formed on the front surface side of a semiconductor substrate and the rear surface of the substrate is removed by, for example, grinding to reduce the thickness of the semiconductor substrate. Then, protons are radiated to the ground surface (rear surface) of the semiconductor substrate and an annealing process is performed to form a field stop layer. Then, boron ions are implanted into the rear surface of the semiconductor substrate and laser annealing is performed to form a p-type collector layer.

JP 2009-176892 A (Patent Document 4) discloses the following method as the IGBT manufacturing method. A MOS gate structure is formed on the front surface side of a semiconductor substrate and a rear surface of the semiconductor substrate is removed by, for example, grinding to reduce the thickness of the semiconductor substrate. Then, protons are radiated to the ground surface (rear surface) of the semiconductor substrate. Then, an annealing process using laser beams with two wavelengths, which are emitted from a pulsed laser and a semiconductor continuous-wave laser, is performed for the proton-radiated surface (the rear surface of the substrate) to form a field stop layer at a depth of about 15 µm from the proton-radiated surface.

However, in Patent Document 1, it is difficult to increase the annealing temperature of all annealing processes, which are performed after the proton irradiation, to 500° C. or more in order to set the impurity concentration of the high-concentration $n^+$ buffer layer formed by the proton irradiation and the annealing to a desired value. The reason is that, when the annealing temperature is equal to or higher than 500° C., lattice defects formed by the proton irradiation are reduced and the concentration of the hydrogen induced donors is reduced. In order to ensure the sufficient concentration of the hydrogen induced donors, the annealing temperature may be equal to or higher than 300° C. and equal to or lower than 500° C., particularly, equal to or lower than 400° C. In this case, it is possible to obtain 10% or more donor change rate with respect to the dose of the radiated protons.

When the annealing temperature of all annealing processes which are performed after the proton irradiation is equal to or lower than 400° C., particularly, equal to or lower than 350° C., the amount of heat for activating the impurities is insufficient in the annealing process after the impurity implantation for forming a contact is performed with a high dose required to form the ohmic contact between the semiconductor layer and the rear surface electrode and a high-concentration contact portion required for the ohmic contact with the electrode is not obtained. Therefore, there is a concern that deterioration of electrical characteristics, such as a reduction in contact resistance or a reduction in the on-voltage (Von) of the IGBT or the diode, will occur.

In Patent Document 2, the field stop layer including the hydrogen donors is formed at a depth of 15 µm from the proton-radiated surface (the rear surface of the substrate). However, the field stop layer needs to be formed at a position that is deeper than 15 µm from the proton-radiated surface, in order to improve the electrical characteristics of the IGBT or the diode. However, the inventors found that, when the average range of proton irradiation (the distance of the position where the concentration of the radiated ions was the highest from the irradiation surface) was set to 15 µm or more in order to form the field stop layer at the position that was deeper than 15 µm from the rear surface of the semiconductor substrate, a proton passage region extending from the rear surface of the semiconductor substrate to a depth of 15 µm was a region in which carrier concentration measured by a spreading resistance (SR) profiling method was significantly lower than the doping concentration of the semiconductor substrate, that is, a disorder region.

The defects introduced by the proton irradiation mainly remain in the proton passage region from the proton-radiated surface to the average range or in the vicinity of the proton-radiated surface, in addition to the position corresponding to the average range of the protons. The residual defect is in a state close to an amorphous state due to the large deviation of an atom (in this case, a silicon atom) from a lattice position and the strong disorder of a crystal lattice. Therefore, the residual defect becomes the scattering center of a carrier, such as an electron and a hole. In this case, the characteristics of the element deteriorate as follows: carrier mobility is reduced; and as electrical resistance increases, the amount of leakage current increases since the residual defect is the generation center of a carrier. As such, the defect which remains in the proton passage region extending from the proton-radiated surface to the average range due to proton irradiation, causes a reduction in the carrier mobility or a reduction in leakage current, and is strongly disordered from the crystal state is particularly referred to as a disorder.

FIG. 40 is a characteristic diagram illustrating the relationship between carrier concentration and the average range of proton irradiation according to the related art. FIG. 40 illustrates the carrier concentration of a silicon substrate which is measured by the SR method after protons are radiated to the silicon substrate and a heat treatment is performed at a temperature of 350° C. FIG. 40(*a*) illustrates a case in which the average range of proton irradiation is 50 µm, FIG. 40(*b*) illustrates a case in which the average range of proton irradiation is 20 µm, and FIG. 40(*c*) illustrates a case in which the average range of proton irradiation is 15 µm. In FIGS. 40(*a*) to 40(*c*), the horizontal axis is the distance (depth) from a proton incident surface (the rear surface of the substrate). When the average range of proton irradiation is 15 µm as illustrated in FIG. 40(*c*), the carrier concentration of the proton passage region is not particularly reduced. In contrast, when the average range of proton irradiation is 20 µm as illustrated in FIG. 40(*b*), the carrier concentration of the proton passage region is reduced and is lower than the substrate concentration. That is, the disorder remains in the region in which the carrier concentration is lower than the substrate concentration. In addition, when the average range of proton irradiation is 50 µm as illustrated in FIG. 40(*a*), the carrier concentration of the proton passage region is significantly reduced and a large amount of disorder remains. As such, when there is a disorder region in the semiconductor substrate, the amount of leakage current or conduction loss increases, as described above. Therefore, it is necessary to remove the disorder.

In the method disclosed in Patent Document 3, some of the disorder can be reduced by adjusting the conditions, such as the temperature or time of the annealing process after proton irradiation. However, when the layer into which boron ions are implanted from the rear surface of the substrate is activated in order to sufficiently ensure the concentration of the hydrogen induced donors, the temperature of the annealing process in an electric furnace needs to be lower than the annealing temperature after proton irradiation. Therefore, the implanted boron ions are not activated and it is difficult to obtain the ohmic contact with the rear surface electrode in the subsequent process. When the laser annealing is performed after the boron implantation as described in Patent Document 3, the temperature at a depth of about 10 μm from the laser irradiation surface (the rear surface of the substrate) is equal to or higher than about 800° C. for about 10 μs after the laser beam is radiated. The boron ions are sufficiently activated to form the ohmic contact by the thermal budget (thermal energy). However, in particular, when a plurality of field stop layers are formed in the range extending from the rear surface of the substrate to a depth of about 10 μm, the temperature of the region extending from the rear surface of the substrate to a depth of about 10 μm is increased to 800° C. or more by the heat of the laser beam in a short time. A large number of hydrogen donors vanish and it is difficult to obtain sufficient hydrogen donor concentration. As a result, it is difficult to ensure the donor concentration of the field stop layer at a depth of about 10 μm from the rear surface of the substrate.

In the method disclosed in Patent Document 4, the boron layer in the rear surface of the substrate can be activated. However, when the field stop layer is formed at the position that is deeper than 15 μm from the rear surface of the substrate using the hydrogen donors, it is difficult to sufficiently reduce the disorder. When a plurality of field stop layers are formed at a position that is shallower than 15 μm from the rear surface of the substrate using the hydrogen donors, it is difficult to ensure sufficient donor concentration as in Patent Document 3.

In order to solve the above-mentioned problems of the related art, an object of the invention is to provide a method for manufacturing a semiconductor device which can prevent deterioration of electrical characteristics.

SUMMARY OF THE INVENTION

In order to solve the above-mentioned problem and achieve the object of the invention, according to an aspect of the invention, there is provided a method for manufacturing a semiconductor device including an input electrode that is provided on a front surface of a semiconductor substrate of a first conductivity type and an output electrode that is provided on a rear surface of the semiconductor substrate. The method has the following characteristics. First, an introduction step of introducing impurities into the rear surface of the semiconductor substrate is performed. Then, a first annealing step of activating the impurities introduced into the rear surface of the semiconductor substrate using a first annealing process to form a first semiconductor layer, which is a contact portion with the output electrode, in a surface layer of the rear surface of the semiconductor substrate is performed. Then, an irradiation step of radiating a proton to the rear surface of the semiconductor substrate is performed after the first annealing step. Then, a second annealing step of activating the proton radiated to the rear surface of the semiconductor substrate using a second annealing process to form a second semiconductor layer of the first conductivity type, which has a higher impurity concentration than the semiconductor substrate, in a region that is deeper than the first semiconductor layer from the rear surface of the semiconductor substrate is performed.

In the method for manufacturing a semiconductor device according to the above-mentioned aspect of the invention, the irradiation step may be performed a plurality of times after the first annealing step. The second annealing step may be performed whenever the irradiation step is performed, or the second annealing step may be performed once after the last irradiation step.

The method for manufacturing a semiconductor device according to the above-mentioned aspect of the invention may further include an output electrode forming step of forming the output electrode which comes into contact with the first semiconductor layer. The second annealing step may be performed before the output electrode forming step, or the second annealing step and the output electrode forming step may be performed at the same time.

In the method for manufacturing a semiconductor device according to the above-mentioned aspect of the invention, the first annealing step may be performed at a higher annealing temperature than the second annealing step.

In the method for manufacturing a semiconductor device according to the above-mentioned aspect of the invention, the temperature of the second annealing process may be equal to or higher than 380° C. and equal to or lower than 450° C.

In the method for manufacturing a semiconductor device according to the above-mentioned aspect of the invention, in the introduction step, the impurities may be introduced with a sufficient dose to obtain an ohmic contact between the output electrode and the first semiconductor layer.

The method for manufacturing a semiconductor device according to the above-mentioned aspect of the invention may further include an input electrode forming step of forming the input electrode on the front surface of the semiconductor substrate after the first annealing step.

In the method for manufacturing a semiconductor device according to the above-mentioned aspect of the invention, the first annealing step may be a laser annealing step.

In the method for manufacturing a semiconductor device according to the above-mentioned aspect of the invention, the second semiconductor layer may be a field stop layer which suppresses the spreading of a depletion layer.

In the method for manufacturing a semiconductor device according to the above-mentioned aspect of the invention, the semiconductor device may be an insulated gate bipolar transistor. The first semiconductor layer may be a collector layer of a second conductivity type. The output electrode may be a collector electrode.

In the method for manufacturing a semiconductor device according to the above-mentioned aspect of the invention, the semiconductor device may be a diode. The first semiconductor layer may be a cathode layer of the first conductivity type. The output electrode may be a cathode electrode.

In the method for manufacturing a semiconductor device according to the above-mentioned aspect of the invention, a drift layer of the first conductivity type which is the semiconductor substrate may be provided. A third semiconductor layer of a second conductivity type may be formed in the front surface of the semiconductor substrate. When q is an elementary charge, $N_d$ is the average concentration of the drift layer, $\epsilon_S$ is the permittivity of the semiconductor substrate, $V_{rate}$ is a rated voltage, $J_F$ is rated current density, and $v_{sat}$ is a saturated speed at which a speed of carriers is saturated with predetermined electric field intensity, a distance index L may be represented by the following Expression (1). When the depth of a position where the carrier concentration of the second semiconductor layer closest to the third semiconductor layer is peak concentration from the rear surface of the semiconductor substrate is X and the thickness of the semiconductor substrate is $W_0$, the position where the carrier concentration of the first semiconductor layer closest to the semiconductor layer is the peak concentration may be set such that $X=W_0-\gamma L$ is established and $\gamma$ is equal to or greater than 0.2 and equal to or less than 1.5.

$$L = \sqrt{\frac{\varepsilon_S V_{rate}}{q\left(\dfrac{J_F}{qv_{sat}} + N_d\right)}}.$$ [Expression 1]

In the method for manufacturing a semiconductor device according to the above-mentioned aspect of the invention, $\gamma$ may be equal to or greater than 0.9 and equal to or less than 1.4.

In the method for manufacturing a semiconductor device according to the above-mentioned aspect of the invention, $\gamma$ may be equal to or greater than 1.0 and equal to or less than 1.3.

In the method for manufacturing a semiconductor device according to the above-mentioned aspect of the invention, in the irradiation step, acceleration energy E of the proton when the second semiconductor layer with a range Rp is formed by the radiation of the proton may satisfy the following Expression (2) in which x is a logarithm log(Rp) of the range Rp and y is a logarithm log(E) of the acceleration energy E.

$$y = -0.0047x^4 + 0.0528x^3 - 0.2211x^2 + 0.9923x + 5.0474$$ [Expression (2)]

According to the invention, since the impurity introducing process and the first annealing process for forming the first semiconductor layer are performed before the proton irradiation process for forming the second semiconductor layer, the first annealing process can be performed at a higher annealing temperature than the second annealing process. Therefore, it is possible to perform the first annealing process at the annealing temperature suitable to activate the impurities which are introduced with a sufficiently high dose to form the ohmic contact with the output electrode. It is possible to form the first semiconductor layer with a high activation rate such that the ohmic contact with the output electrode is formed. As a result, it is possible to prevent insufficient annealing for forming the contact and to prevent a reduction in an on-voltage Von.

In addition, according to the invention, since the proton irradiation process and the second annealing process for forming the second semiconductor layer are performed after the impurity introduce and the first annealing process for forming the first semiconductor layer, it is possible to perform the second annealing process at a sufficiently low annealing temperature to prevent a reduction in the lattice defects formed by the proton irradiation process. Since the protons are not activated at a high annealing temperature (first annealing) for forming the first semiconductor layer, it is possible to prevent a reduction in the lattice defects formed by the proton irradiation process and a reduction in carrier concentration. Therefore, it is possible to perform the first and second annealing processes at the annealing temperature which is most suitable for both the first and second semiconductor layers.

According to the method for manufacturing the semiconductor device of the invention, it is possible to provide a semiconductor device which can prevent deterioration of electrical characteristics.

BRIEF DESCRIPTION OF DRAWING

FIG. 44 is a diagram illustrating the position conditions of a field stop layer which a depletion layer reaches first in the semiconductor device according to the invention;

DETAILED DESCRIPTION OF THE INVENTION

Figure 1:
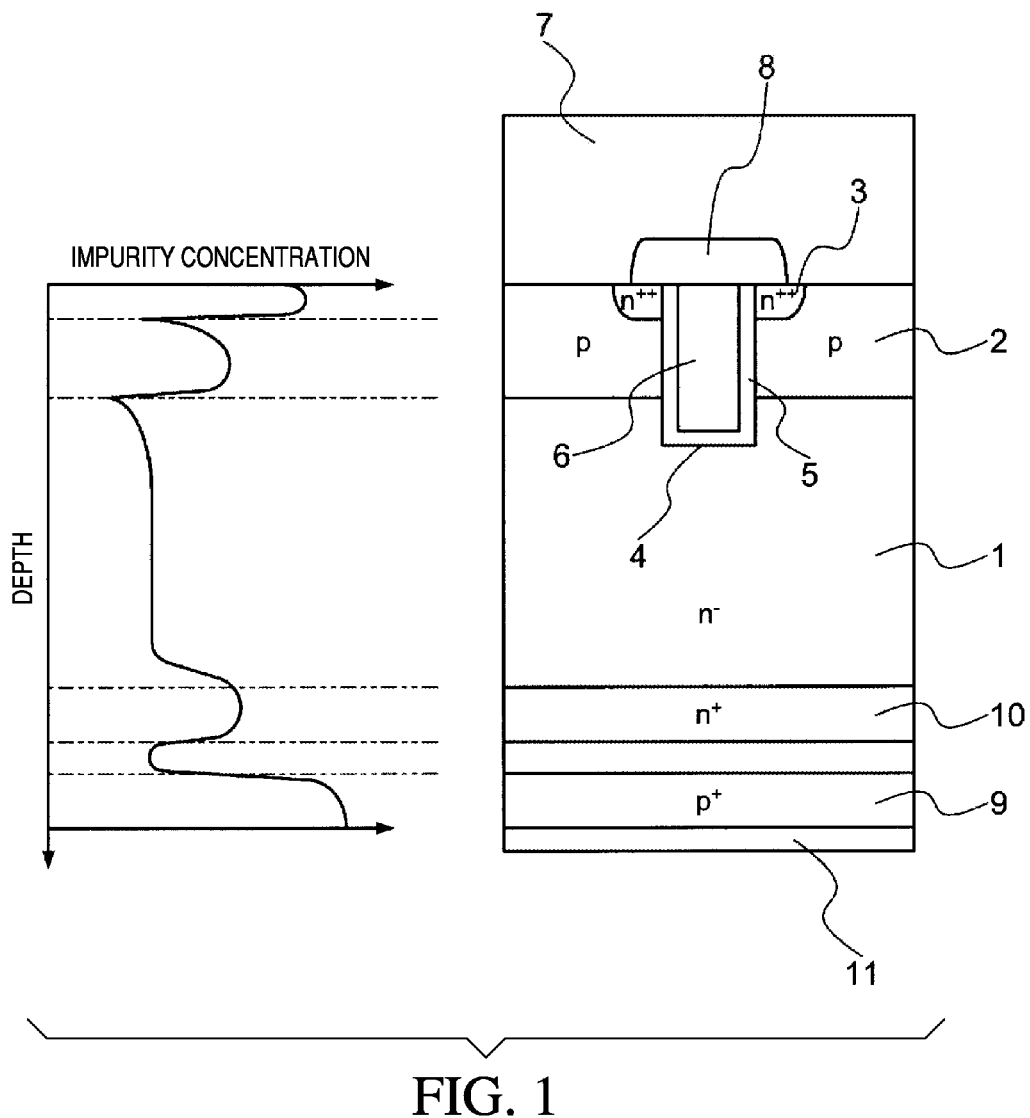
FIG. 1 is a cross-sectional view illustrating an example of a semiconductor device manufactured by a semiconductor device manufacturing method according to Embodiment 1.

Hereinafter, preferred embodiments of a method for manufacturing a semiconductor device according to the invention will be described in detail with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated.

(Embodiment 1)

First, the structure of a trench gate IGBT, which is an example of a semiconductor device produced (manufactured) by a semiconductor device manufacturing method according to Embodiment 1, will be described. FIG. 1 is a cross-sectional view illustrating an example of the semiconductor device manufactured by the semiconductor device manufacturing method according to Embodiment 1. An impurity concentration distribution in a depth direction of a semiconductor substrate from the boundary between an emitter electrode (first main electrode) 7 and an $n^{++}$ emitter region 3 is illustrated on the left side of FIG. 1. In the semiconductor device manufactured by the semiconductor device manufacturing method according to Embodiment 1 illustrated in FIG. 1, a p base region 2 is provided in a surface layer of a front surface of the semiconductor substrate which will be an $n^-$ drift layer 1.

The $n^{++}$ emitter region 3 is selectively provided in the p base region 2 so as to be exposed from the front surface of the semiconductor substrate. The impurity concentration of the $n^{++}$ emitter region 3 is higher than the impurity concentration of the $n^-$ drift layer 1. A trench 4 is provided so as to reach the $n^-$ drift layer 1 through the $n^{++}$ emitter region 3 and the p base region 2. A gate insulating film 5 is provided along the side wall and bottom of the trench 4. In the trench 4, a gate electrode 6 is provided inside the gate insulating film 5 so as to be buried in the trench 4.

The emitter electrode 7 comes into contact with the p base region 2 and the $n^{++}$ emitter region 3. In addition, the emitter electrode 7 is electrically insulated from the gate electrode 6 by an interlayer insulating film 8. A p+ collector layer 9 (first semiconductor layer) is provided in a surface layer of a rear surface of the semiconductor substrate which will be the n− drift layer 1 and an n+ field stop layer 10 (second semiconductor layer) is provided in a region which is deeper than the p+ collector layer 9 from the rear surface. A collector electrode (output electrode) 11 comes into contact with the p+ collector layer 9. The impurity concentration of the p+ collector layer 9 is high enough to obtain an ohmic contact with the collector electrode 11.

The n+ field stop (FS) layer 10 extends in a direction perpendicular to the depth direction of the semiconductor substrate so as to be substantially parallel to the p+ collector layer 9. The n+ field stop (FS) layer 10 is formed with a uniform thickness. The n+ field stop layer 10 may be separated from the p+ collector layer 9 or it may come into contact with the p+ collector layer 9. The impurity concentration of the n+ field stop layer 10 is higher than the impurity concentration of the n− drift layer 1. The n+ field stop layer 10 is a semiconductor layer to which a hydrogen induced donor is introduced by proton irradiation. Since the hydrogen induced donor forming the semiconductor layer is a composite defect, it has a function which accelerates the recombination of carriers.

Figure 2:
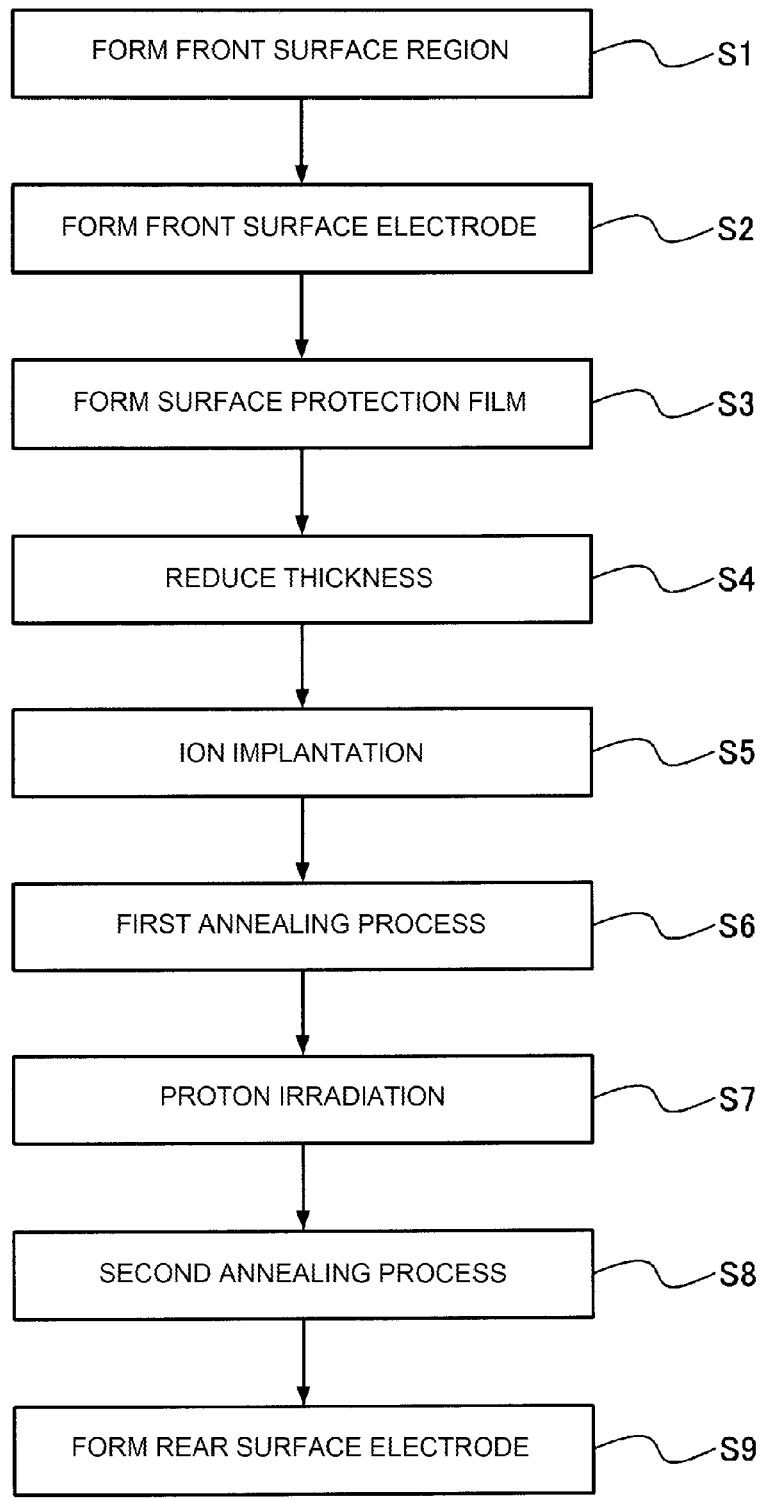
FIG. 2 is a flowchart illustrating the outline of the semiconductor device manufacturing method according to Embodiment 1.

Next, the outline of the semiconductor device manufacturing method according to Embodiment 1 will be described. FIG. 2 is a flowchart illustrating the outline of the semiconductor device manufacturing method according to Embodiment 1. As illustrated in FIG. 2, first, each of the above-mentioned semiconductor regions (for example, the p base region 2 and the n++ emitter region 3), a MOS gate structure, and the interlayer insulating film 8 are formed on the front surface side of the semiconductor substrate (Step S1). Then, a front surface electrode is formed on the front surface of the semiconductor substrate (Step S2). Then, a surface protection film is formed on the front surface of the semiconductor substrate (Step S3). Then, the rear surface of the semiconductor substrate is removed by, for example, grinding or etching so that the thickness of the semiconductor substrate is uniformly reduced (the semiconductor substrate is uniformly thinned) (Step S4).

Then, impurity ions for forming the semiconductor layer which contacts a rear surface electrode are implanted into the rear surface of the thinned semiconductor substrate (Step S5). The ion implantation of Step S5 is performed with a sufficiently high dose to obtain an ohmic contact with the rear surface electrode which will be formed in the subsequent step. Then, a first annealing process is performed to activate the impurity ions implanted in Step S5 (Step S6). In this way, the semiconductor layer (for example, the collector layer) which comes into contact with the rear surface electrode is formed in the surface layer of the rear surface of the semiconductor substrate in Step S6.

Then, proton irradiation for forming the field stop layer is performed for the rear surface of the semiconductor substrate (Step S7). The proton irradiation is performed in Step S7 with sufficient irradiation energy to enable a proton to be radiated to a position deeper than the semiconductor layer which comes into contact with the rear surface electrode. Then, the proton which is radiated in Step S7 is activated (changed into a donor) by a second annealing process (Step S8). In this way, the field stop layer is formed in a deep region of the semiconductor substrate which is disposed on the rear surface. It is preferable that the temperature of the second annealing process in Step S8 be set to such an extent that the lattice defects formed by the proton irradiation are not reduced. Then, the rear surface electrode is formed on the rear surface of the semiconductor substrate by a physical vapor deposition method such as a sputtering method (Step S9). In this way, the semiconductor device according to Embodiment 1 is completed.

In the semiconductor device manufacturing method, a series of Step S7 and Step S8 may be performed a plurality of times while changing the irradiation energy and the annealing temperature to form a plurality of stripe-shaped field stop layers which extend in the direction perpendicular to the depth direction of the semiconductor substrate. When the plurality of field stop layers are formed, the second annealing process for forming each field stop layer is performed at an annealing temperature that is most suitable to activate the proton radiated in the previous proton irradiation process. In addition, the second annealing processes for forming the plurality of field stop layers are performed in descending order of the annealing temperature. Adjacent field stop layers may come into contact with each other or they may be separated from each other.

Figure 3:
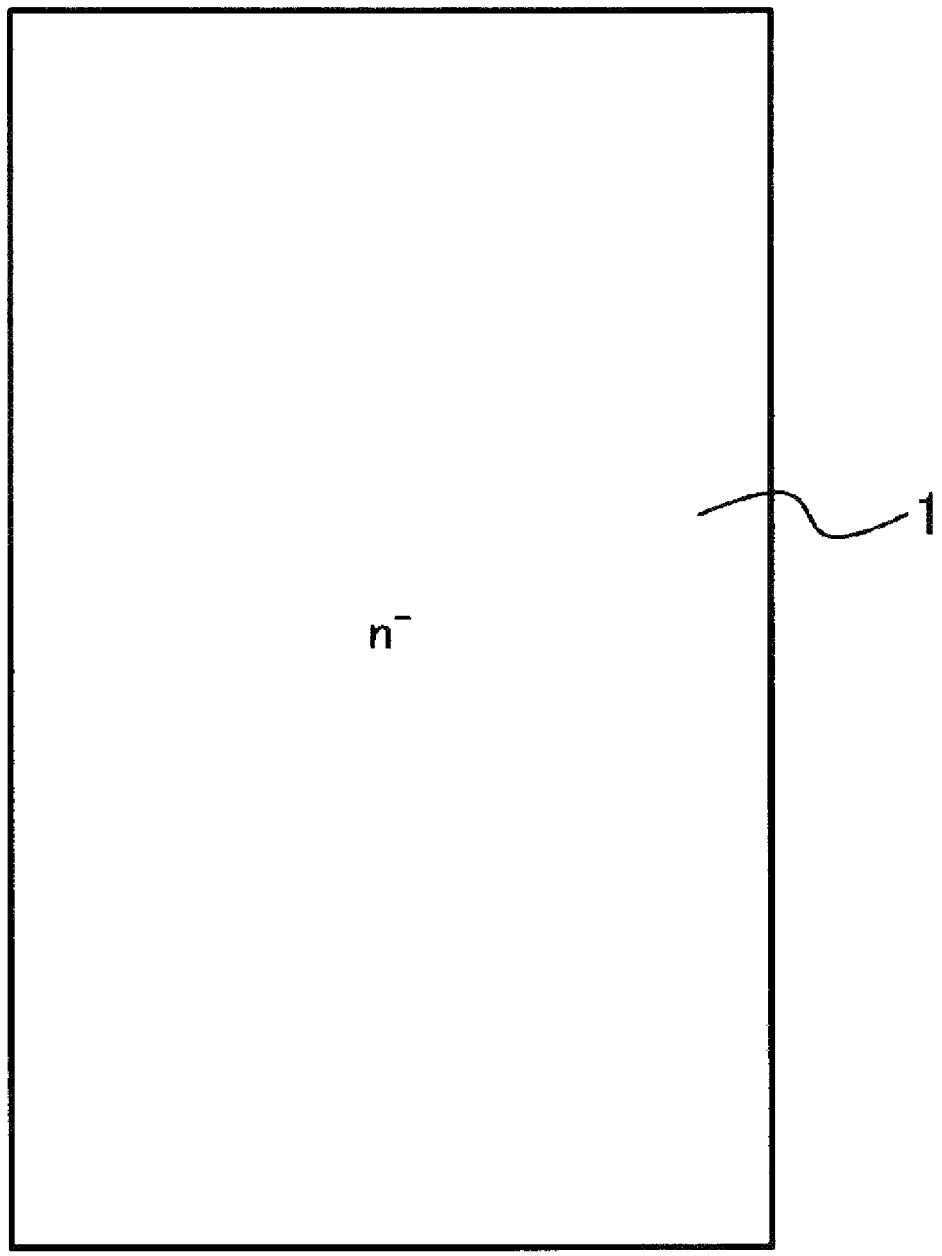
FIG. 3 is a cross-sectional view illustrating the semiconductor device according to Embodiment 1 which is being manufactured.
Figure 4:
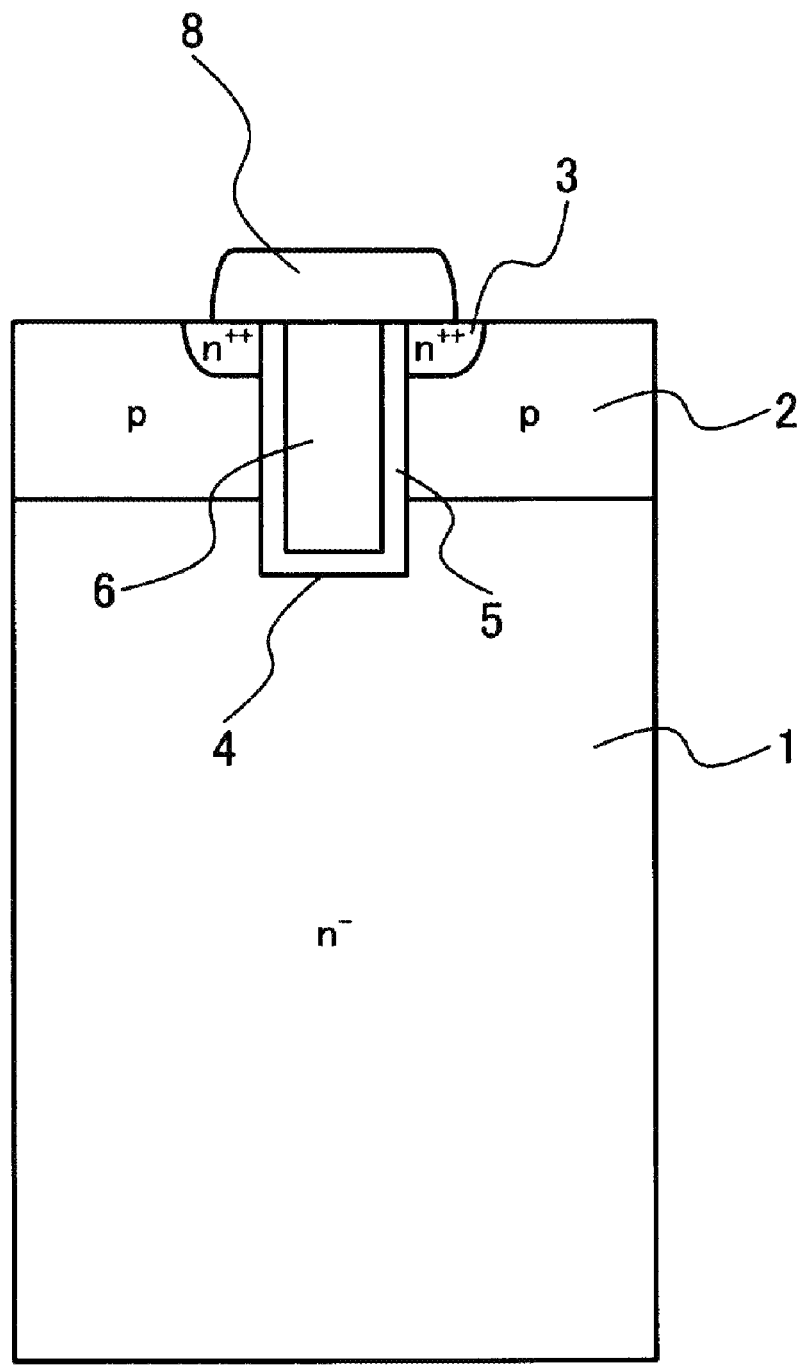
FIG. 4 is a cross-sectional view illustrating the semiconductor device according to Embodiment 1 which is being manufactured.

Next, a method for manufacturing the trench gate IGBT illustrated in FIG. 1 will be described in detail as an example of the semiconductor device manufacturing method according to Embodiment 1. FIGS. 3 to 8 are cross-sectional views illustrating the semiconductor device according to Embodiment 1 which is being manufactured. First, as illustrated in FIG. 3, the semiconductor substrate which will be the n− drift layer 1 is prepared. Then, as illustrated in FIG. 4, a trench-gate-type MOS gate structure including the p base region 2, the n++ emitter region 3, the trench 4, the gate insulating film 5, and the gate electrode 6 is formed on the front surface of the semiconductor substrate by a general method.

Figure 5:
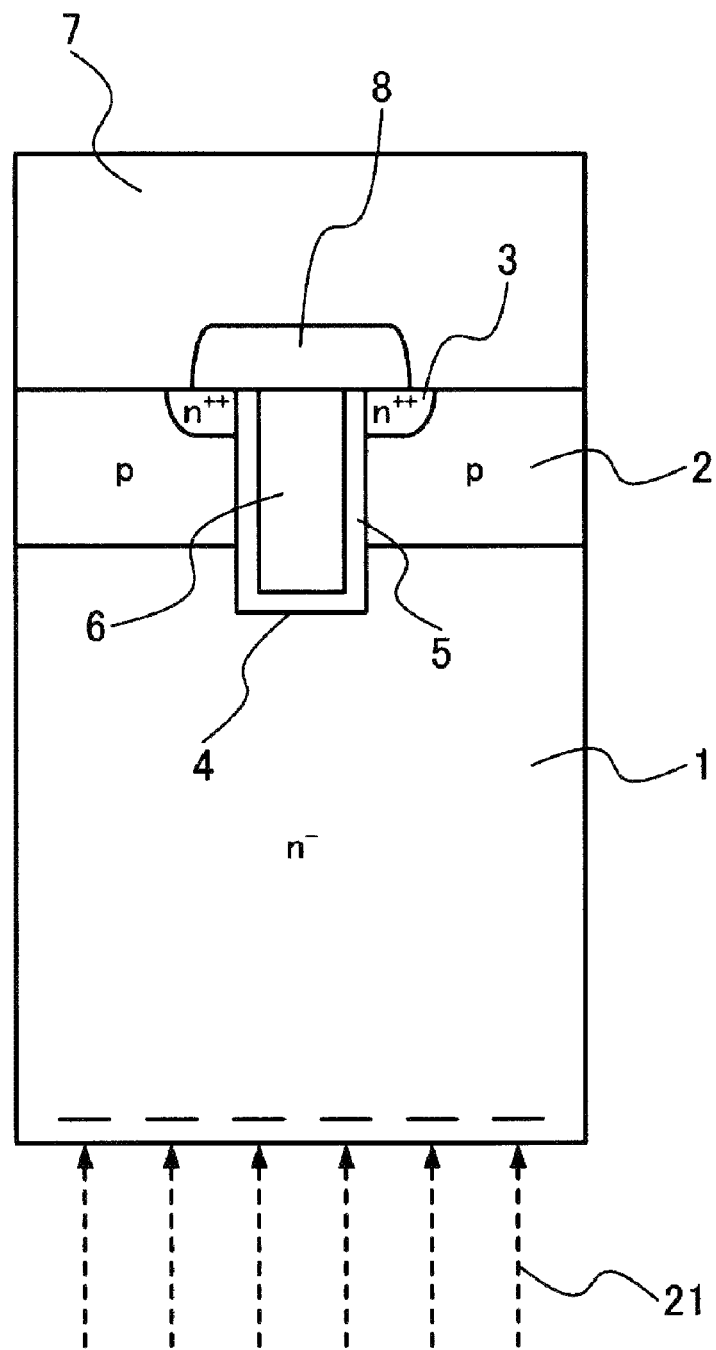
FIG. 5 is a cross-sectional view illustrating the semiconductor device according to Embodiment 1 which is being manufactured.

Then, as illustrated in FIG. 5, an aluminum silicon (AlSi) film which will be the emitter electrode 7 is deposited on the front surface of the semiconductor substrate by sputtering. Then, the aluminum silicon film is patterned to form a wiring pattern and annealing is performed. In this way, the emitter electrode 7 is formed on the front surface of the semiconductor substrate. Then, for example, a polyimide film which will be a surface protection film (not illustrated) is formed on the front surface of the semiconductor substrate so as to cover the emitter electrode 7. Then, the polyimide film is patterned such that a portion of the emitter electrode 7 is exposed. Then, the polyimide film is cured (burned). Then, the rear surface of the semiconductor substrate is ground to reduce the thickness of the semiconductor substrate and the semiconductor substrate is cleaned to remove adhesive materials.

Figure 6:
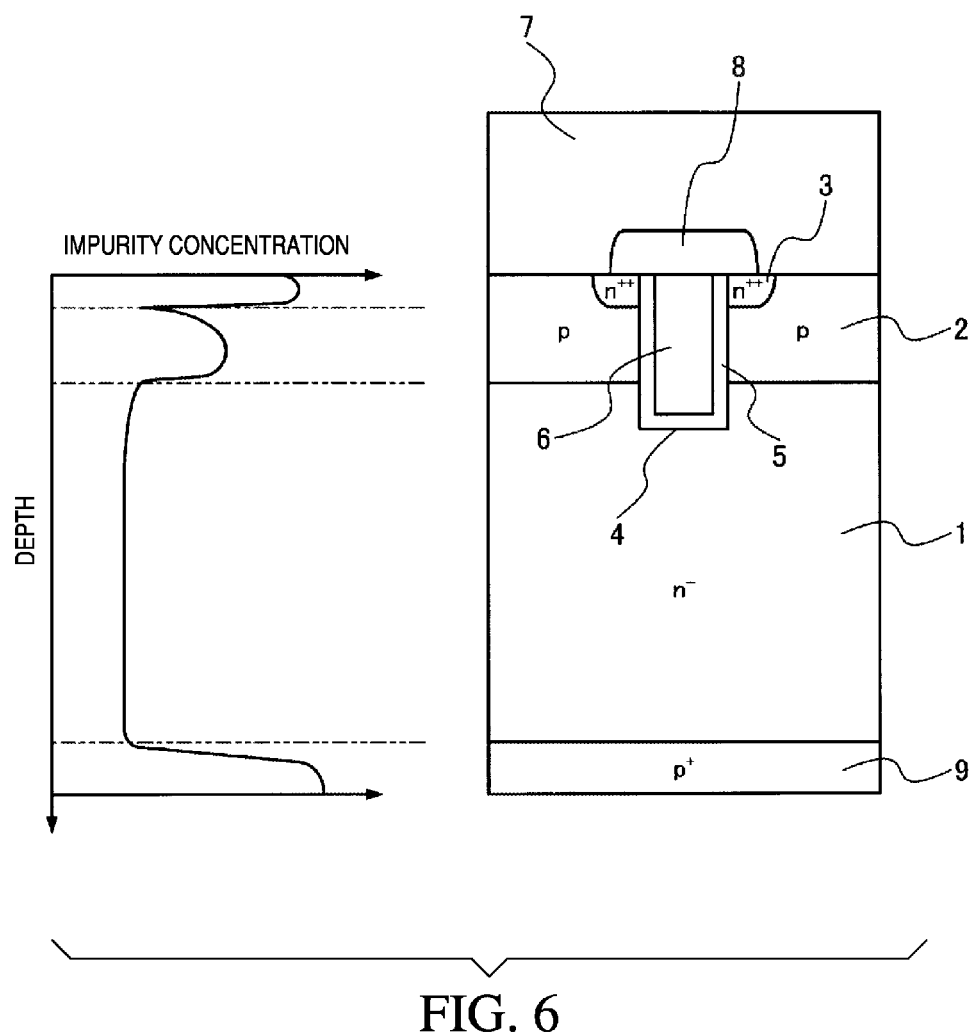
FIG. 6 is a cross-sectional view illustrating the semiconductor device according to Embodiment 1 which is being manufactured.

Then, p-type impurity ions 21, such as boron ions (B+), are implanted into the ground rear surface of the semiconductor substrate. The ion implantation is performed with a sufficiently high dose to obtain an ohmic contact with the collector electrode 11 which will be formed in the subsequent step. For example, the dose of boron ions, which are the p-type impurity ions 21, is equal to or greater than $1 \times 10^{13}/cm^2$ and equal to or less than $1 \times 10^{16}/cm^2$. In Example 1 which will be described below, the dose was $3 \times 10^{13}/cm^2$. Then, as illustrated in FIG. 6, for example, furnace annealing is performed as the first annealing process to activate the p-type impurity ions 21 implanted into the rear surface of the semiconductor substrate, thereby forming the p+ collector layer 9 in the surface layer of the rear surface of the semiconductor substrate. In Example 1 which will be described below, the temperature of the first annealing process was, for example, 450° C.

Figure 7:
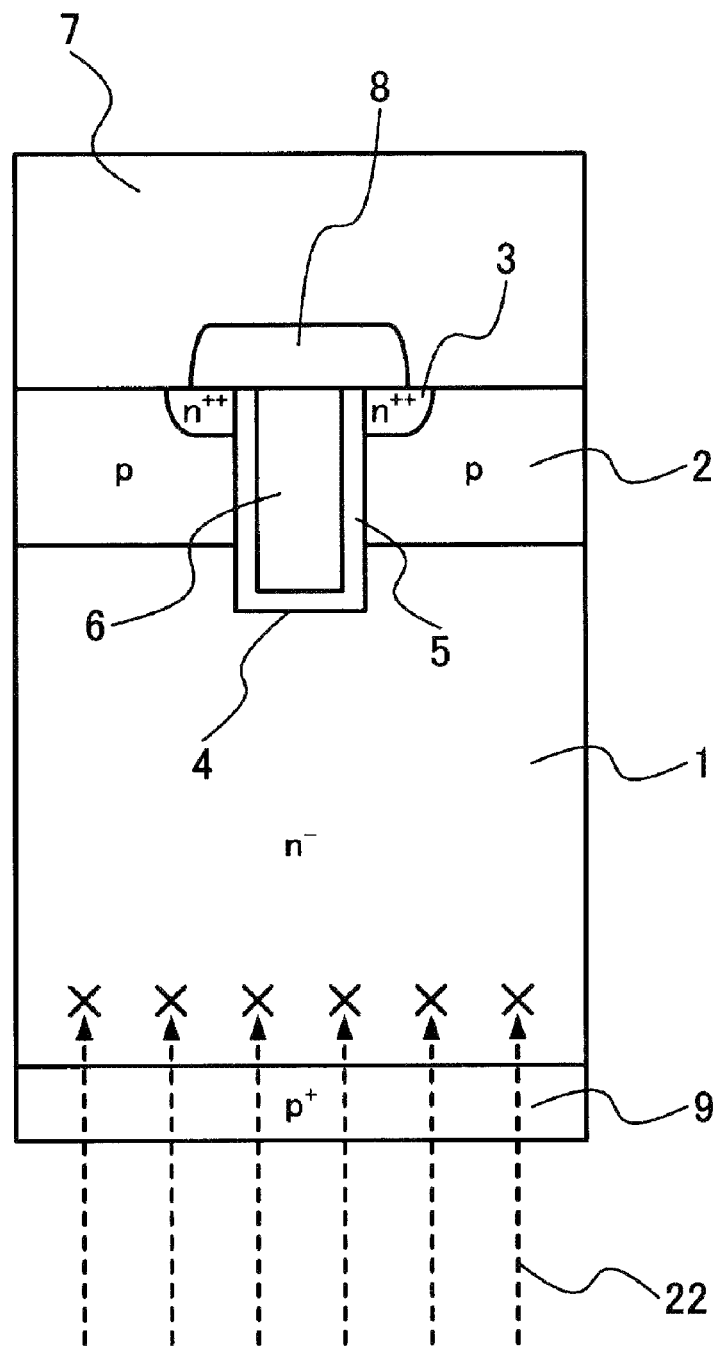
FIG. 7 is a cross-sectional view illustrating the semiconductor device according to Embodiment 1 which is being manufactured.

Then, as illustrated in FIG. 7, a proton 22 is radiated to a region that is deeper than the p+ collector layer 9 from the rear surface of the semiconductor substrate. In the proton irradiation, a typical average range Rp is equal to or greater than 5 μm and equal to or less than 300 μm. The irradiation energy of the proton 22 is equal to or greater than about 0.4 MeV and equal to less than about 6.0 MeV so as to correspond to the average range Rp. In Example 1 which will be described below, the irradiation energy of the proton 22 was 0.83 MeV when the average range Rp was, for example, 12 μm. In addition, the dose of the proton 22 is typically equal to or greater than $1 \times 10^{12}/cm^2$ and equal to or less than $1 \times 10^{16}/cm^2$. In Example 1 which will be described below, the dose was $1 \times 10^{13}/cm^2$.

Figure 8:
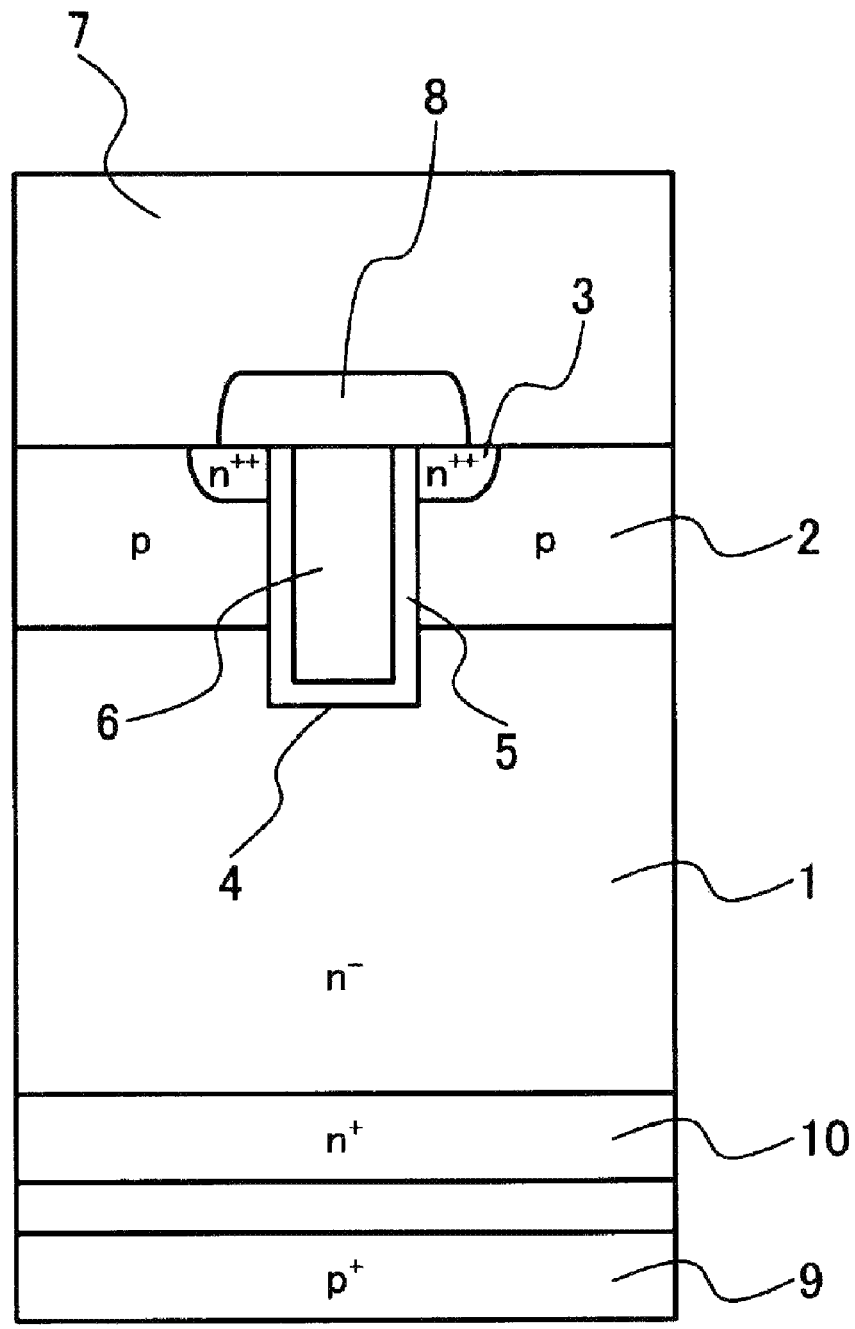
FIG. 8 is a cross-sectional view illustrating the semiconductor device according to Embodiment 1 which is being manufactured.

As illustrated in FIG. 8, for example, furnace annealing is performed as the second annealing process to activate the proton 22 radiated to the rear surface of the semiconductor substrate, thereby forming the n+ field stop layer 10 in a region that is deeper than the p+ collector layer 9 from the rear surface of the semiconductor substrate. In Example 1 which will be described below, the temperature of the second annealing process was, for example, 350° C.

It is preferable that the first annealing process be performed at a sufficiently high temperature not to have an adverse effect on the electrical characteristics of the emitter electrode 7. Specifically, when the emitter electrode 7 is made of, for example, a metal material having aluminum (Al) as a main component, it is preferable that the first annealing process be performed in a temperature range of 420° C. to about the melting point of aluminum. The melting point of aluminum is about 660° C., for example, in the case of an alloy in which 1% by weight of silicon is included in aluminum. It is preferable that the temperature of the second annealing process be set to such an extent that the lattice defects formed by the proton irradiation are not reduced. Specifically, for example, the second annealing process may be performed at a temperature of about 300° C. to 500° C. under the conditions that the temperature is not higher than the temperature of the first annealing process. When the temperature of the first annealing process is in the range of 420° C. to 500° C., the temperature of the second annealing is lower than the temperature of the first annealing process. In both the first and second annealing process, the processing time may be in the range of 0.5 hours to 10 hours. The temperature of the second annealing process is preferably in the range of 380° C. to 450° C. and more preferably in the range of 400° C. or 420° C., which is lower than the temperature of the first annealing.

When the second annealing process and a metal annealing process, which will be described below, are performed at the same annealing temperature, they may be performed at the same time. When a series of the proton irradiation process and the second annealing process is repeatedly performed to form a plurality of stripe-shaped field stop layers which extend in the direction perpendicular to the depth direction of the semiconductor substrate, the second annealing processes are performed in descending order of the annealing temperature. In this case, when the second annealing process which is performed in a first stage among the plurality of second annealing processes and the first annealing process are performed at the same annealing temperature, the second annealing process which is performed in the first stage and the first annealing process may be performed at the same time. When the second annealing process which is performed in the last stage among the plurality of second annealing processes and the metal annealing process, which will be described below, are performed at the same annealing temperature, the second annealing process and the metal annealing process may be performed at the same time.

Then, for example, a hydrogen fluoride (HF) treatment for reducing contact resistance with a silicon (Si) semiconductor layer and an aluminum film is performed as preprocessing for forming the collector electrode 11 in which a metal film having aluminum as a main component is laminated as a first layer. Then, as illustrated in FIG. 1, aluminum, titanium (Ti), nickel (Ni), and gold (Au) are sequentially deposited on the rear surface of the semiconductor substrate by, for example, sputtering to form the collector electrode 11 in which the four metal films are laminated. Then, the metal annealing process for improving the surface formability of the collector electrode 11 is performed. In this way, the trench gate IGBT illustrated is completed.

As described above, according to Embodiment 1, since the boron implantation process and the first annealing process for forming the p+ collector layer are performed before the proton irradiation process for forming the n+ field stop layer, the first annealing process can be performed at a higher annealing temperature than the second annealing process. Therefore, the first annealing process can be performed at the annealing temperature which is suitable to activate the p-type impurities that are implanted at a sufficiently high dose (for example, about $1 \times 10^{16}/cm^3$) to form an ohmic contact with the collector electrode. As a result, it is possible to form the p+ collector layer which is activated at a sufficiently high activation rate to obtain an ohmic contact with the collector electrode. Therefore, it is possible to prevent the surface concentration of the p+ collector layer required to form the ohmic contact from being insufficient due to annealing at a temperature lower than the annealing temperature after proton irradiation, unlike the related art. It is possible to prevent deterioration of electrical characteristics such as a reduction in on-voltage (Von).

According to Embodiment 1, since the proton irradiation process and the second annealing process for forming the n+ field stop layer are performed after the boron implantation process and the first annealing process for forming the p+ collector layer, the second annealing process can be performed at a sufficiently low annealing temperature not to reduce the lattice defects formed by the proton irradiation process. In addition, since the proton is not activated at a high annealing temperature (first annealing process) for forming the p+ collector layer, it is possible to prevent the lattice defects formed by the proton irradiation process from being reduced and the concentration of the hydrogen induced donors from being reduced. Therefore, it is possible to perform the first and second annealing processes at the annealing temperature which is most suitable for both the p+ collector layer and the n+ field stop layer. As a result, it is possible form the p+ collector layer so as to come into ohmic contact with the collector electrode and to form the n+ field stop layer with a desired hydrogen induced donor concentration.

(Embodiment 2)

A semiconductor device manufacturing method according to Embodiment 2 differs from the semiconductor device manufacturing method according to Embodiment 1 in that the emitter electrode 7 is formed after the second annealing process for forming the n+ field stop layer 10. A semiconductor device manufactured by the semiconductor device manufacturing method according to Embodiment 2 is the same as the trench gate IGBT according to Embodiment 1 illustrated in FIG. 1.

Figure 9:
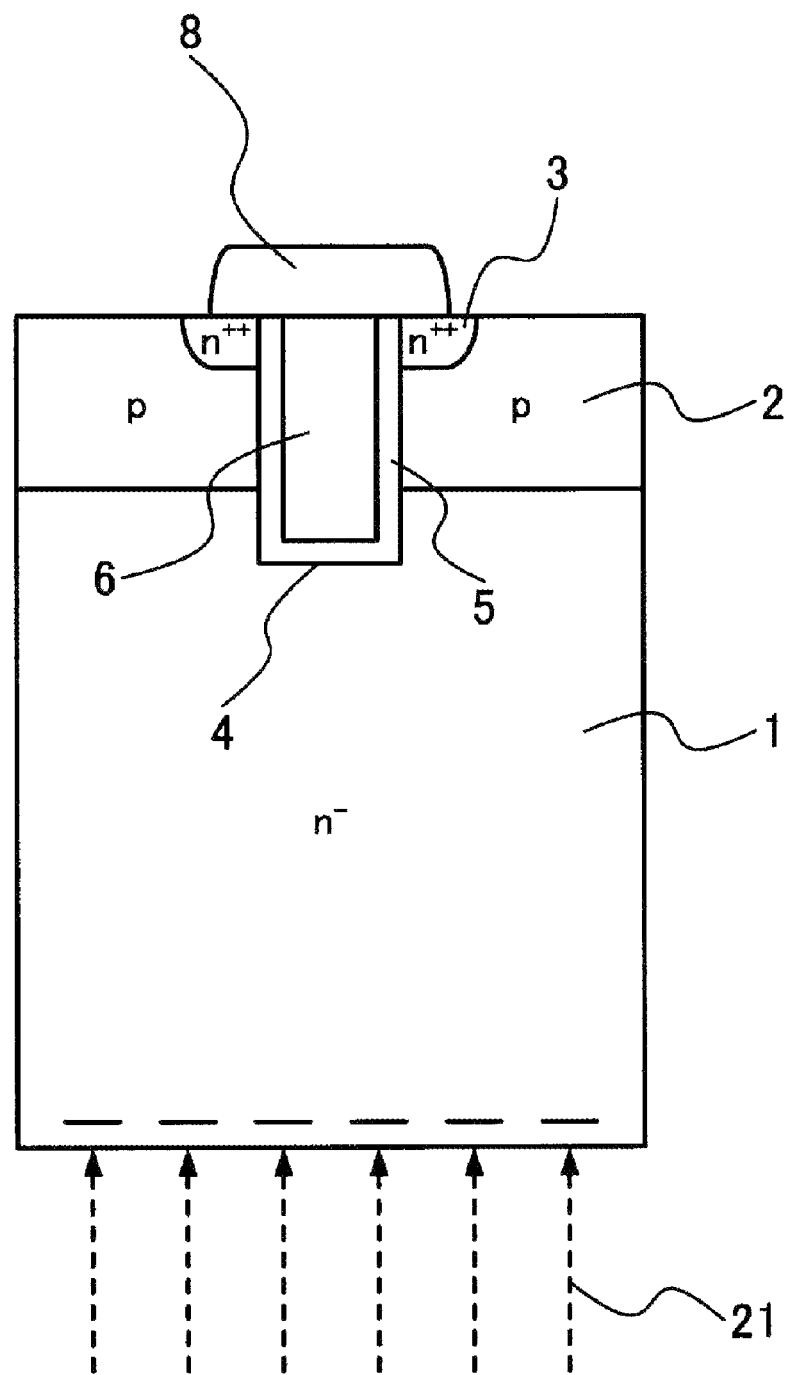
FIG. 9 is a cross-sectional view illustrating the semiconductor device according to Embodiment 1 which is being manufactured.

The semiconductor device manufacturing method according to Embodiment 2 will be described with reference to FIGS. 1, 3, and 4 and FIGS. 9 to 12. FIGS. 9 to 12 are cross-sectional views illustrating the semiconductor device according to Embodiment 2 which is being manufactured. First, as illustrated in FIGS. 3 and 4, similarly to Embodiment 1, a semiconductor substrate which will be an n⁻ drift layer 1 is prepared and a trench-gate-type MOS gate structure is formed on the front surface of the semiconductor substrate. Then, as illustrated in FIG. 9, similarly to Embodiment 1, the rear surface of the semiconductor substrate is ground and the semiconductor substrate is cleaned to remove adhesive materials.

Figure 10:
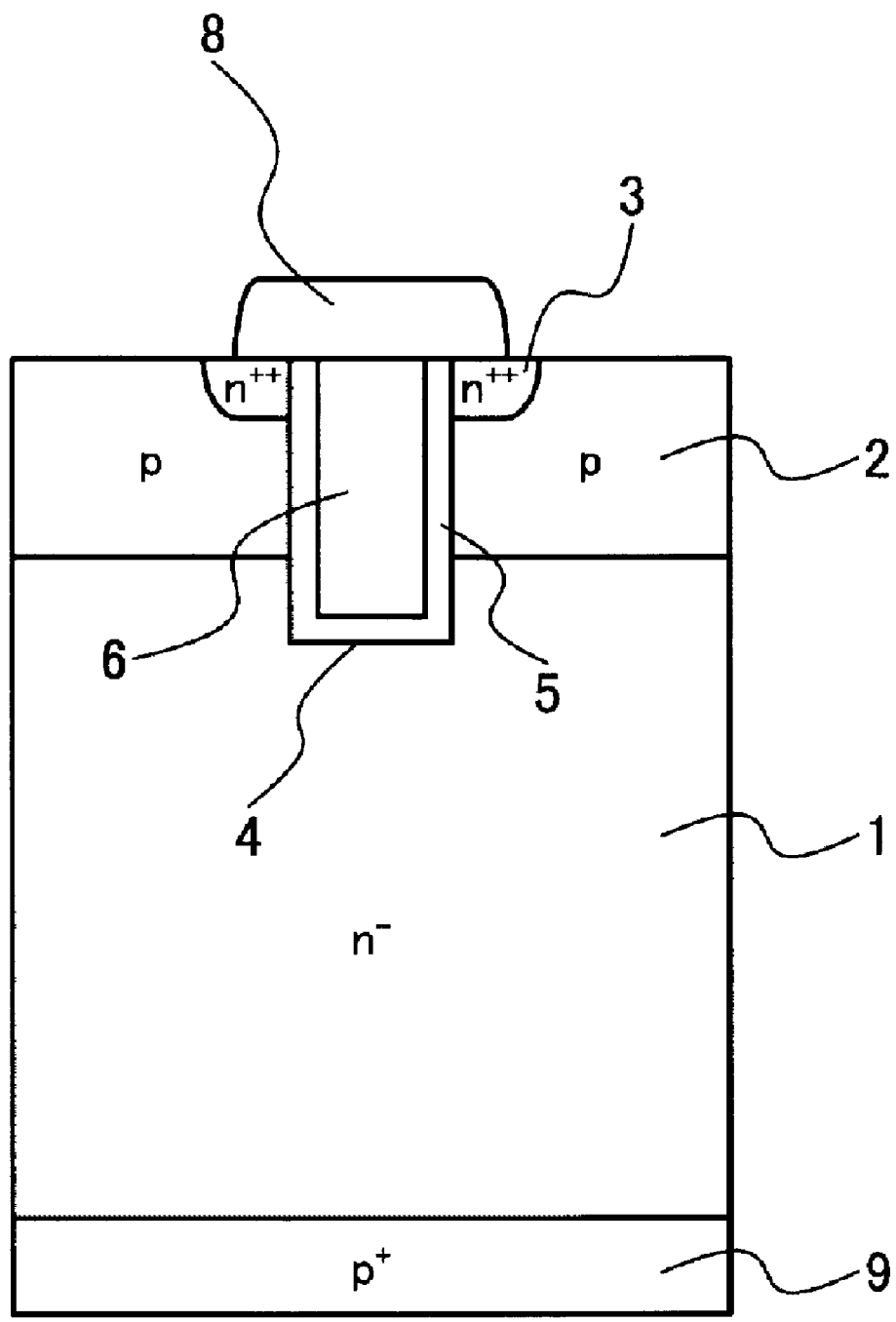
FIG. 10 is a cross-sectional view illustrating a semiconductor device according to Embodiment 2 which is being manufactured.
Figure 11:
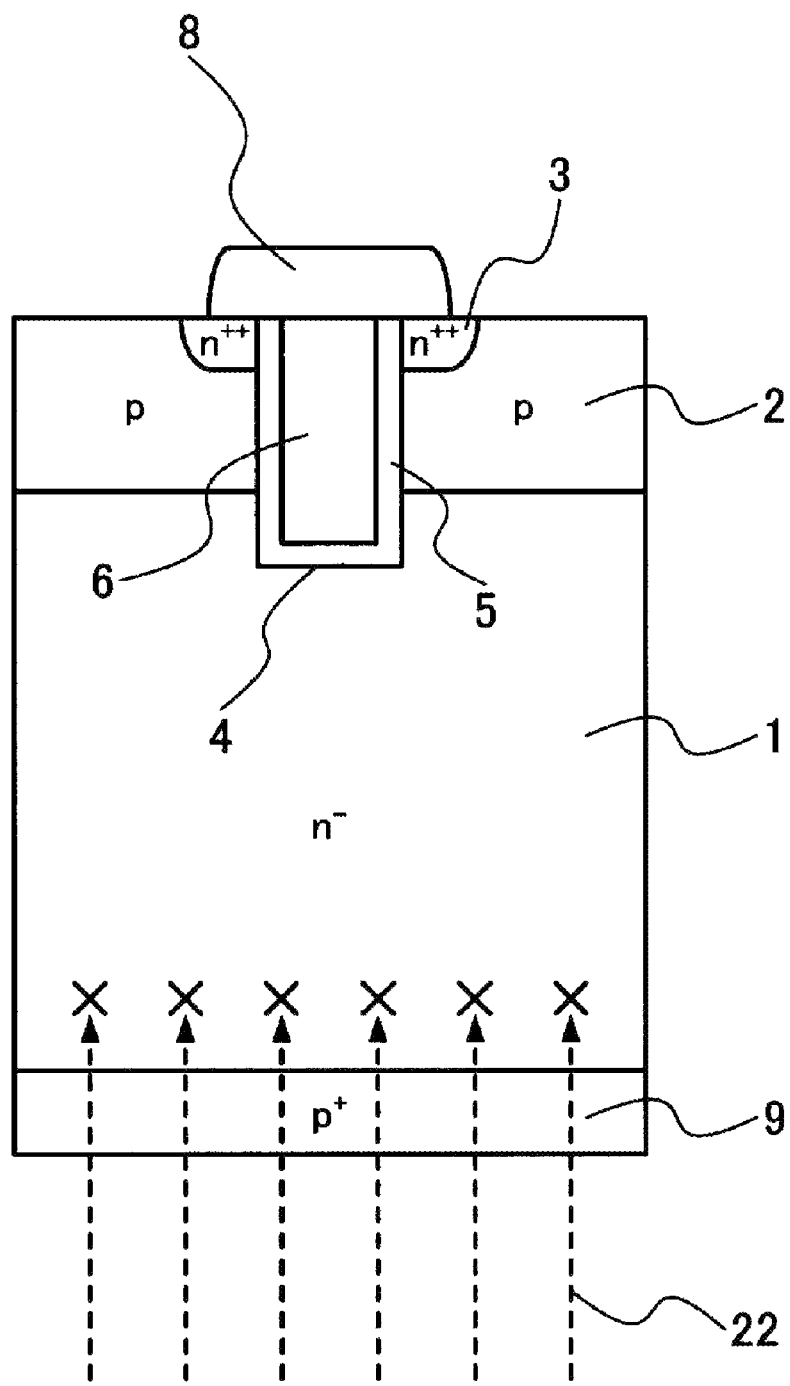
FIG. 11 is a cross-sectional view illustrating the semiconductor device according to Embodiment 2 which is being manufactured.
Figure 12:
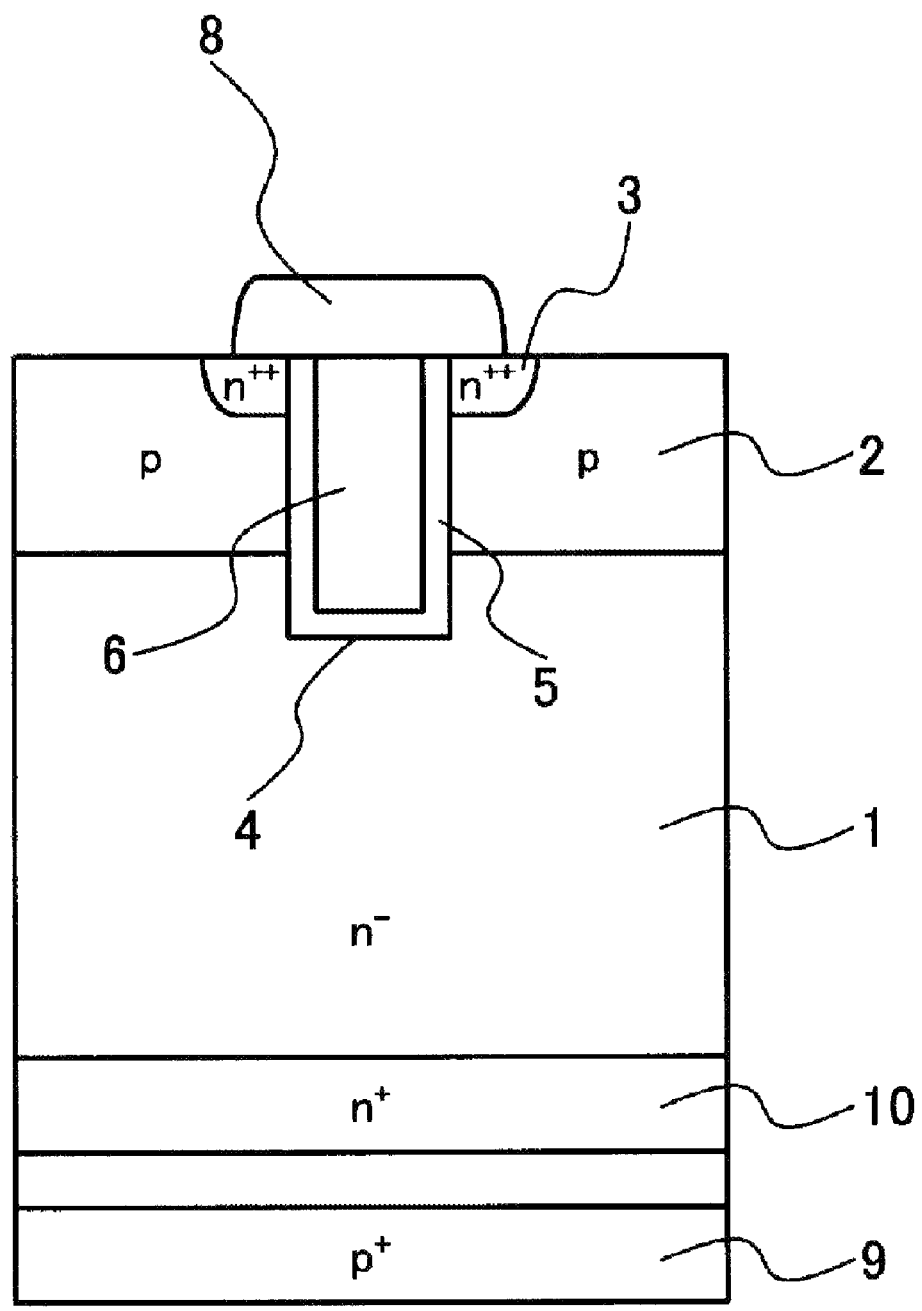
FIG. 12 is a cross-sectional view illustrating the semiconductor device according to Embodiment 2 which is being manufactured.

Then, as illustrated in FIGS. 9 and 10, similarly to Embodiment 1, p-type impurity ions 21 are implanted into the ground rear surface of the semiconductor substrate and a first annealing process is performed to form a p⁺ collector layer 9. Then, as illustrated in FIGS. 11 and 12, similarly to Embodiment 1, a proton 22 is radiated to a region that is deeper than the p⁺ collector layer 9 from the rear surface of the semiconductor substrate and a second annealing process is performed to form an n⁺ field stop layer 10. Then, similarly to Embodiment 1, an emitter electrode 7 and a collector electrode 11 are formed on the front and rear surfaces of the semiconductor substrate, respectively. In this way, the trench gate IGBT illustrated in FIG. 1 is completed.

As described above, according to Embodiment 2, it is possible to obtain the same effect as that in Embodiment 1. According to Embodiment 2, the first annealing process can be performed before the emitter electrode is formed on the front surface of the semiconductor substrate. Therefore, the first annealing process can be performed at a high annealing temperature of, for example, 900° C. or more. As a result, it is possible to further increase the impurity concentration of the p⁺ collector layer and to reduce the contact resistance between the p⁺ collector layer and the collector electrode.

(Embodiment 3)

Figure 13:
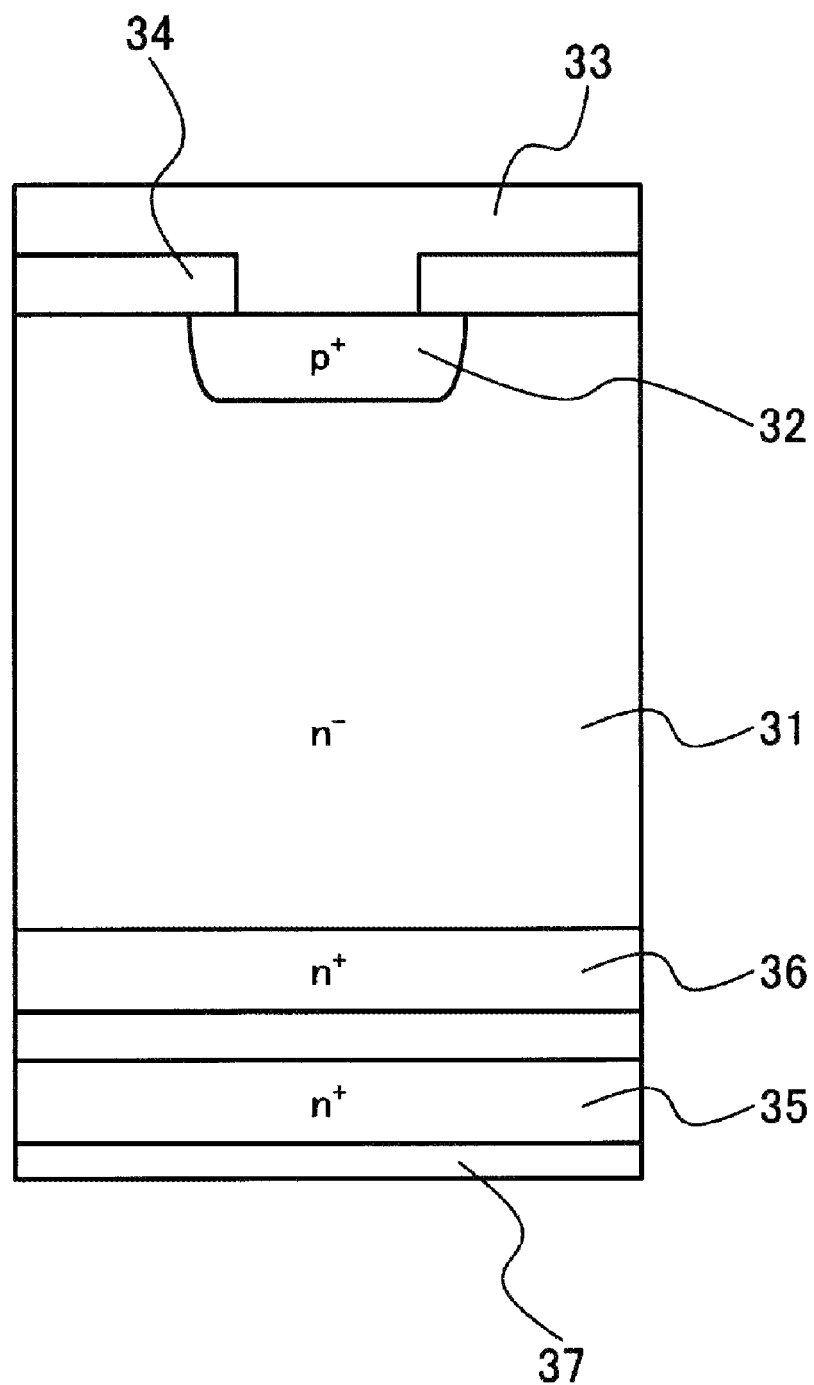
FIG. 13 is a cross-sectional view illustrating an example of a semiconductor device manufactured by a semiconductor device manufacturing method according to Embodiment 3.

FIG. 13 is a cross-sectional view illustrating an example of a semiconductor device manufactured by a semiconductor device manufacturing method according to Embodiment 3. The semiconductor device manufacturing method according to Embodiment 3 differs from the semiconductor device manufacturing method according to Embodiment 1 in that a diode is manufactured instead of the IGBT.

In a semiconductor device manufactured by the semiconductor device manufacturing method according to Embodiment 3 illustrated in FIG. 13, a p⁺ anode region 32 is selectively provided in a surface layer of a front surface of an n⁻ semiconductor substrate 31. Reference numeral 34 indicates an interlayer insulating film. An anode electrode (input electrode) 33 comes into contact with the p⁺ anode region 32. In addition, an n⁺ cathode layer (first semiconductor layer) 35 is provided in a surface layer of a rear surface of the n⁻ semiconductor substrate 31 and an n⁺ field stop layer 36 is provided in a region that is deeper than the n⁺ cathode layer 35 from the rear surface. The n⁺ field stop layer 36 has the same structure as the n⁺ field stop layer according to Embodiment 1. A cathode electrode (output electrode) 37 comes into contact with the n⁺ cathode layer 35. The impurity concentration of the n⁺ cathode layer 35 is high enough to obtain an ohmic contact with the cathode electrode 37.

Figure 14:
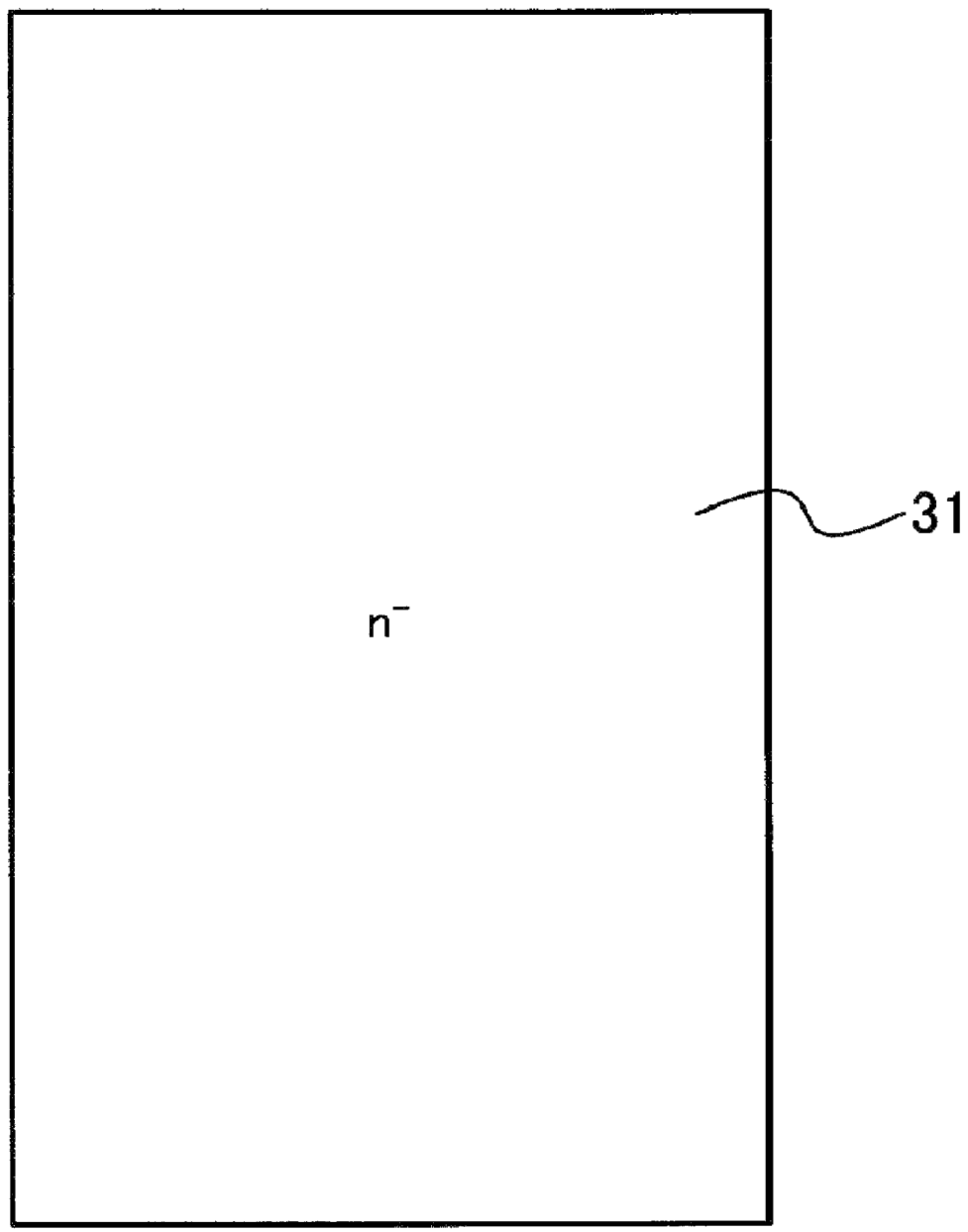
FIG. 14 is a cross-sectional view illustrating the semiconductor device according to Embodiment 3 which is being manufactured.
Figure 15:
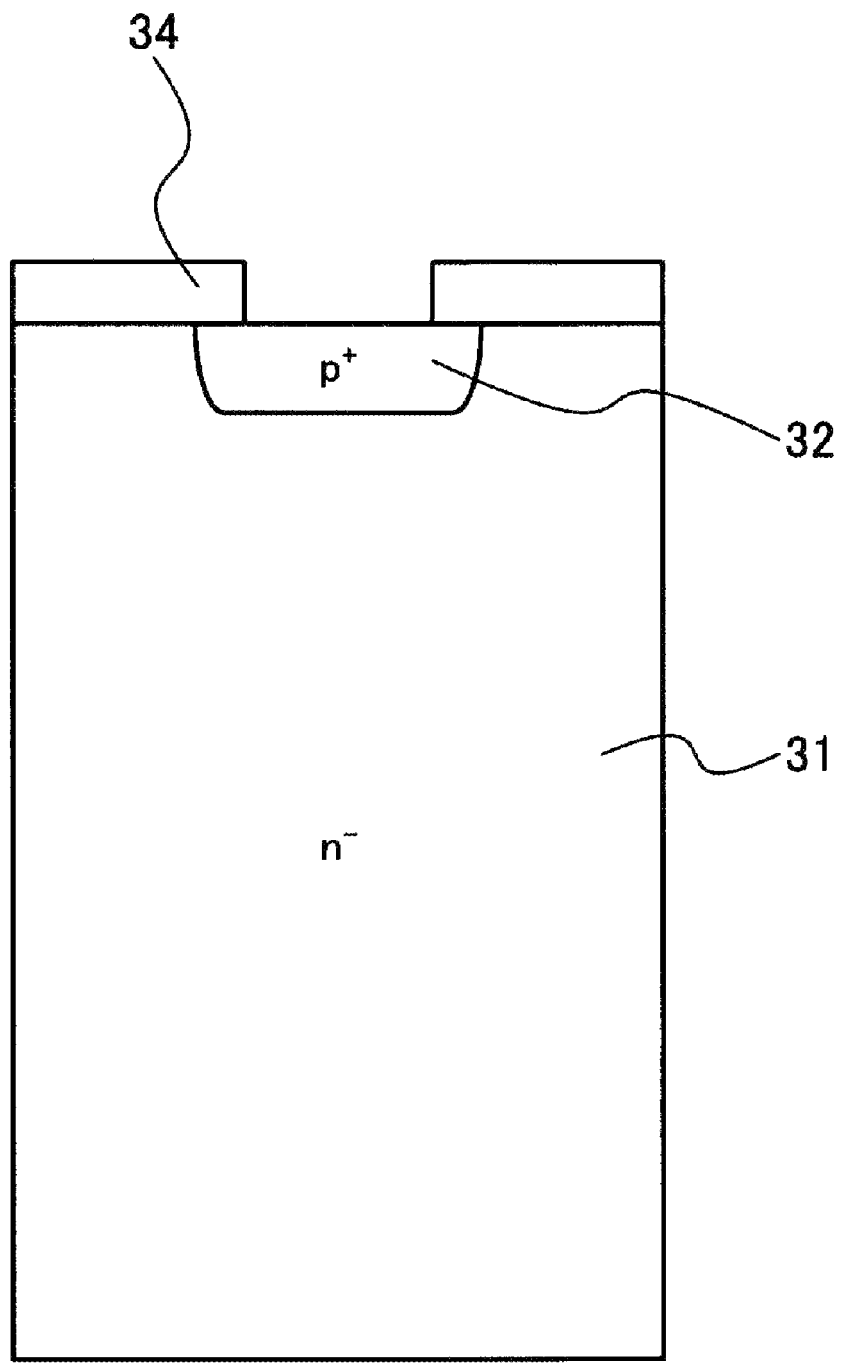
FIG. 15 is a cross-sectional view illustrating the semiconductor device according to Embodiment 3 which is being manufactured.
Figure 16:
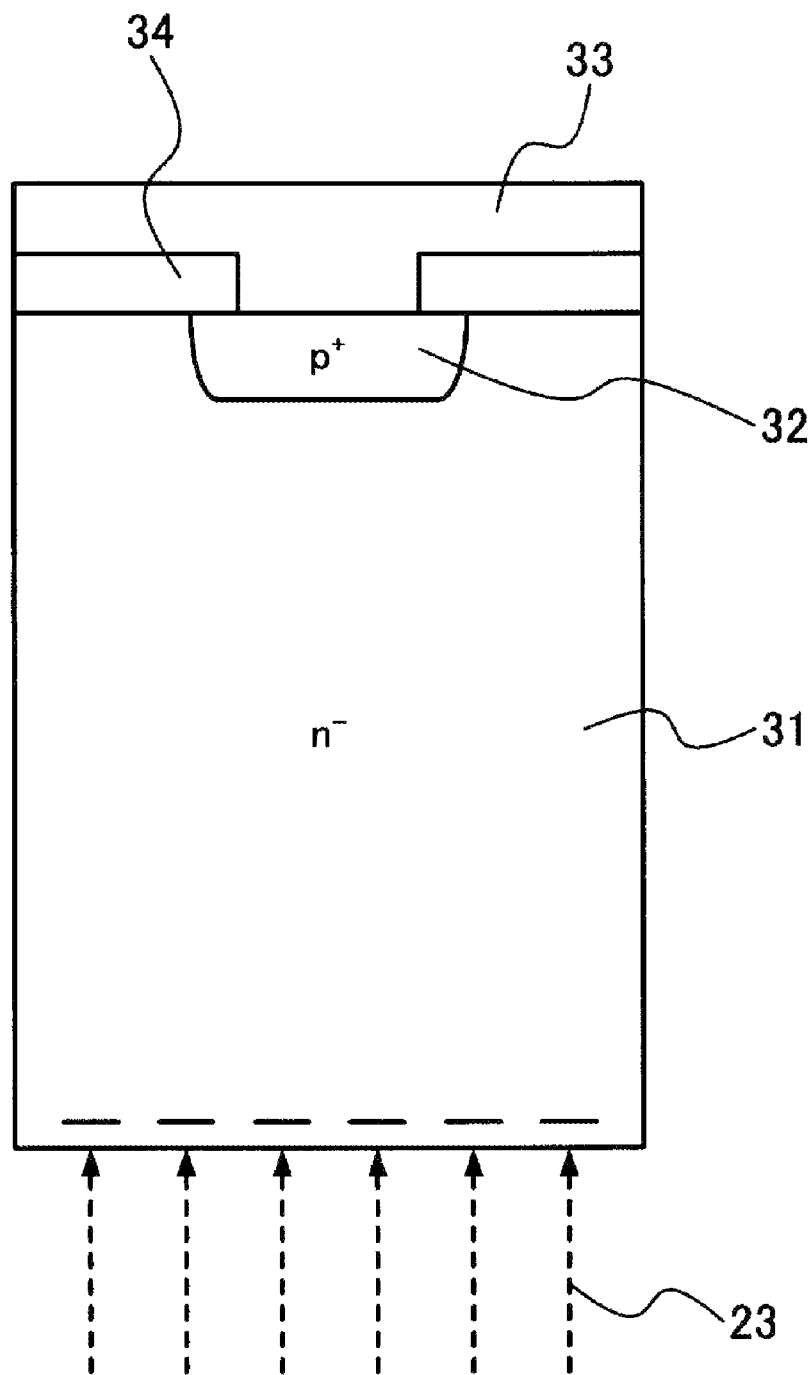
FIG. 16 is a cross-sectional view illustrating the semiconductor device according to Embodiment 3 which is being manufactured.

Next, the semiconductor device manufacturing method according to Embodiment 3 will be described. FIGS. 14 to 19 are cross-sectional views illustrating the semiconductor device according to Embodiment 3 which is being manufactured. As illustrated in FIG. 14, the n⁻ semiconductor substrate 31 is prepared. Then, as illustrated in FIG. 15, the p⁺ anode region 32 is formed in the front surface of the semiconductor substrate 31 by a general method. Then, as illustrated in FIG. 16, similarly to when the emitter electrode according to Embodiment 1 is formed, the anode electrode 33 is formed on the front surface of the semiconductor substrate 31 by sputtering. Then, similarly to Embodiment 1, the rear surface of the semiconductor substrate 31 is ground and the semiconductor substrate 31 is cleaned to remove adhesive materials.

Figure 17:
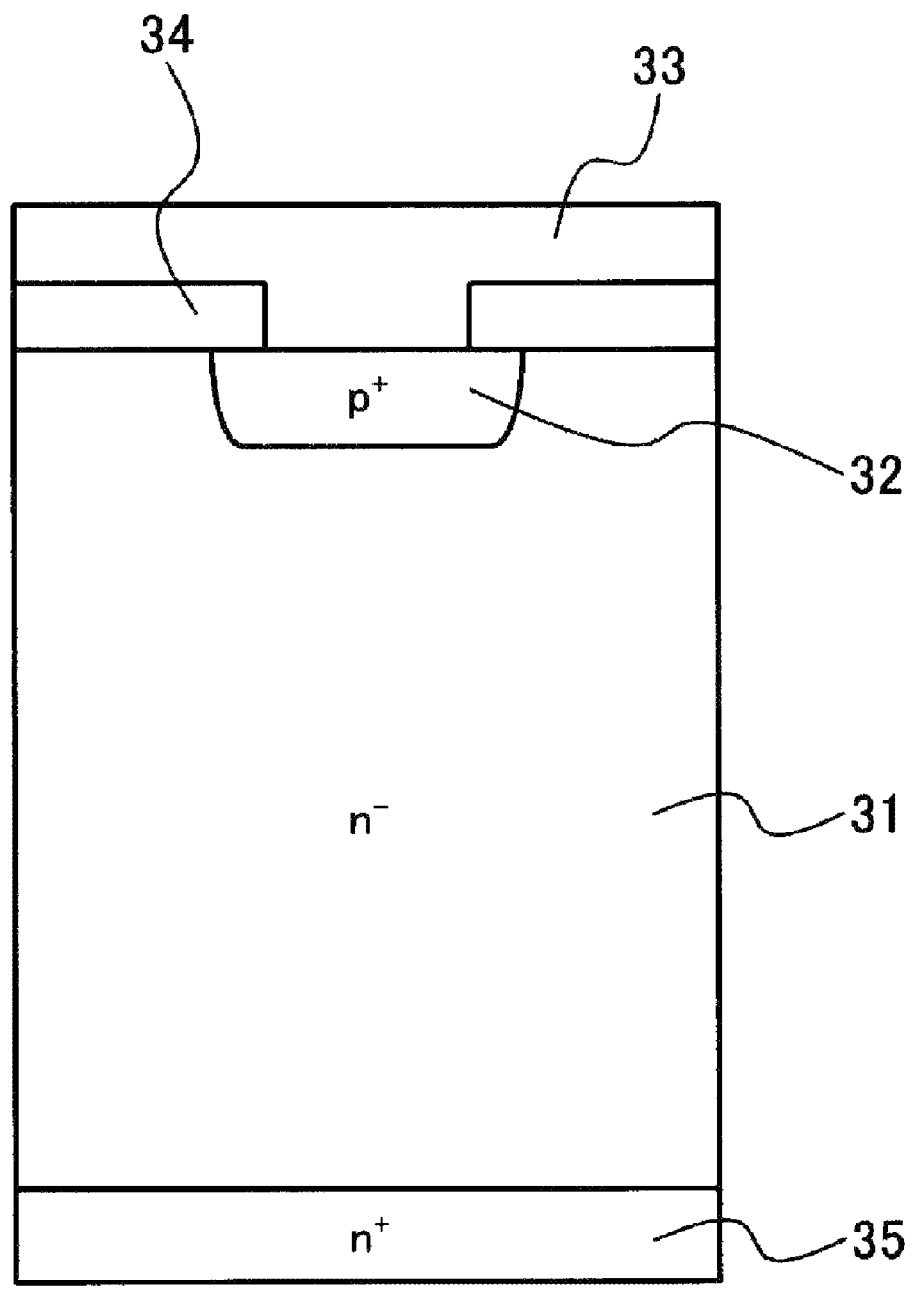
FIG. 17 is a cross-sectional view illustrating the semiconductor device according to Embodiment 3 which is being manufactured.
Figure 18:
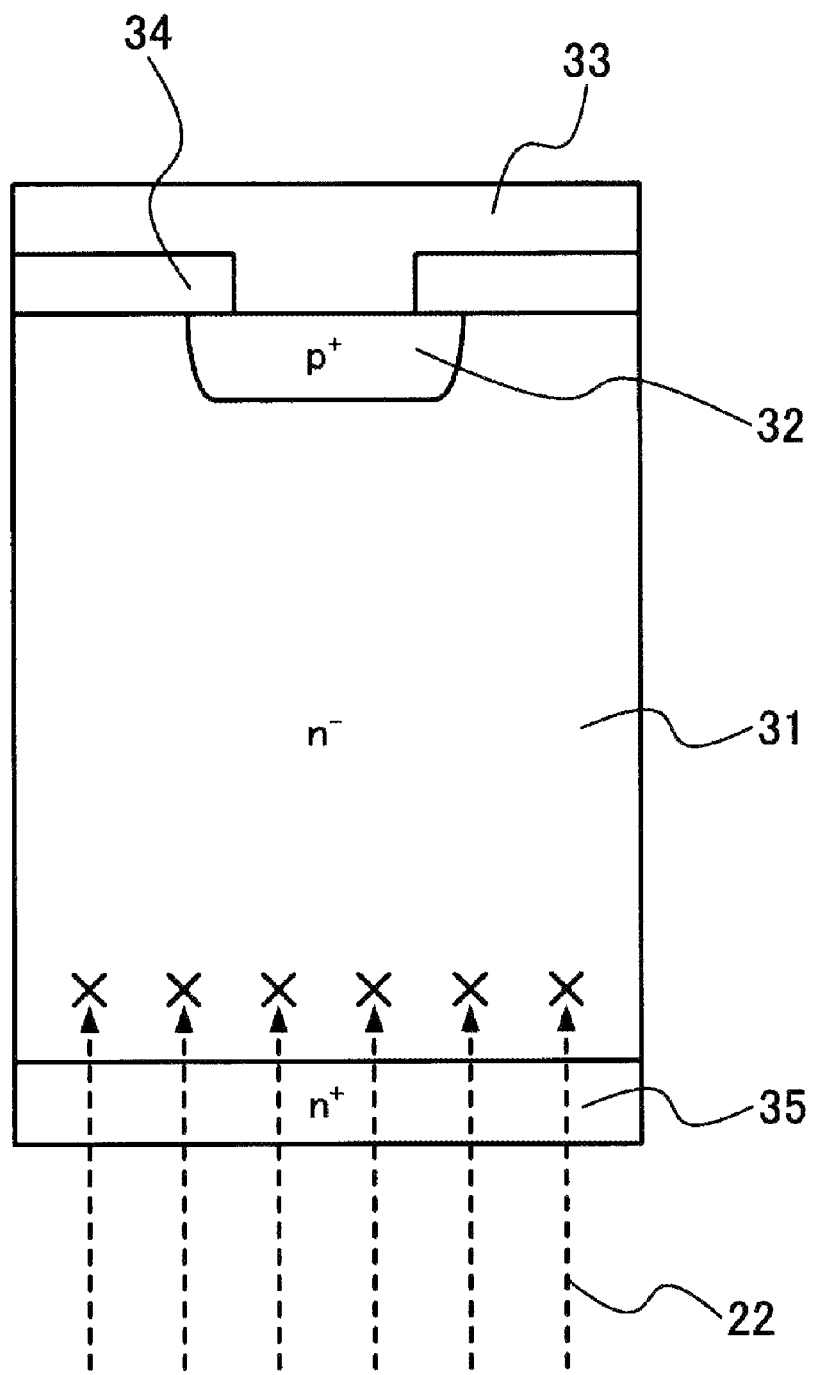
FIG. 18 is a cross-sectional view illustrating the semiconductor device according to Embodiment 3 which is being manufactured.
Figure 19:
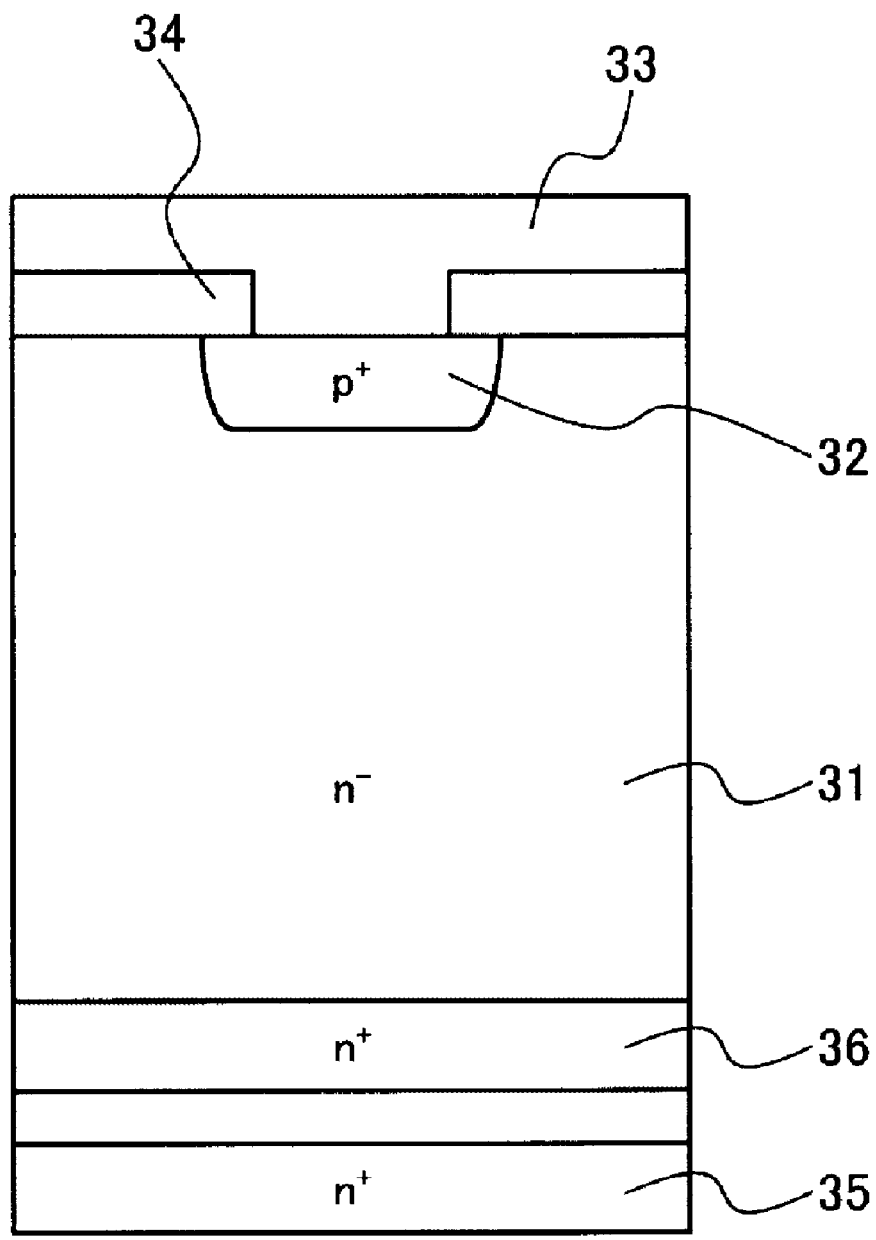
FIG. 19 is a cross-sectional view illustrating the semiconductor device according to Embodiment 3 which is being manufactured.

Then, as illustrated in FIGS. 16 and 17, similarly to when the p⁺ collector layer according to Embodiment 1 is formed, n-type impurity ions 23 are implanted into the ground rear surface of the semiconductor substrate and a first annealing process is performed to form the n⁺ cathode layer 35. Then, as illustrated in FIGS. 18 and 19, similarly to Embodiment 1, a proton 22 is radiated to a region that is deeper than the n⁺ cathode layer 35 from the rear surface of the semiconductor substrate and a second annealing process is performed to the n⁺ field stop layer 36. Then, similarly to when the collector electrode according to Embodiment 1 is formed, the cathode electrode 37 is formed on the rear surface of the semiconductor substrate. In this way, the diode illustrated in FIG. 13 is completed.

As described above, according to Embodiment 3, it is possible to obtain the same effect as that in Embodiment 1. According to Embodiment 3, even when a diode is formed, it is possible to form the n⁺ cathode layer so as to come into ohmic contact with the cathode electrode. In addition, it is possible to form the n⁺ field stop layer with a desired hydrogen induced donor concentration.

(Embodiment 4)

A semiconductor device manufacturing method according to Embodiment 4 differs from the semiconductor device manufacturing method according to Embodiment 3 in that the anode electrode 33 is formed after the second annealing process for forming the n⁺ field stop layer 36. A semiconductor device manufactured by the semiconductor device manufacturing method according to Embodiment 4 is the diode illustrated in FIG. 13 which is given an example of the semiconductor device in Embodiment 3.

Figure 20:
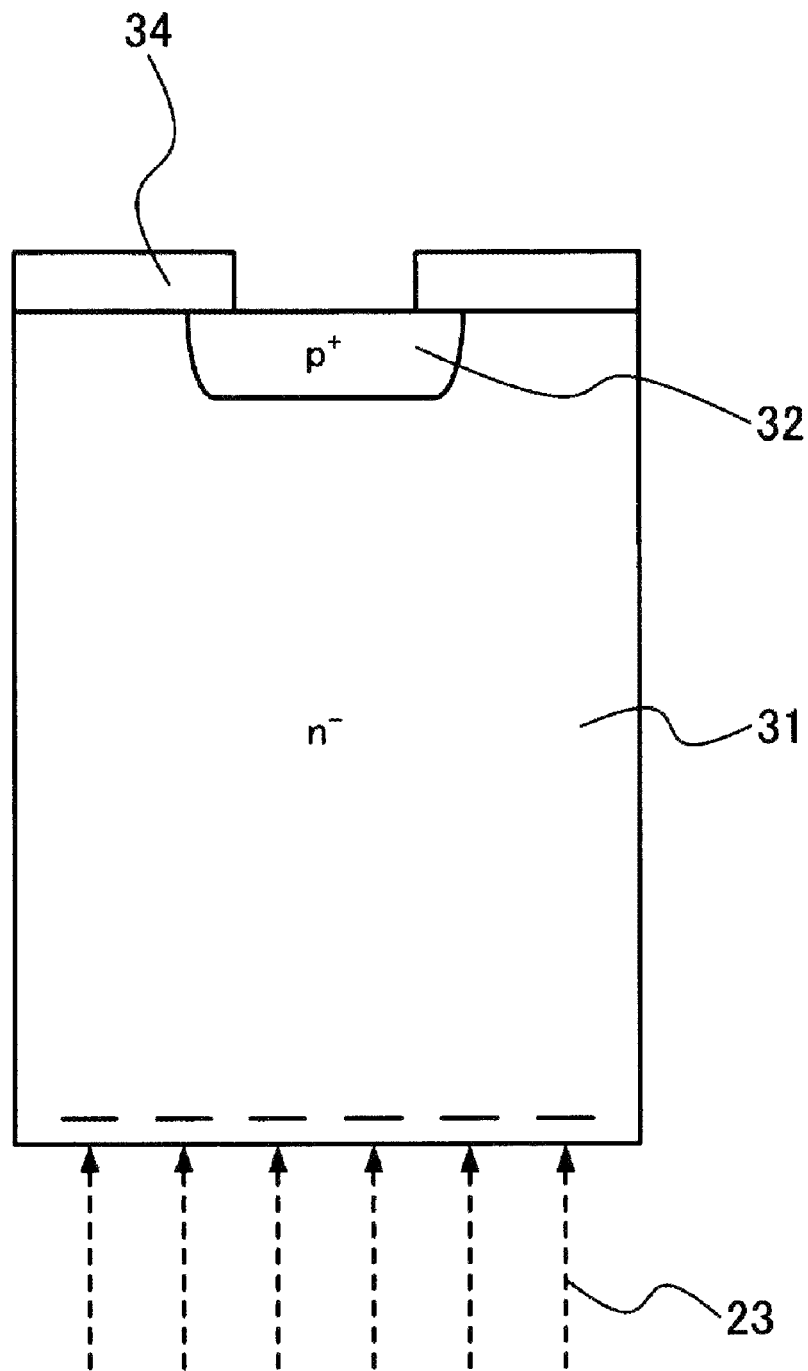
FIG. 20 is a cross-sectional view illustrating a semiconductor device according to Embodiment 4 which is being manufactured.

Next, the semiconductor device manufacturing method according to Embodiment 4 will be described with reference to FIGS. 13 to 15 and FIGS. 20 to 23. FIGS. 20 to 23 are cross-sectional views illustrating the semiconductor device according to Embodiment 4 which is being manufactured. First, as illustrated in FIGS. 14 and 15, similarly to Embodiment 3, a semiconductor substrate 31 is prepared and a p⁺ anode region 32 is formed in a front surface of the semiconductor substrate 31. Then, as illustrated in FIG. 20, similarly to Embodiment 3, a rear surface of the semiconductor substrate 31 is ground and the semiconductor substrate 31 is cleaned to remove adhesive materials.

Figure 21:
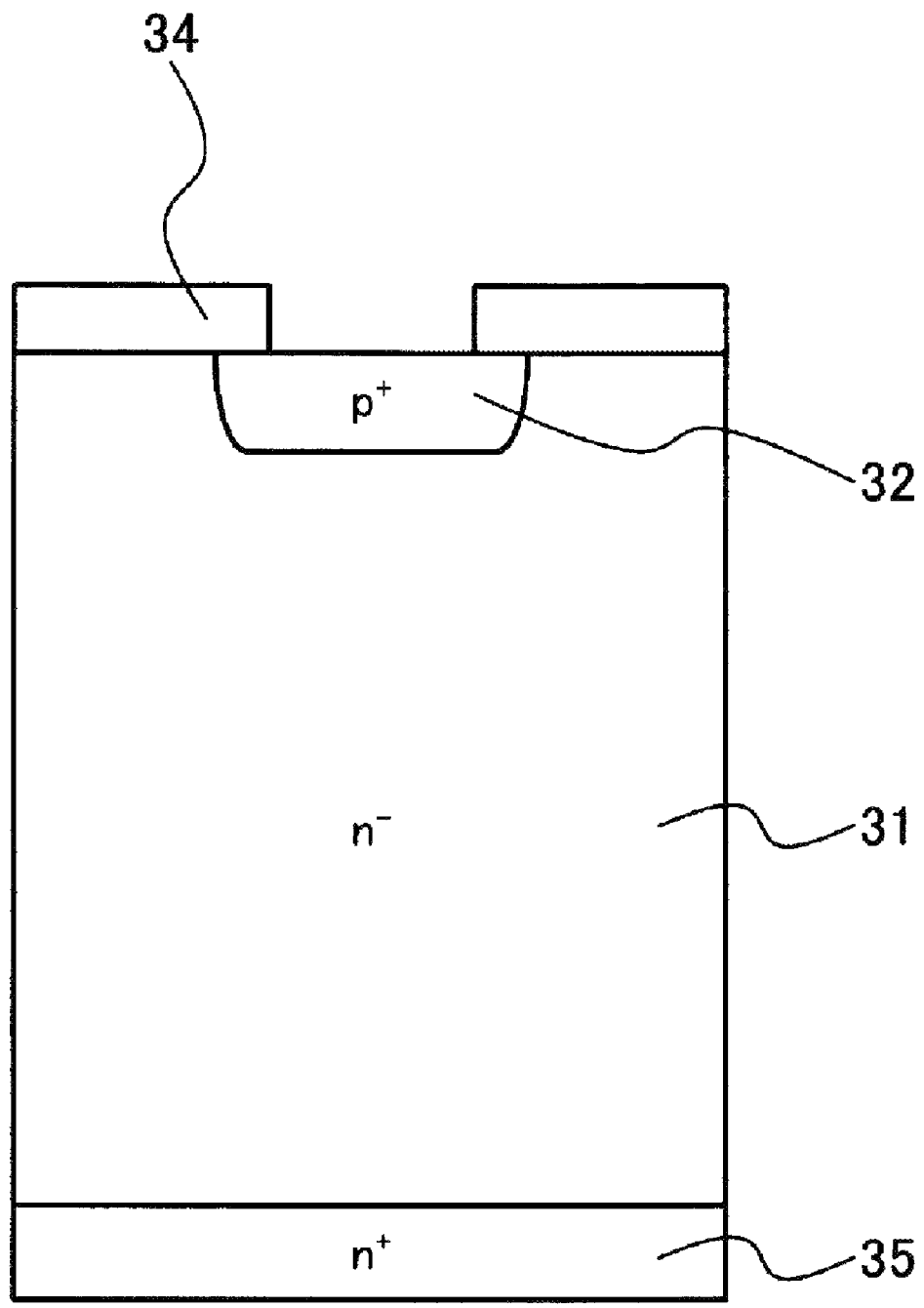
FIG. 21 is a cross-sectional view illustrating the semiconductor device according to Embodiment 4 which is being manufactured.
Figure 22:
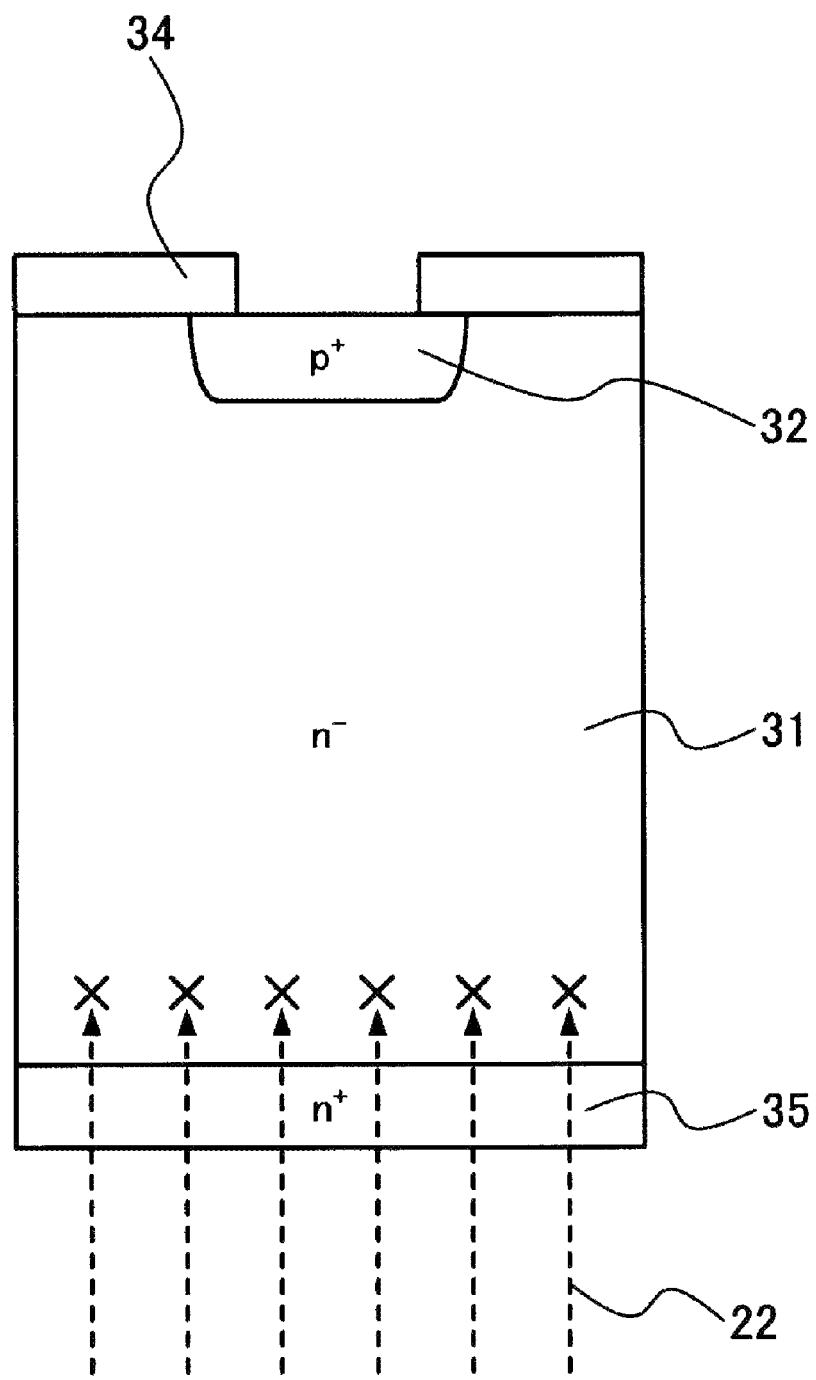
FIG. 22 is a cross-sectional view illustrating the semiconductor device according to Embodiment 4 which is being manufactured.
Figure 23:
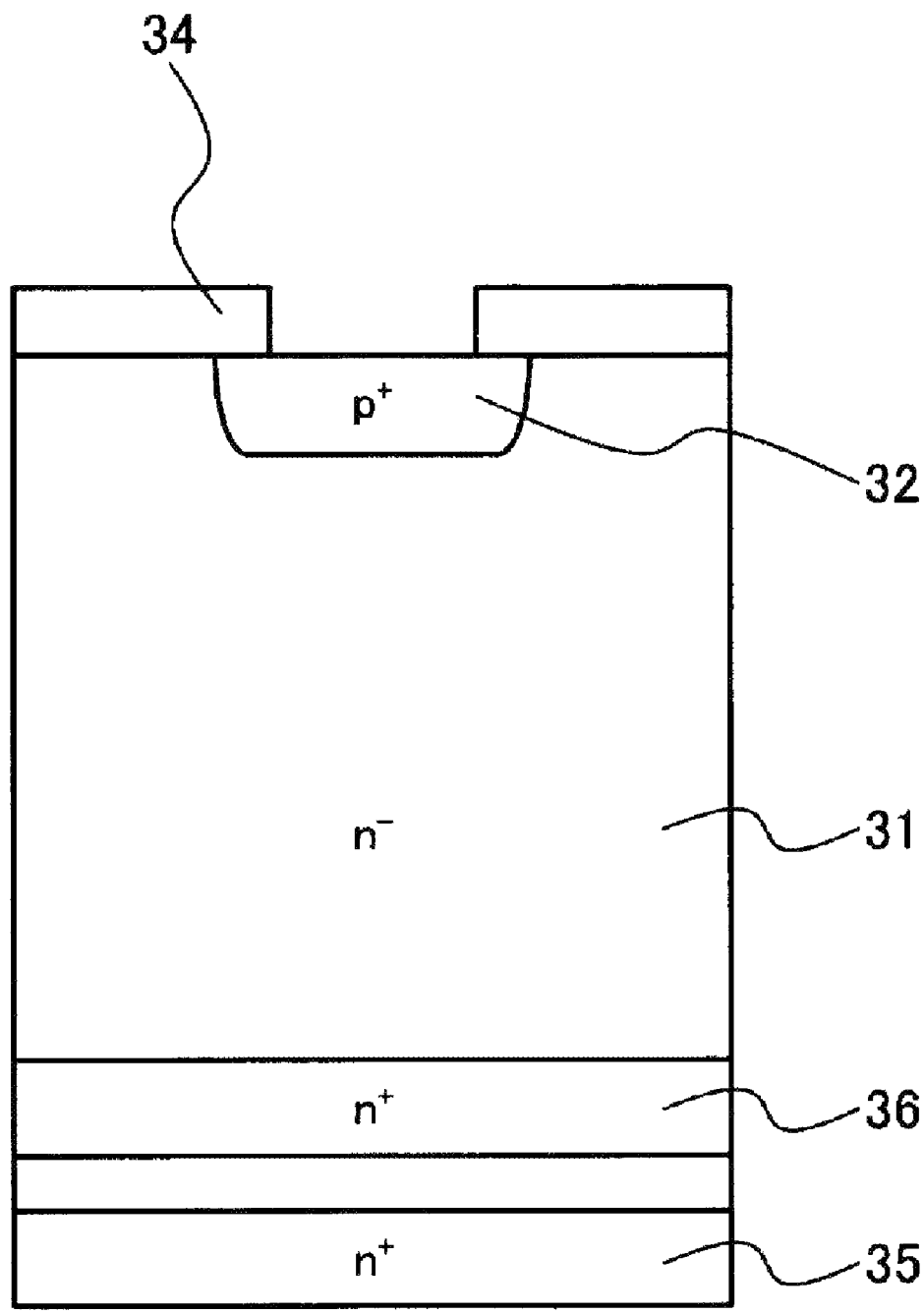
FIG. 23 is a cross-sectional view illustrating the semiconductor device according to Embodiment 3 which is being manufactured.

Then, as illustrated in FIGS. 20 and 21, similarly to Embodiment 3, n-type impurity ions 23 are implanted into the ground rear surface of the semiconductor substrate 31 and a first annealing process is performed to form an n⁺ cathode layer 35. Then, as illustrated in FIGS. 22 and 23, similarly to Embodiment 3, a proton 22 is radiated to a region that is deeper than the n⁺ cathode layer 35 from the rear surface of the semiconductor substrate 31 and a second annealing process is performed to form an n⁺ field stop layer 36. Then, similarly to Embodiment 3, an anode electrode 33 and a cathode electrode 37 are formed on the front and rear surface of the semiconductor substrate 31, respectively. In this way, the diode illustrated in FIG. 13 is completed.

As described above, according to Embodiment 4, it is possible to obtain the same effect as that in Embodiment 3. According to Embodiment 4, the first annealing process can be performed before the anode electrode is formed on the front surface of the semiconductor substrate. Therefore, the first annealing can be performed at a high annealing temperature of, for example, 900° C. or more. As a result, it is possible to further increase the impurity concentration of the n+ cathode layer and to reduce the contact resistance between the n+ cathode layer and the cathode electrode.

(Example 1)

Figure 24:
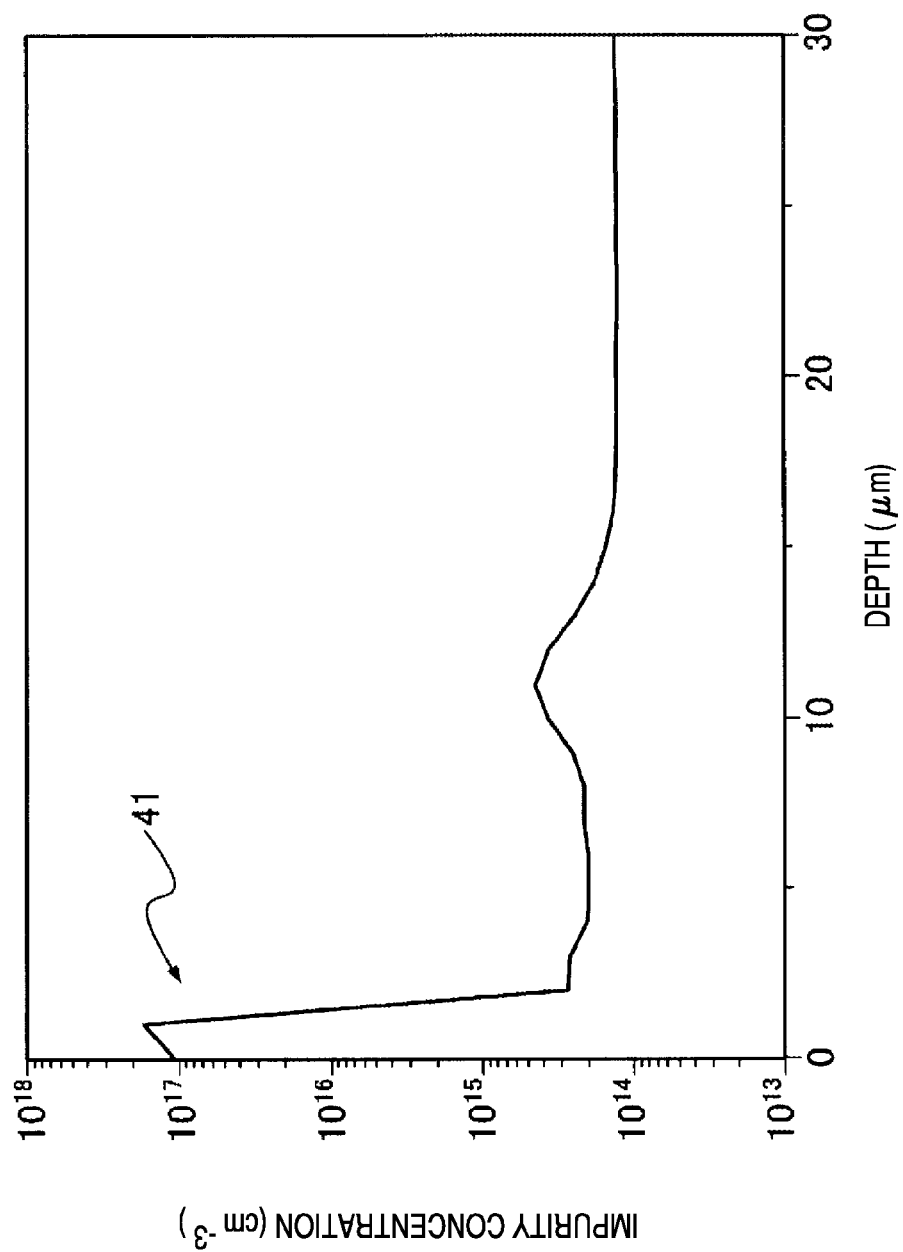
FIG. 24 is a characteristic diagram illustrating a carrier concentration distribution of a semiconductor device according to an example.
Figure 25:
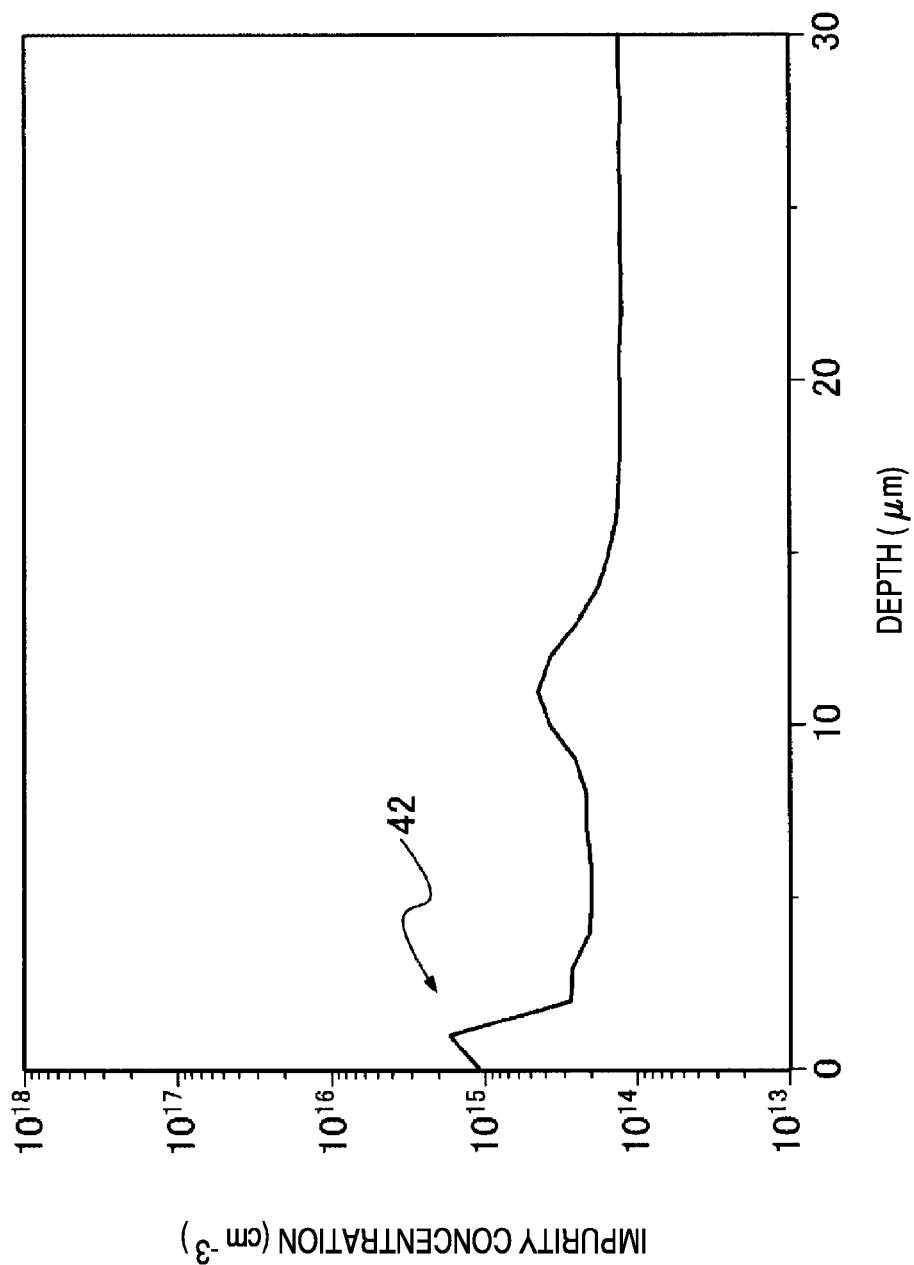
FIG. 25 is a characteristic diagram illustrating a carrier concentration distribution of a semiconductor device according to the related art.
Figure 26:
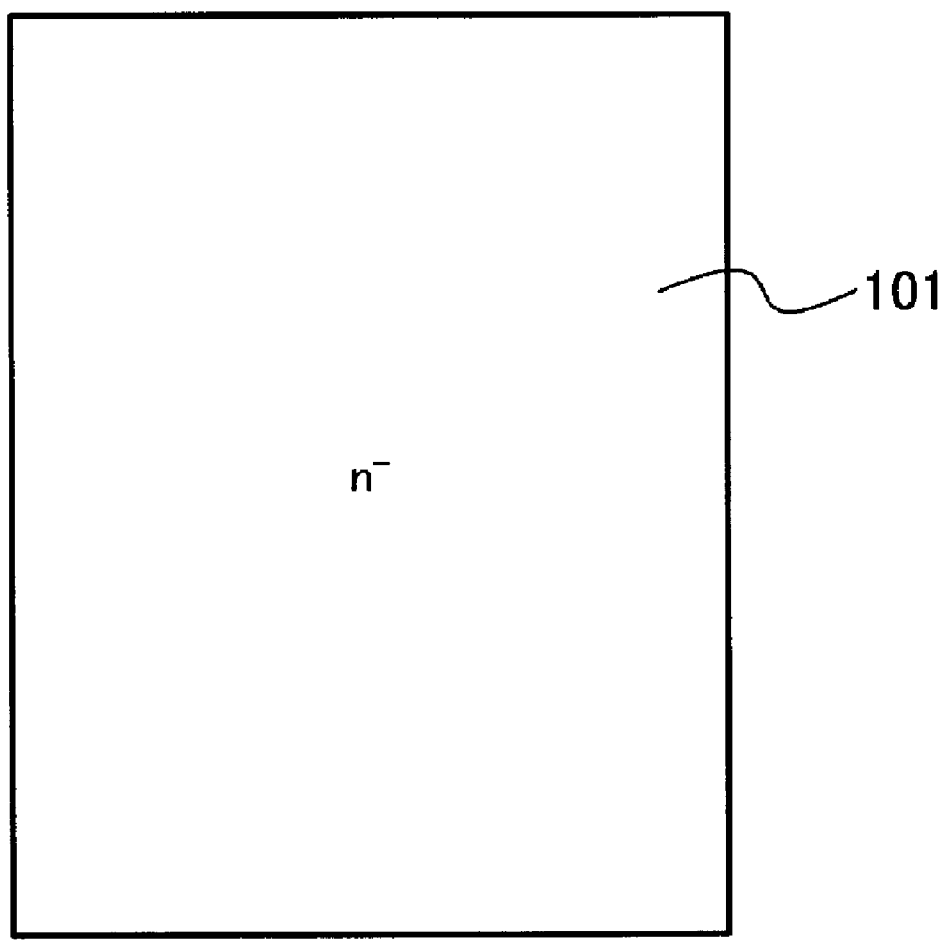
FIG. 26 is a cross-sectional view illustrating the semiconductor device according to the related art which is being manufactured.
Figure 27:
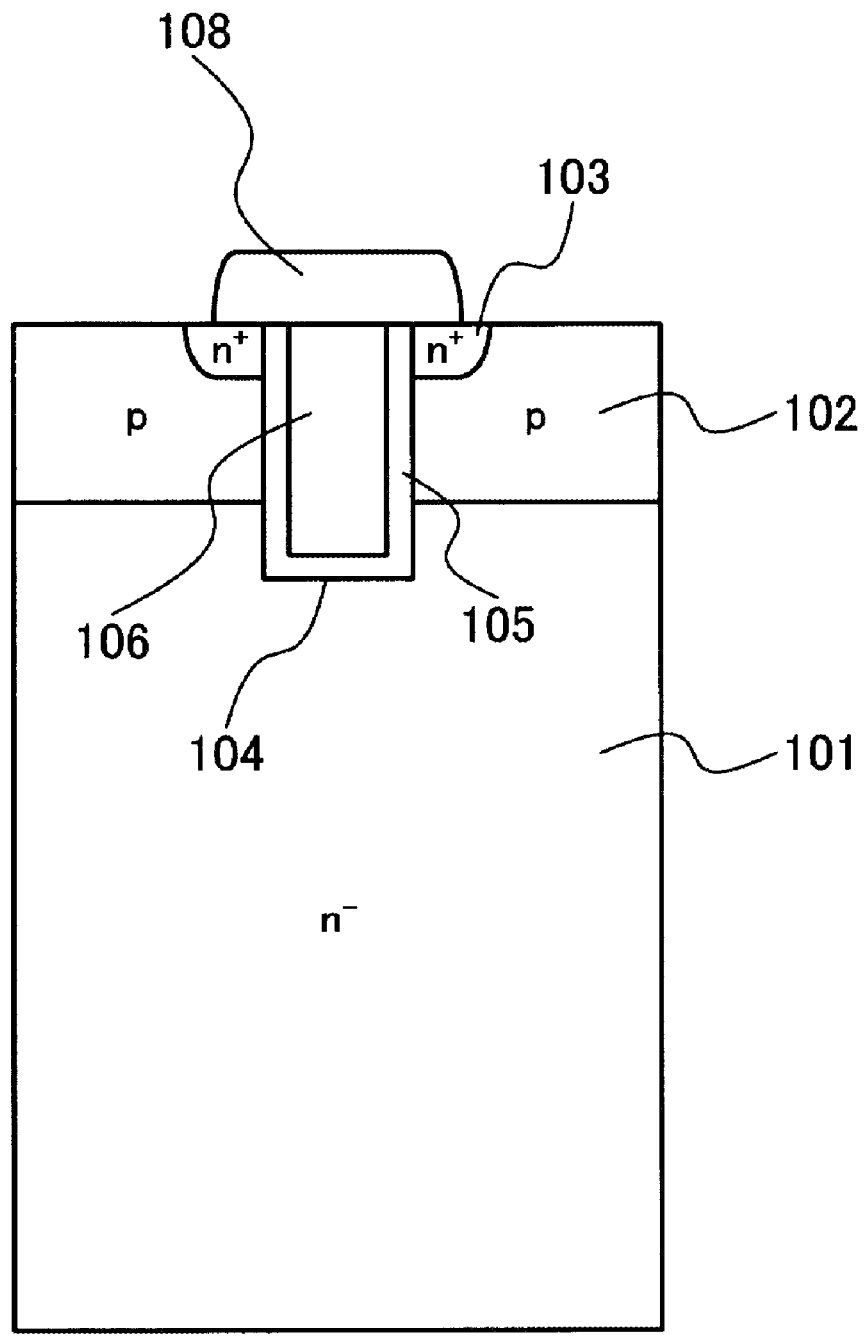
FIG. 27 is a cross-sectional view illustrating the semiconductor device according to the related art which is being manufactured.
Figure 28:
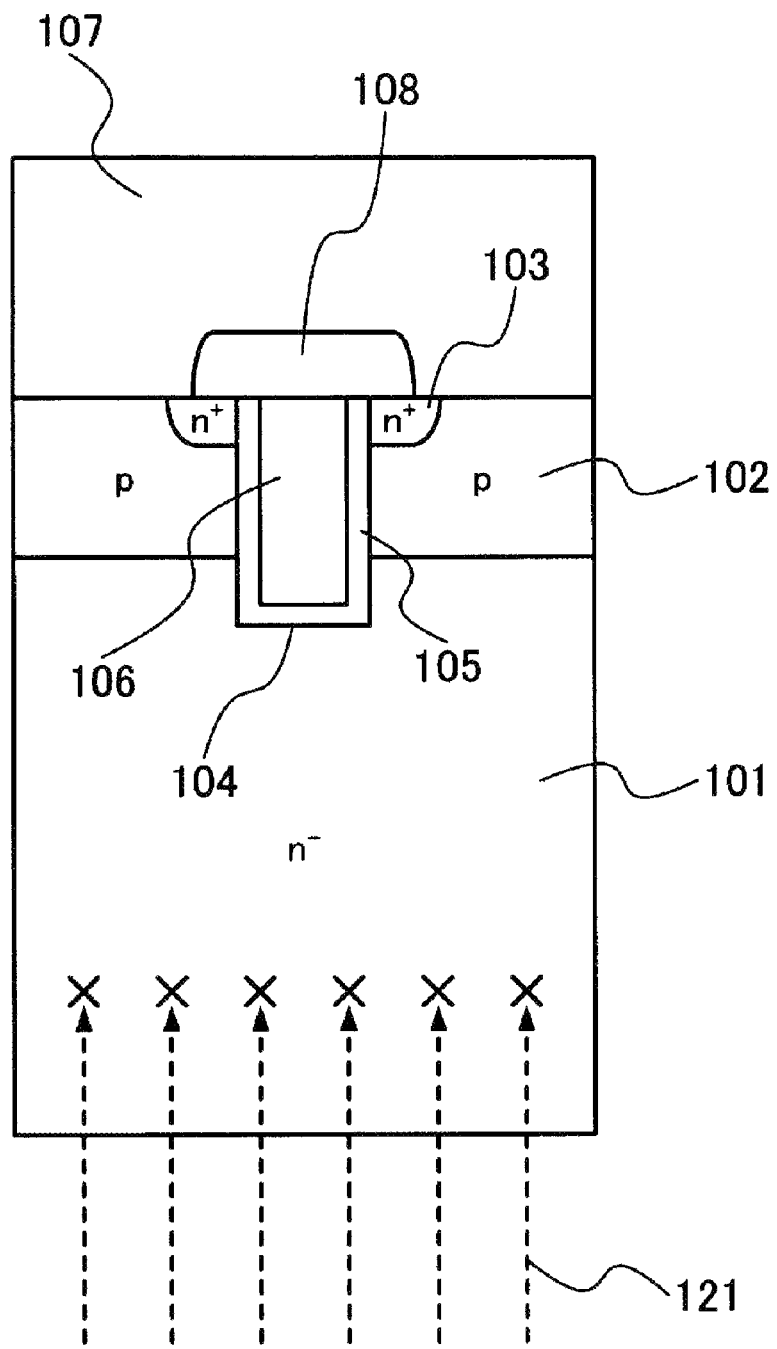
FIG. 28 is a cross-sectional view illustrating the semiconductor device according to the related art which is being manufactured.
Figure 29:
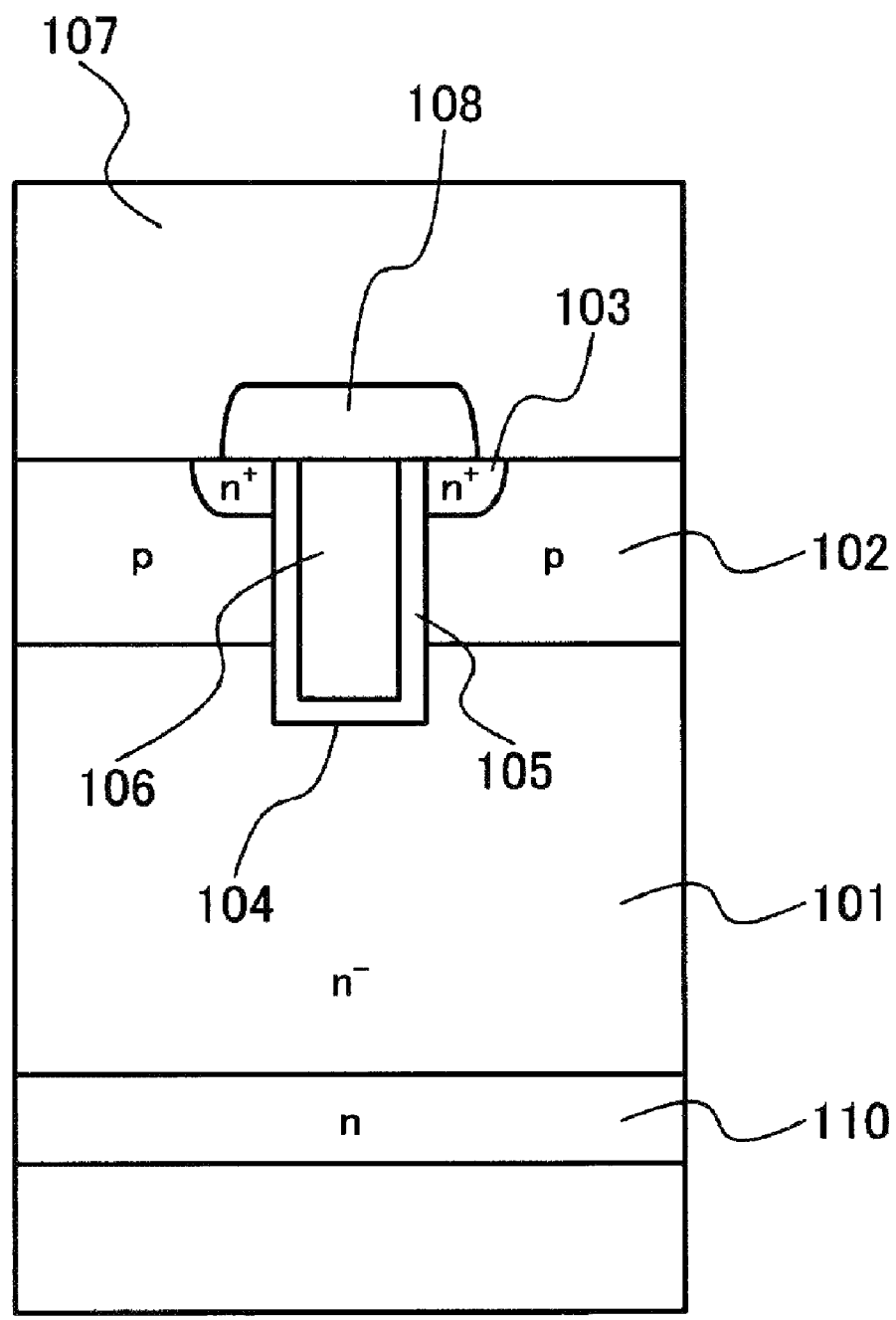
FIG. 29 is a cross-sectional view illustrating the semiconductor device according to the related art which is being manufactured.
Figure 30:
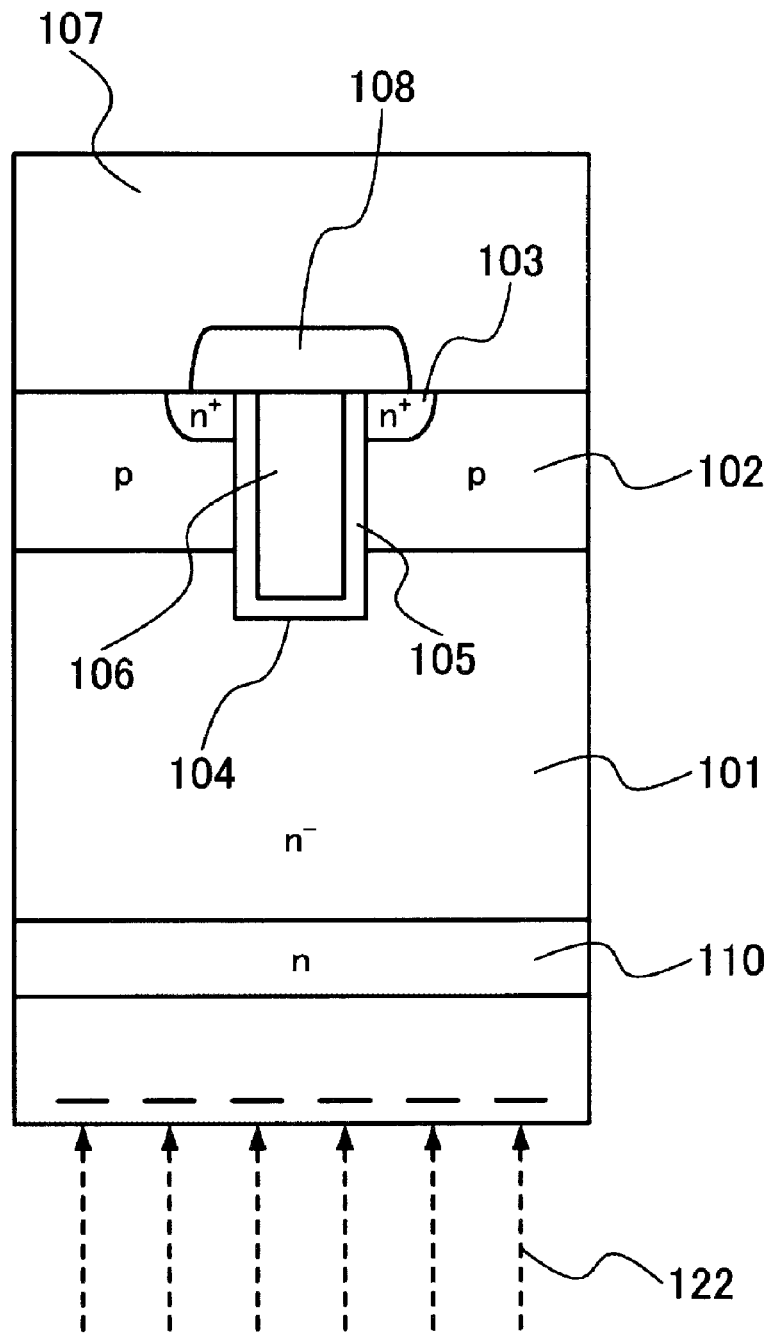
FIG. 30 is a cross-sectional view illustrating the semiconductor device according to the related art which is being manufactured.
Figure 31:
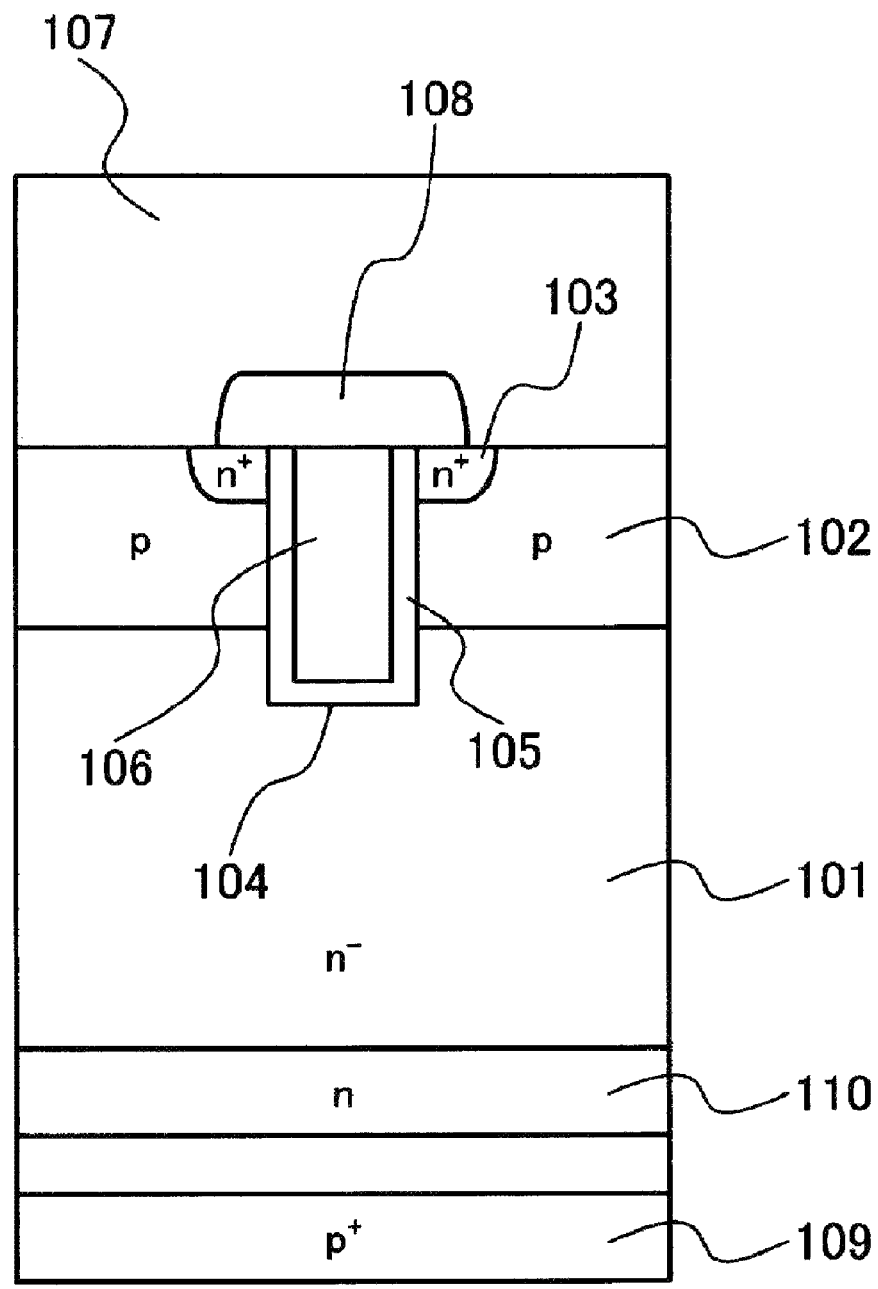
FIG. 31 is a cross-sectional view illustrating the semiconductor device according to the related art which is being manufactured.
Figure 32:
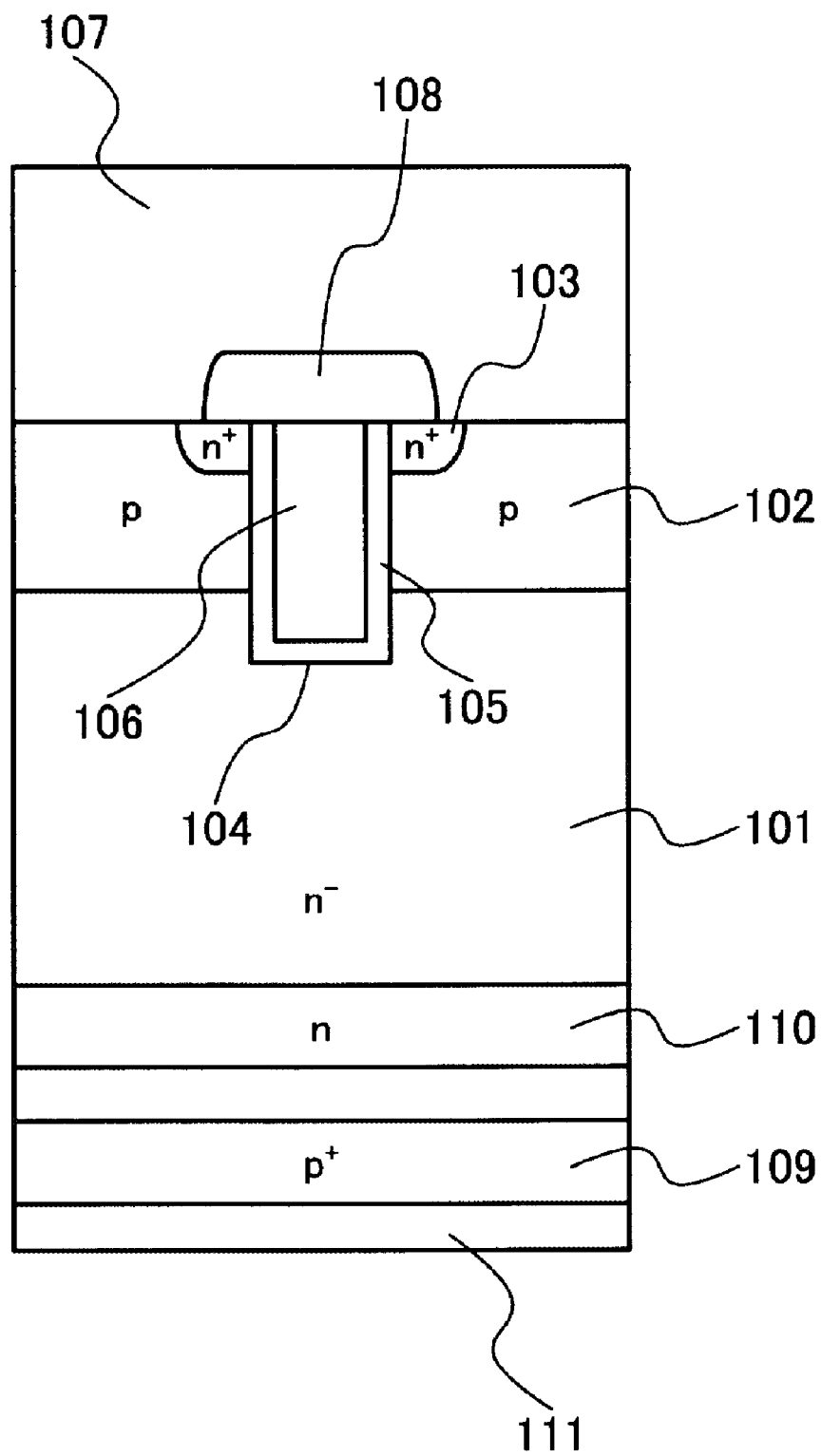
FIG. 32 is a cross-sectional view illustrating the semiconductor device after a process which follows FIG. 31.
Figure 33:
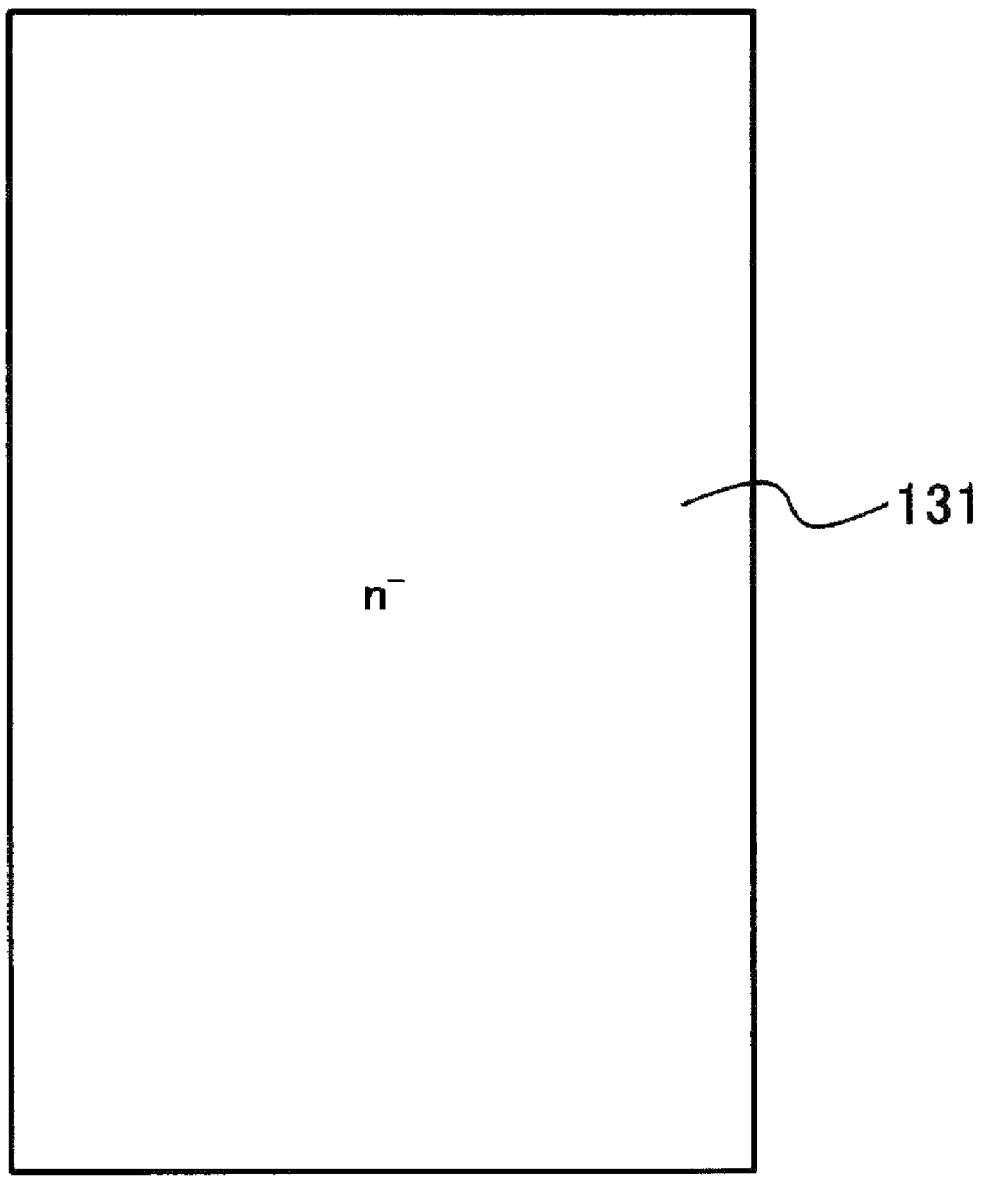
FIG. 33 is a cross-sectional view illustrating another example of the semiconductor device according to the related art which is being manufactured.
Figure 34:
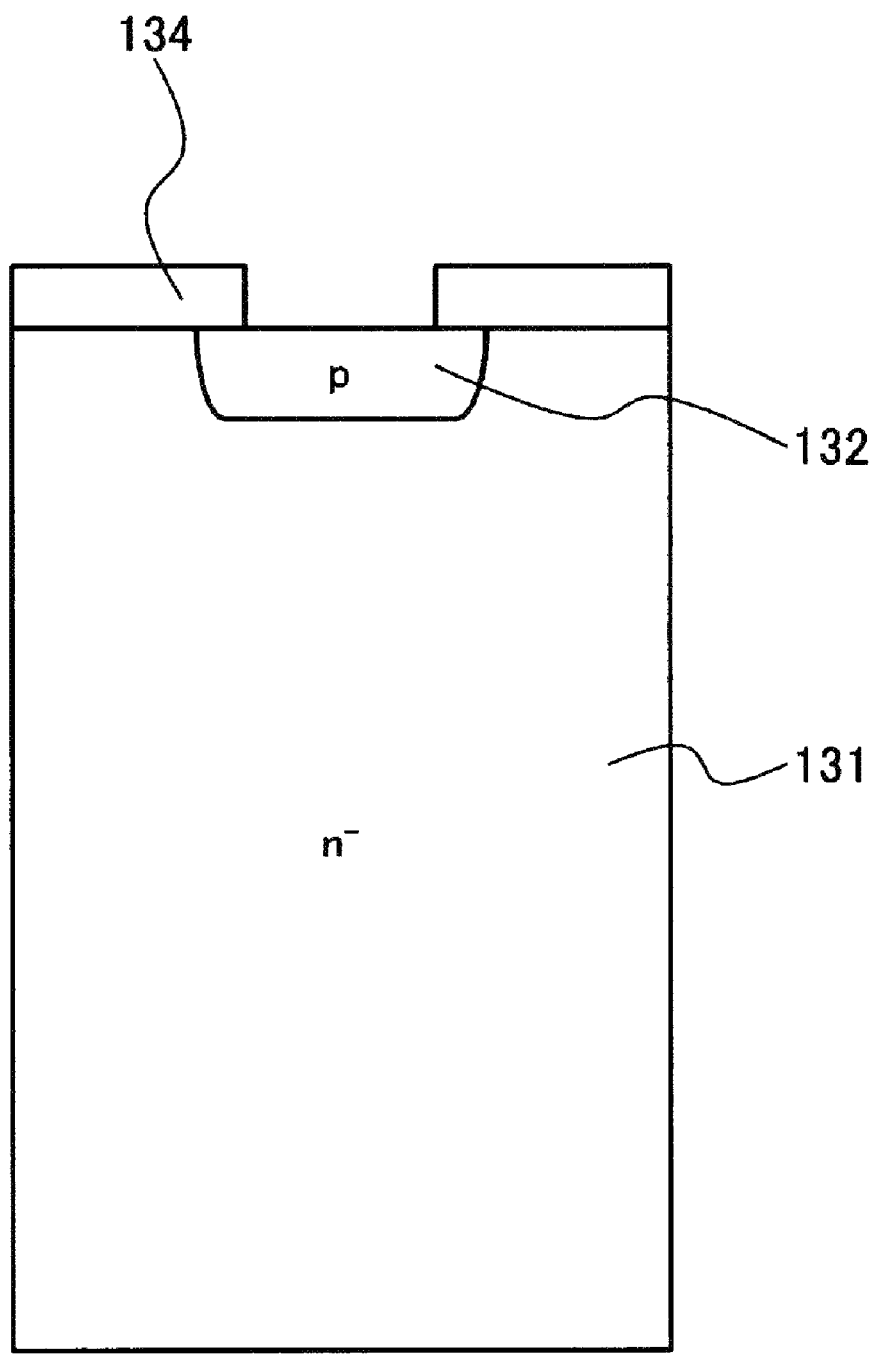
FIG. 34 is a cross-sectional view illustrating another example of the semiconductor device according to the related art which is being manufactured.
Figure 35:
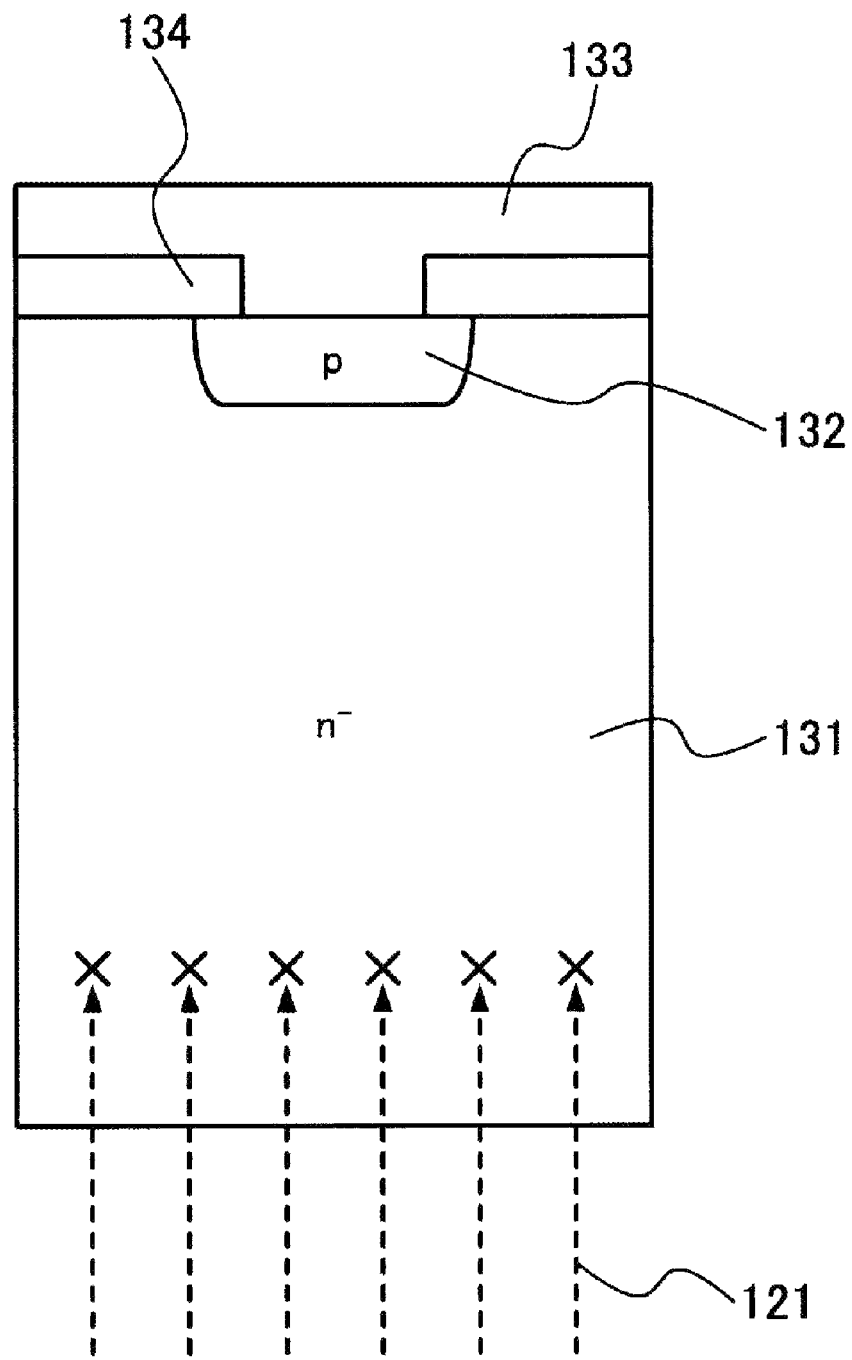
FIG. 35 is a cross-sectional view illustrating another example of the semiconductor device according to the related art which is being manufactured.
Figure 36:
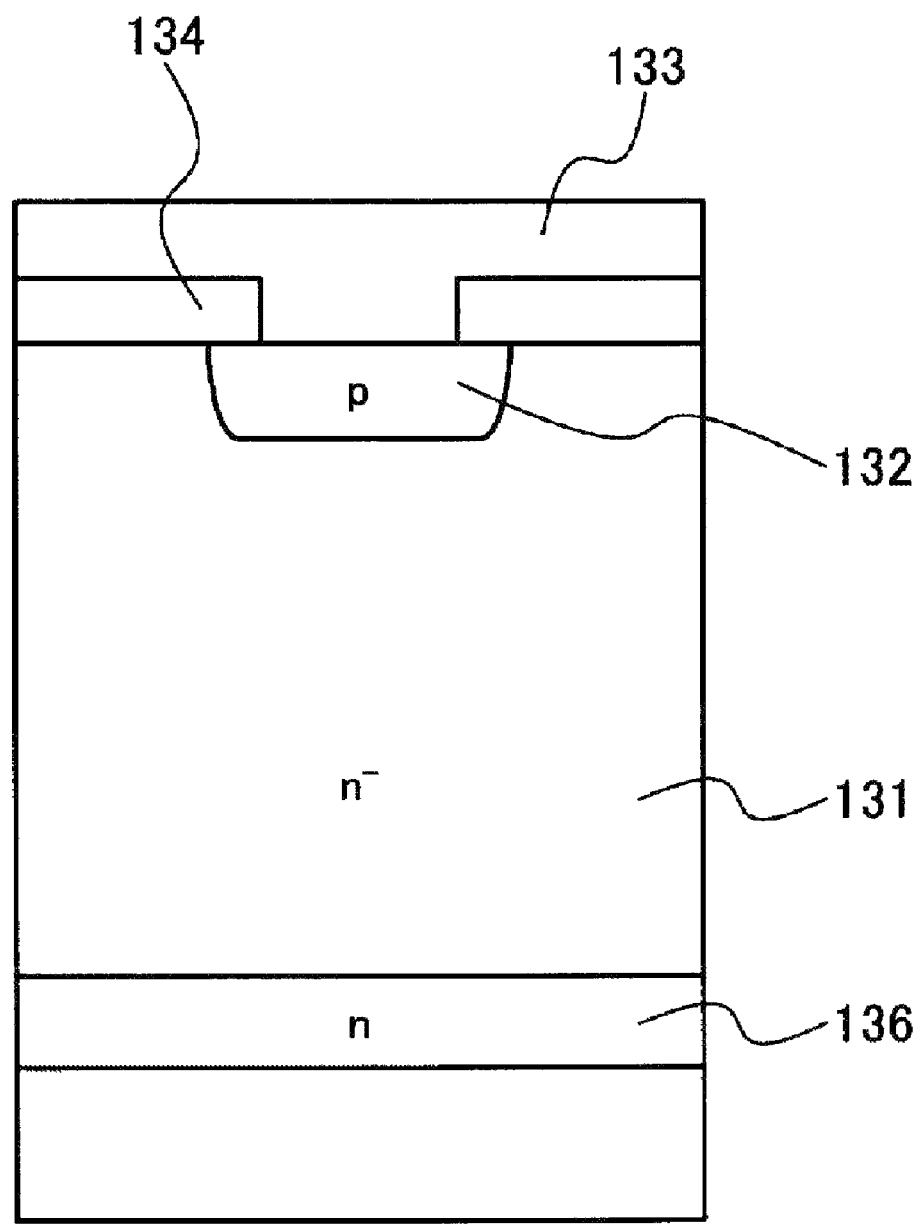
FIG. 36 is a cross-sectional view illustrating another example of the semiconductor device according to the related art which is being manufactured.
Figure 37:
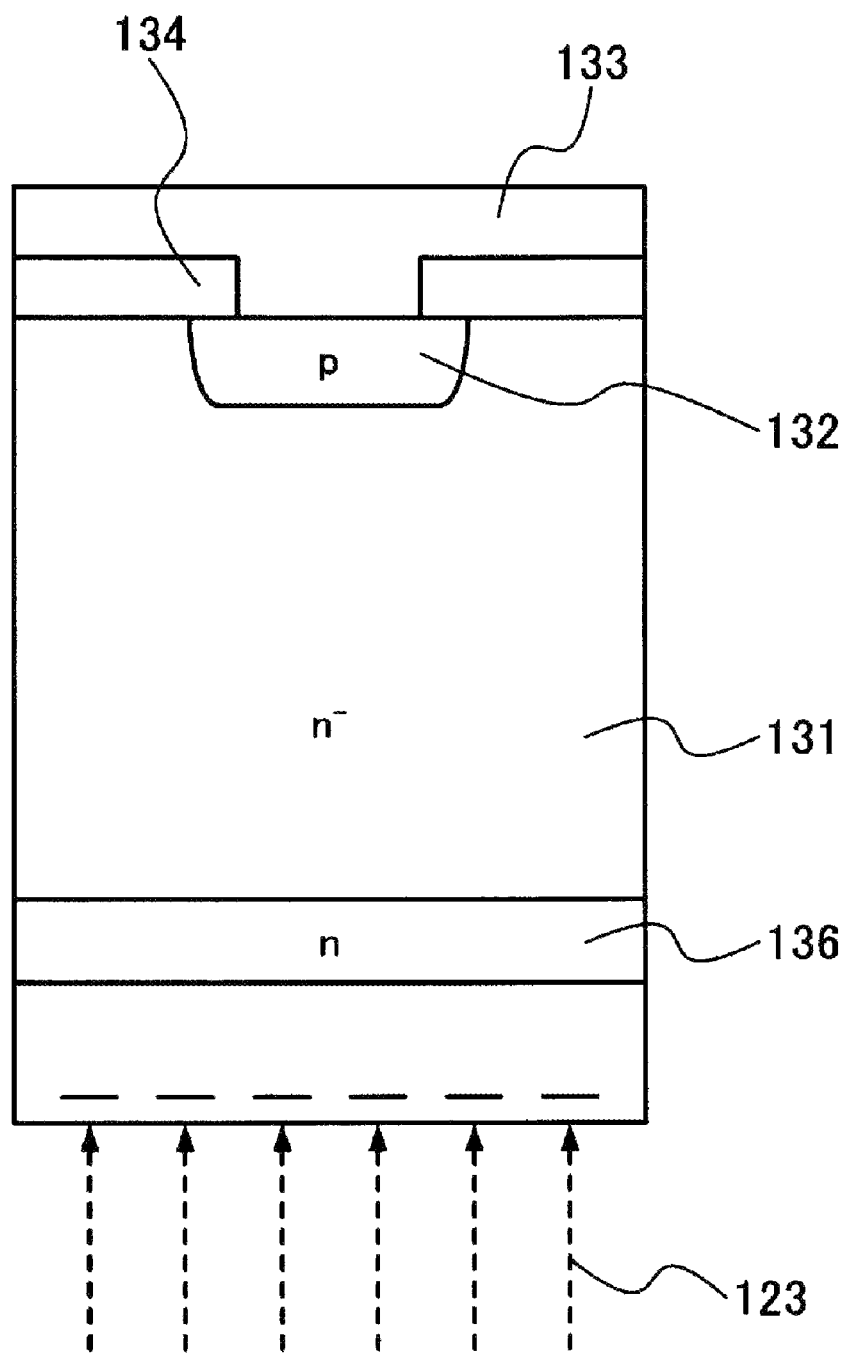
FIG. 37 is a cross-sectional view illustrating another example of the semiconductor device according to the related art which is being manufactured.
Figure 38:
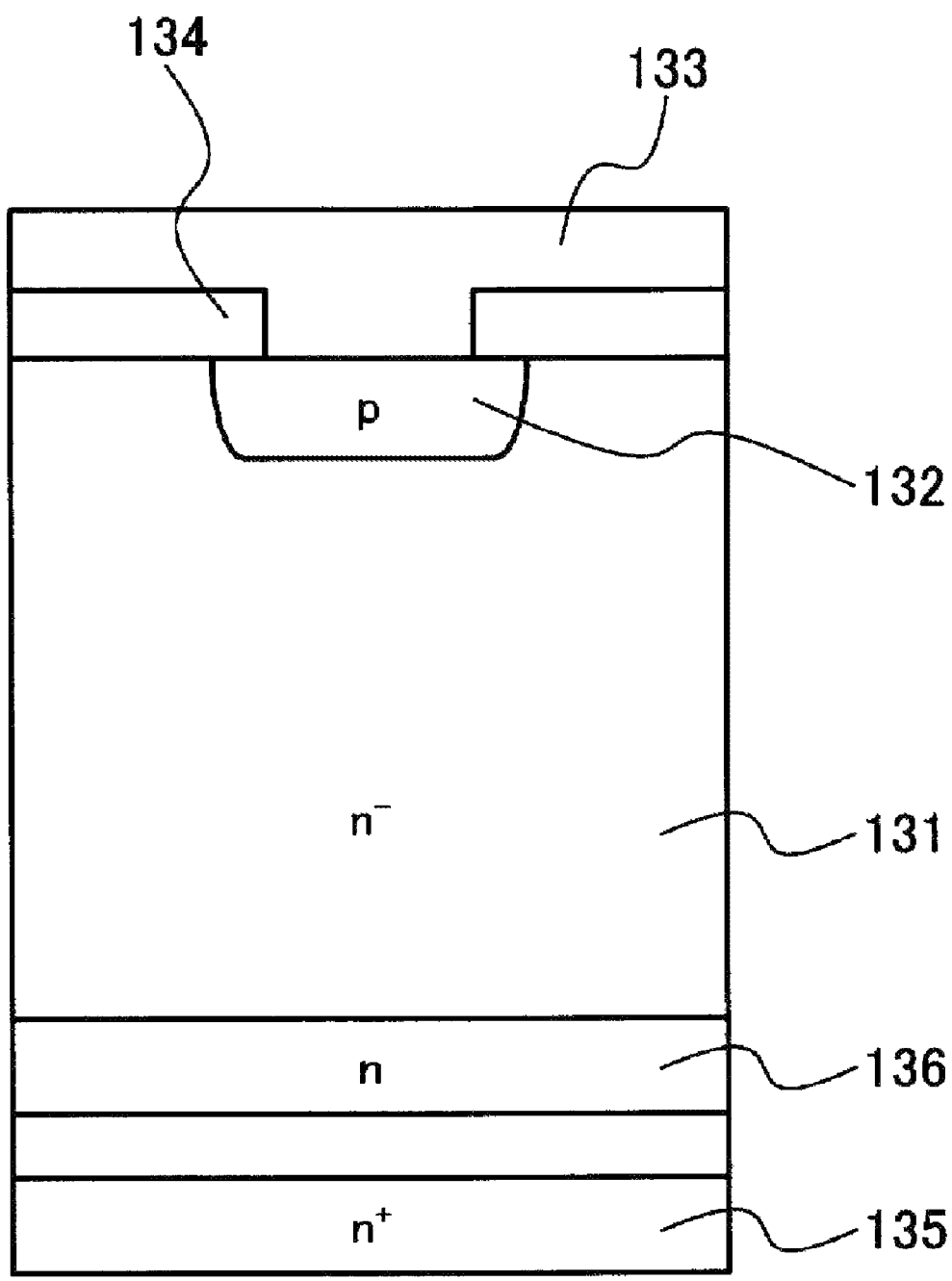
FIG. 38 is a cross-sectional view illustrating another example of the semiconductor device according to the related art which is being manufactured.
Figure 39:
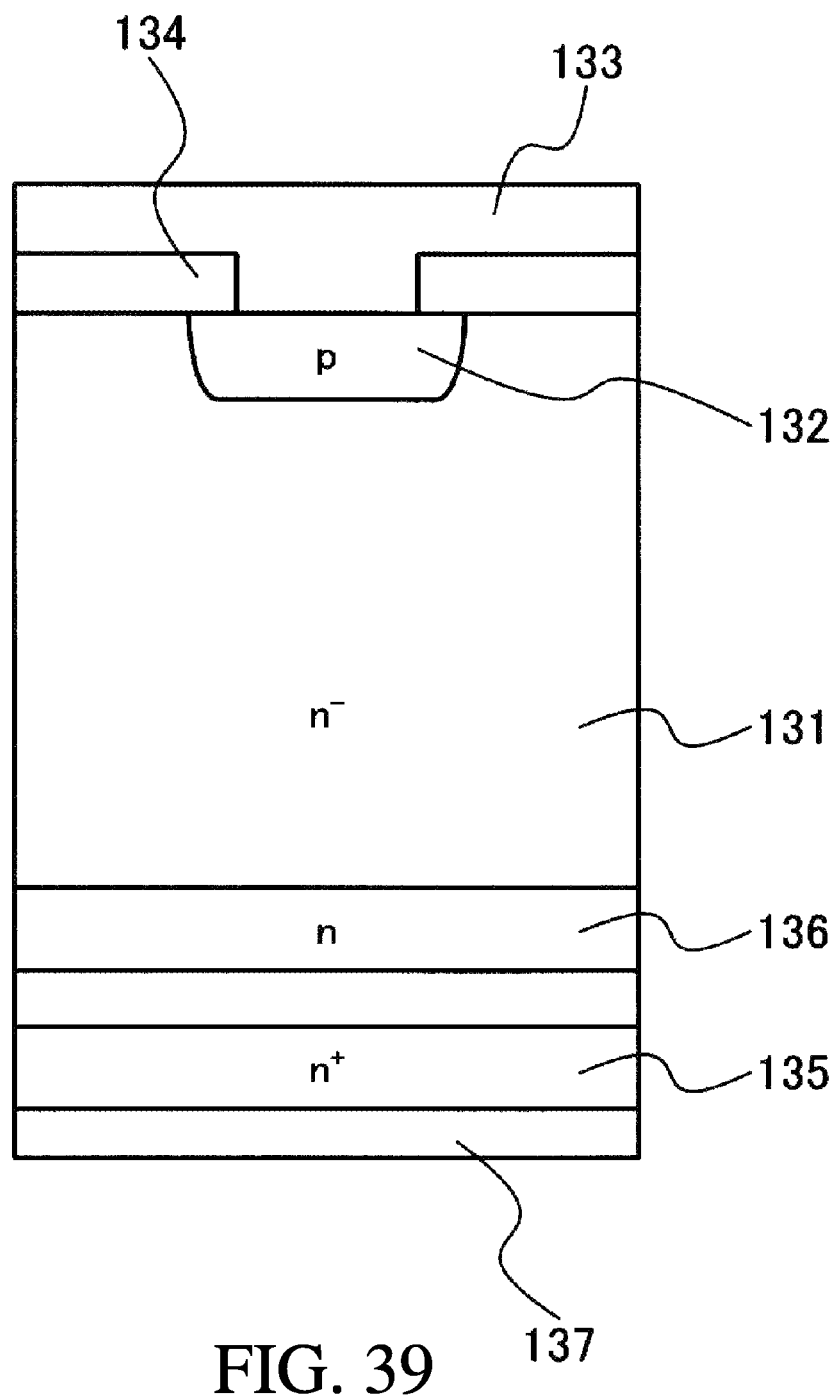
FIG. 39 is a cross-sectional view illustrating the semiconductor device after a process which follows FIG. 38.
Figure 40A:
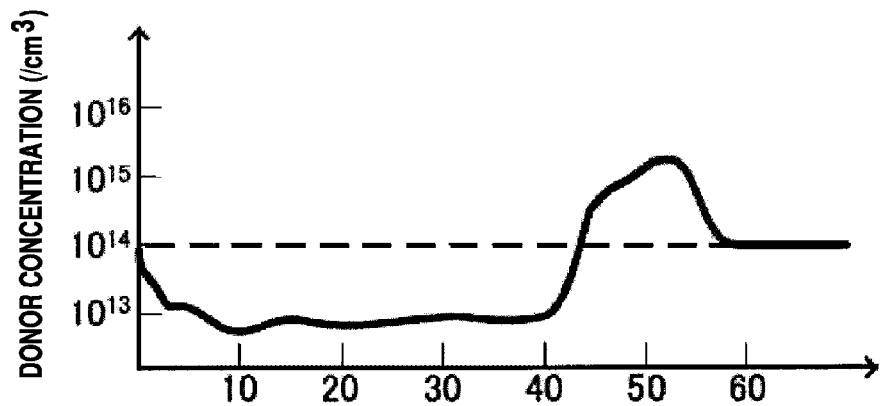
FIG. 40 is a characteristic diagram illustrating the relationship between the average range of proton irradiation and carrier concentration in the related art.
Figure 40B:
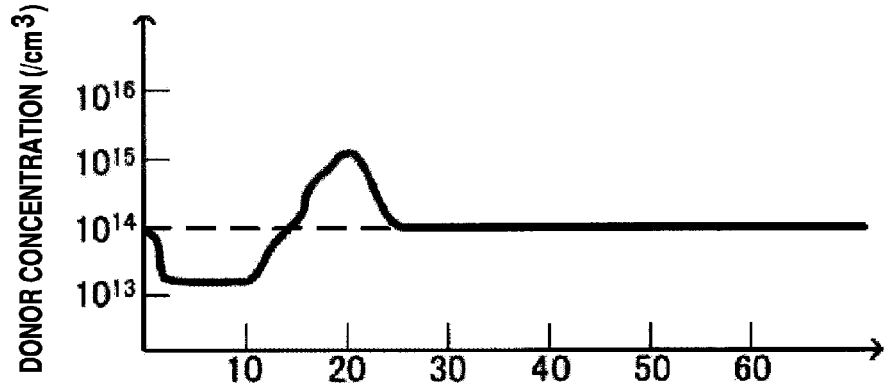
Figure 40C:
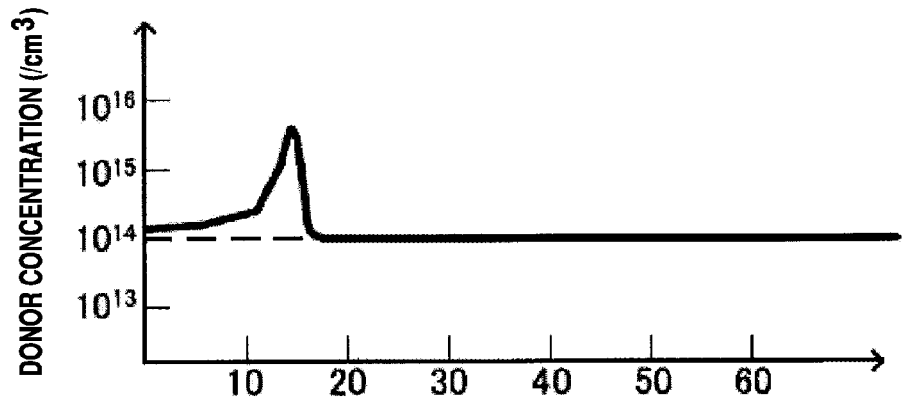

Next, the carrier concentration of a semiconductor layer which came into contact with a rear surface electrode was verified. FIG. 24 is a characteristic diagram illustrating the carrier concentration distribution of a semiconductor device according to an example. FIG. 25 is a characteristic diagram illustrating the carrier concentration distribution of a semiconductor device according to the related art. In FIGS. 24 and 25, the horizontal axis indicates the depth from the boundary between the rear surface electrode and the semiconductor layer which comes into contact with the rear surface electrode. The vertical axis indicates carrier concentration, which is obtained by calculating specific resistance from the spreading resistance measured by a known spreading resistance profiling method and converting the specific resistance into carrier concentration. When the mobility of electrons or holes is significantly reduced from the value of a crystal (for example, the mobility of electrons is about 1360 (cm$^2$/(V·s) at a temperature of 300 K), the carrier concentration can be regarded as the doping concentration of doped impurities (electrically activated concentration). An ion implantation process (Step S5) and a first annealing process (Step S6) for forming a semiconductor layer which came into contact with a rear surface electrode were performed and a proton irradiation process (Step S7) and a second annealing process (Step S8) were performed according to the semiconductor device manufacturing method according to Embodiment 1 to prepare a sample (hereinafter, referred to as an example).

For comparison, a proton irradiation process for forming a field stop layer was performed, an ion implantation process for forming a semiconductor layer which came into contact with a rear surface electrode was performed, and a thermal annealing process was collectively performed to prepare a sample (hereinafter, referred to as a comparative example). The temperature of the thermal annealing process in the comparative example was equal to the temperature of the second annealing process in the example such that the carrier concentration of the field stop layer was equal to the carrier concentration of the field stop layer in the example. Then, in the example and the comparative example, impurity concentration was measured in the depth direction from the boundary between the rear surface electrode and the semiconductor layer which came into contact with the rear surface electrode.

The result illustrated in FIG. 24 proved that, in the example, it was possible to increase the impurity concentration of the rear surface electrode and a semiconductor layer 41 which came into contact with the rear surface electrode since the temperature of the first annealing process for the rear surface electrode and a semiconductor layer 41 which came into contact with the rear surface electrode could be set to be higher than the activation conditions of protons. The result illustrated in FIG. 25 proved that, in the comparative example, the impurity concentration of the rear surface electrode and a semiconductor layer 42 which came into contact with the rear surface electrode was low since the upper limit of the annealing temperature of the rear surface electrode and the semiconductor layer 42 which came into contact with the rear surface electrode was determined by the activate conditions of protons.

(Embodiment 5)

Figures 45A, 45B:
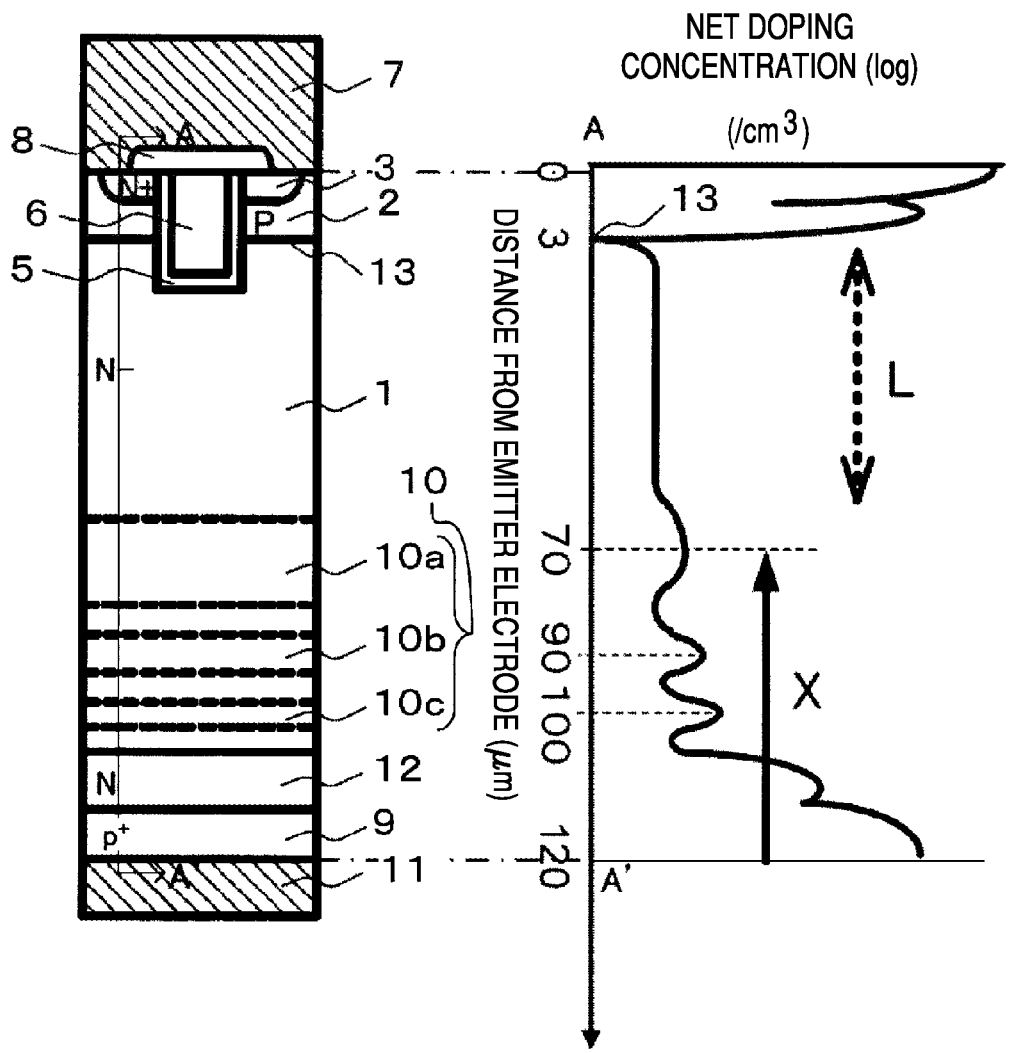
FIG. 45 is a cross-sectional view illustrating an example of a semiconductor device manufactured by a semiconductor device manufacturing method according to Embodiment 5.
Figure 47:
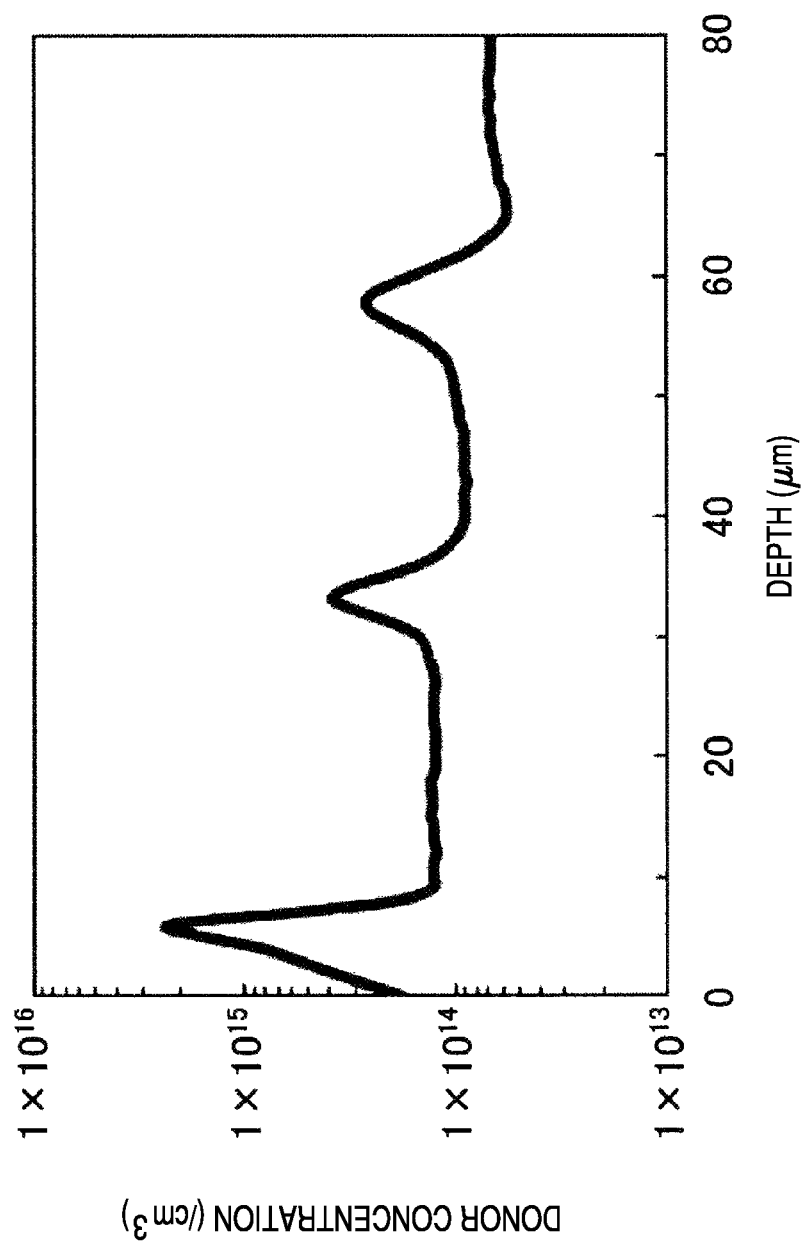
FIG. 47 is a characteristic diagram illustrating a carrier concentration distribution of an $n^+$ field stop layer of the semiconductor device illustrated in FIG. 45.

FIG. 45 is a cross-sectional view illustrating an example of a semiconductor device manufactured by a semiconductor device manufacturing method according to Embodiment 5. FIG. 47 is a characteristic diagram illustrating a carrier concentration distribution of an n+ field stop layer in the semiconductor device illustrated in FIG. 45. FIG. 47 illustrates the carrier concentration distribution measured by an SR method. Since a p+ collector layer 9 has a very small depth of about 0.5 μm with respect to the horizontal axis scale of FIG. 47, the illustration thereof is omitted. The semiconductor device manufacturing method according to Embodiment 5 differs from the semiconductor device manufacturing method according to Embodiment 1 in that a plurality of n+ field stop layers 10 are formed by a plurality of proton irradiation stages after a first ion implantation process for implanting p-type impurity ions 21, such as boron ions and a first annealing process are performed to form a p+ collector layer 9 in the rear surface of a substrate rear.

As illustrated in FIG. 45, the semiconductor device manufactured by the semiconductor device manufacturing method according to Embodiment 5 includes n+ field stop layers 10a to 10c with different depths from the rear surface of the substrate. As illustrated in FIG. 47, the n+ field stop layers 10a to 10c are provided so as to be separated from each other. As the depth of the n+ field stop layers from the rear surface of the substrate increases, the carrier concentration thereof is reduced. In addition, the n+ field stop layer 10c which is provided at the shallowest position from the rear surface of the substrate is arranged so as to be separated from the p+ collector layer 9.

The semiconductor device manufacturing method according to Embodiment 5 will be described with reference to FIGS. 3 to 6, 45, and 48 to 52. FIGS. 48 to 52 are cross-sectional views illustrating the semiconductor device according to Embodiment 5 which is being manufactured. First, as illustrated in FIGS. 3 to 5, similarly to Embodiment 1, a semiconductor substrate which will be an n− drift layer 1 is prepared and a trench-gate-type MOS gate structure and an emitter electrode 7 are formed on the front surface of the semiconductor substrate. Then, as illustrated in FIGS. 5 and 6, similarly to Embodiment 1, the rear surface of the semiconductor substrate is ground and the semiconductor substrate is cleaned to remove adhesive materials. Then, p-type impurity ions 21 are implanted into the ground rear surface of the semiconductor substrate and the first annealing process is performed to form the p+ collector layer 9.

Figure 48:
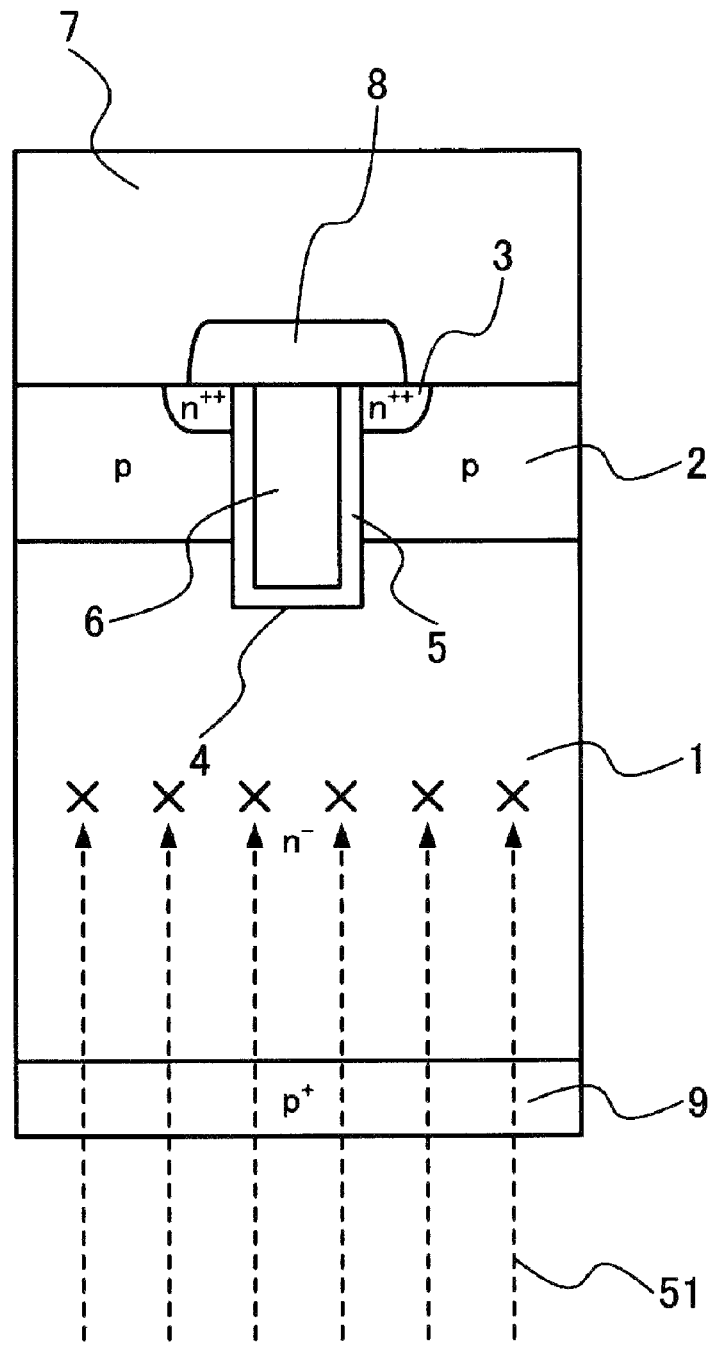
FIG. 48 is a cross-sectional view illustrating the semiconductor device according to Embodiment 5 which is being manufactured.
Figure 49:
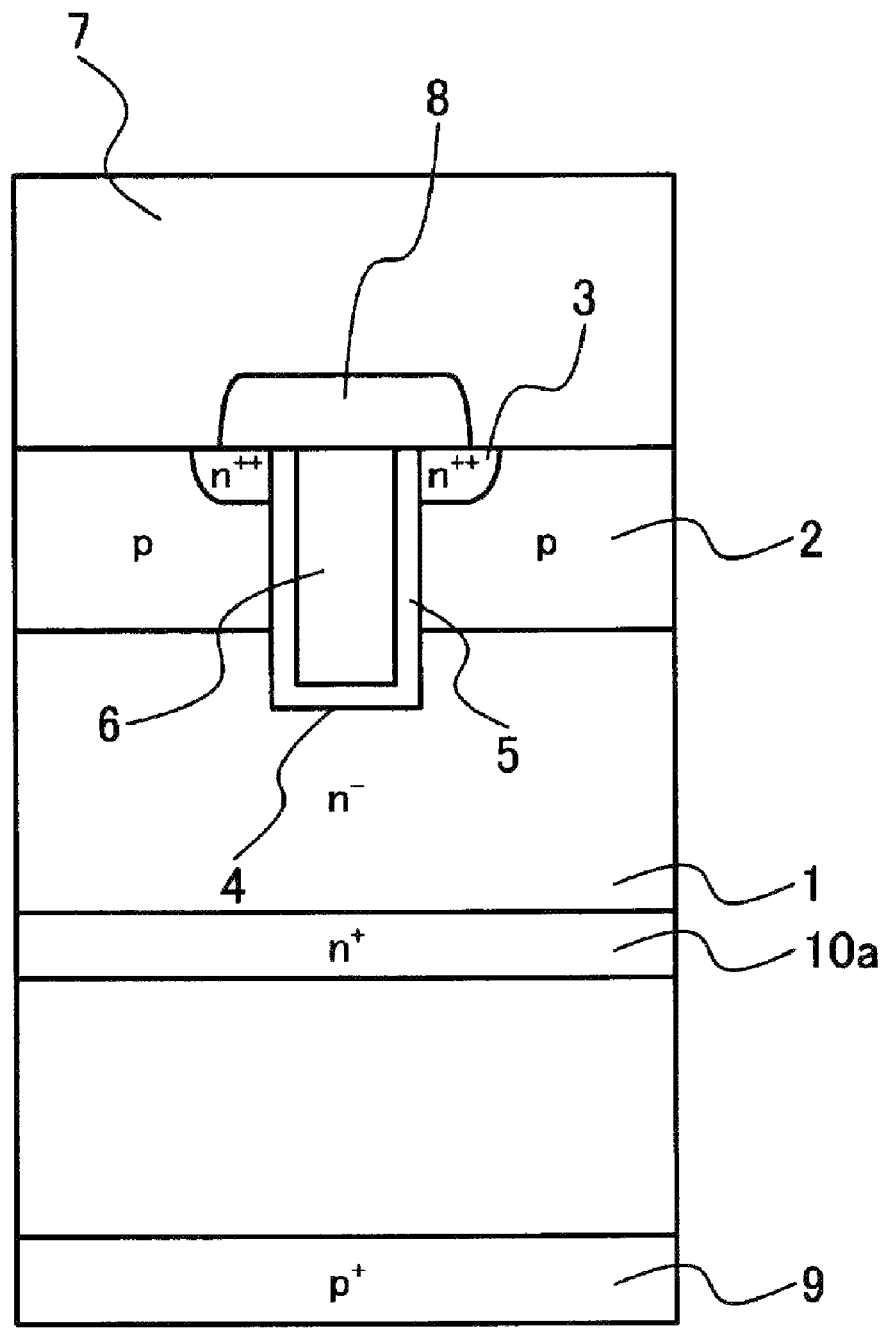
FIG. 49 is a cross-sectional view illustrating the semiconductor device according to Embodiment 5 which is being manufactured.

Then, as illustrated in FIG. 48, a first proton irradiation process is performed to introduce a proton 51 to a region that is deeper than the p+ collector layer 9 from the rear surface of the semiconductor substrate. Then, as illustrated in FIG. 49, a second annealing process (hereinafter, referred to as a first-stage second annealing process) is performed for the proton 51 introduced by the first proton irradiation process to form the n+ field stop layer 10a. The n+ field stop layer 10a is formed at a depth of, for example, 60 μm from the rear surface of the substrate. The acceleration energy of the first proton irradiation process may be, for example, 2.3 MeV and the dose of the proton 51 may be, for example, 1×10$^{14}$/cm$^2$. The first-stage second annealing process may be performed under the conditions of, for example, a temperature of 420° C. and 1 hour.

Figure 50:
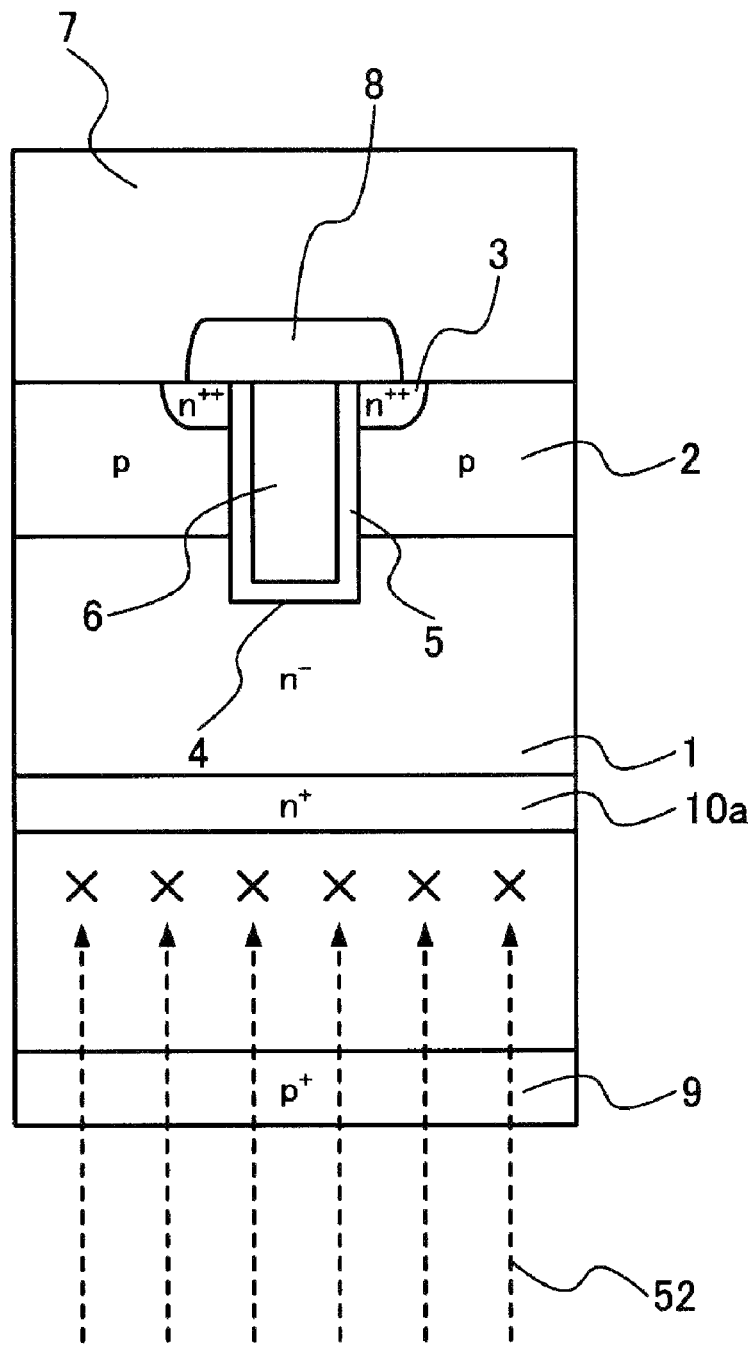
FIG. 50 is a cross-sectional view illustrating the semiconductor device according to Embodiment 5 which is being manufactured.
Figure 51:
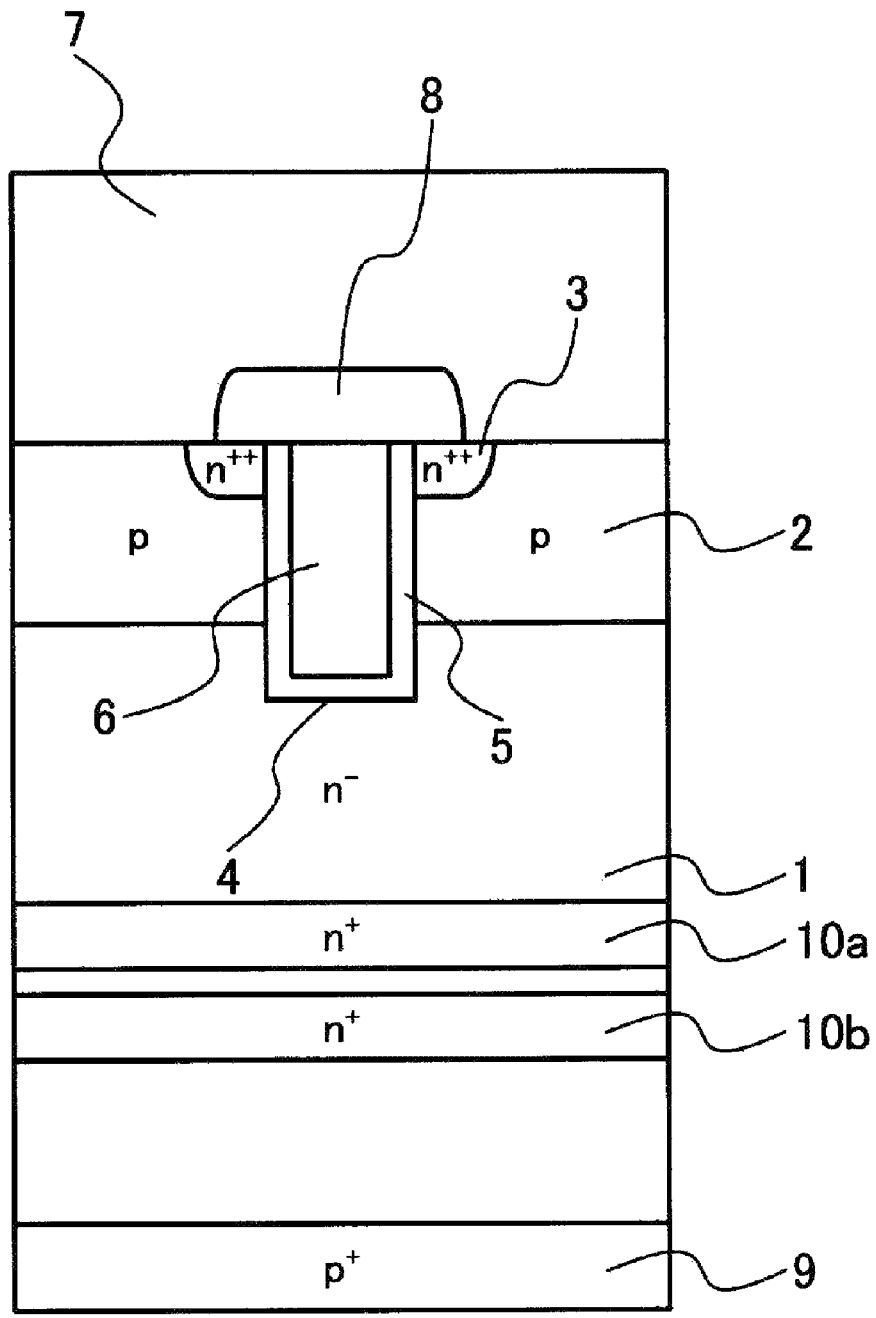
FIG. 51 is a cross-sectional view illustrating the semiconductor device according to Embodiment 5 which is being manufactured.

Then, as illustrated in FIG. 50, a second proton irradiation process is performed to introduce a proton 52 to a region that is deeper than the p+ collector layer 9 and is shallower than the n+ field stop layer 10a from the rear surface of the semiconductor substrate. Then, as illustrated in FIG. 51, the second annealing process (hereinafter, referred to as a second-stage second annealing process) is performed for the proton 52 introduced by the second proton irradiation process to form the n+ field stop layer 10b. The n+ field stop layer 10b is formed at a depth of, for example, 30 μm from the rear surface of the substrate. The acceleration energy of the second proton irradiation process may be, for example, 1.5 MeV and the dose of the proton 52 may be, for example, $1 \times 10^{15}/cm^2$. The second-stage second annealing process may be performed under the conditions of, for example, a temperature of 400° C. and 1 hour.

Figure 52:
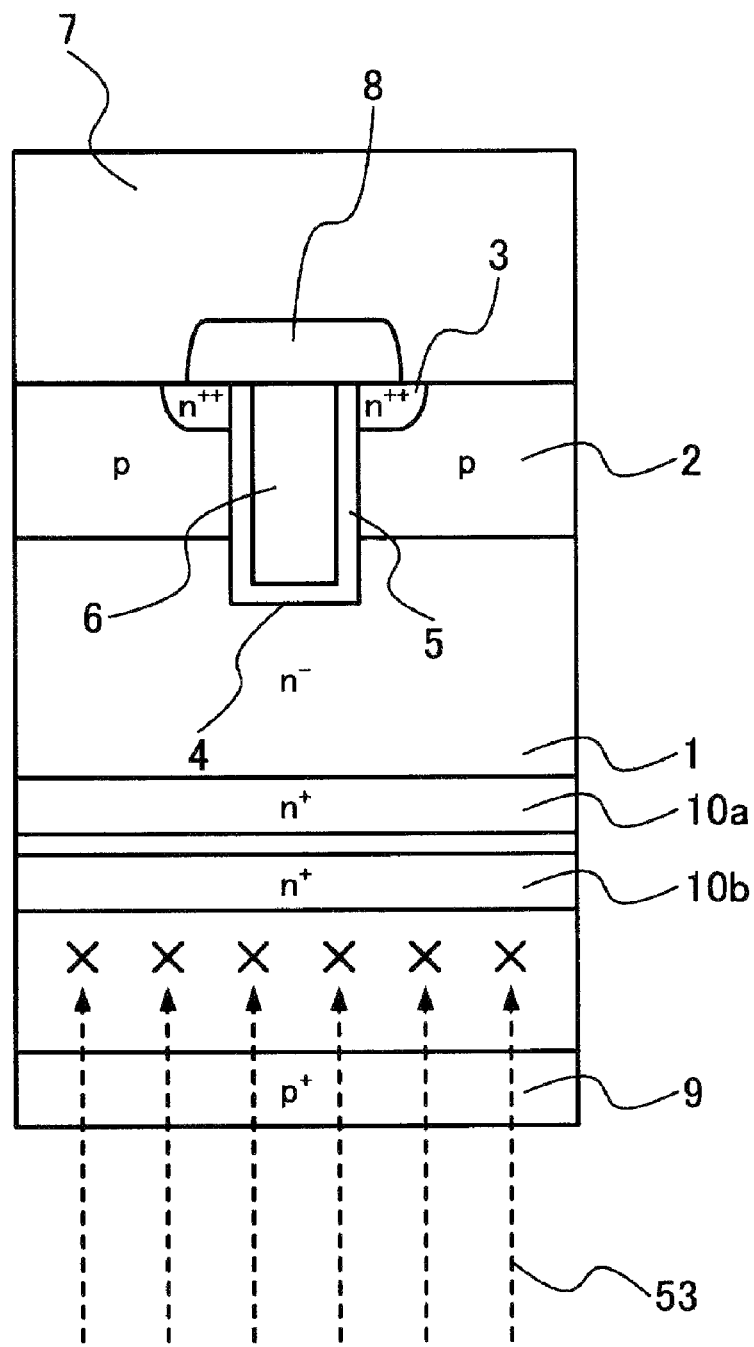
FIG. 52 is a cross-sectional view illustrating the semiconductor device according to Embodiment 5 which is being manufactured.

Then, as illustrated in FIG. 52, a third proton irradiation process is performed to introduce a proton 53 to a region that is deeper than the p+ collector layer 9 and is shallower than the n+ field stop layer 10b from the rear surface of the semiconductor substrate. Then, the second annealing process (hereinafter, referred to as a third-stage second annealing process) is performed for the proton 53 introduced by the third proton irradiation process to form the n+ field stop layer 10c, as illustrated in FIG. 45. The n+ field stop layer 10c is formed at a depth of, for example, 5 μm from the rear surface of the substrate. The acceleration energy of the third proton irradiation process may be, for example, 0.45 MeV and the dose of the proton 53 may be, for example, $5 \times 10^{15}/cm^2$. The third-stage second annealing process may be performed under the conditions of, for example, a temperature of 380° C. and 1 hour.

As such, it is preferable that the first to third proton irradiation processes be sequentially performed at the deep position from the rear surface of the substrate and the temperature of the first-stage to third-stage second annealing processes be reduced as the depth from the rear surface of the substrate is reduced. The temperature of the first-stage to third-stage second annealing processes may be in the range of 380° C. to 450° C. The first-stage to third-stage second annealing processes may be collectively performed after the third proton irradiation process. When the first-stage to third-stage second annealing processes are collectively performed, it is preferable that the temperature of the second annealing process be equal to the temperature of the first-stage second annealing process which is performed at the highest temperature. Then, similarly to Embodiment 1, a collector electrode 11 is formed on the rear surface of the semiconductor substrate. In this way, the trench gate IGBT illustrated in FIG. 45 is completed. As illustrated in FIG. 45, an n buffer layer 12 may be formed before the proton irradiation process (for example, when the p+ collector layer 9 is formed).

Figure 46A:
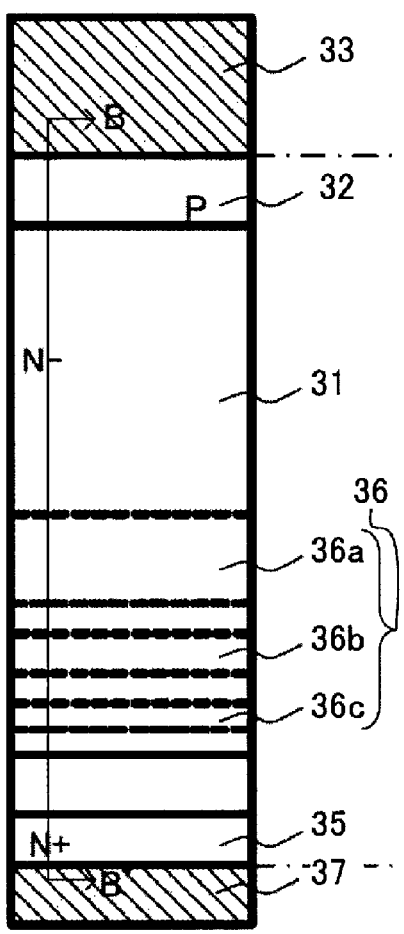
FIG. 46 is a cross-sectional view illustrating another example of the semiconductor device manufactured by the semiconductor device manufacturing method according to Embodiment 5.
Figure 46B:
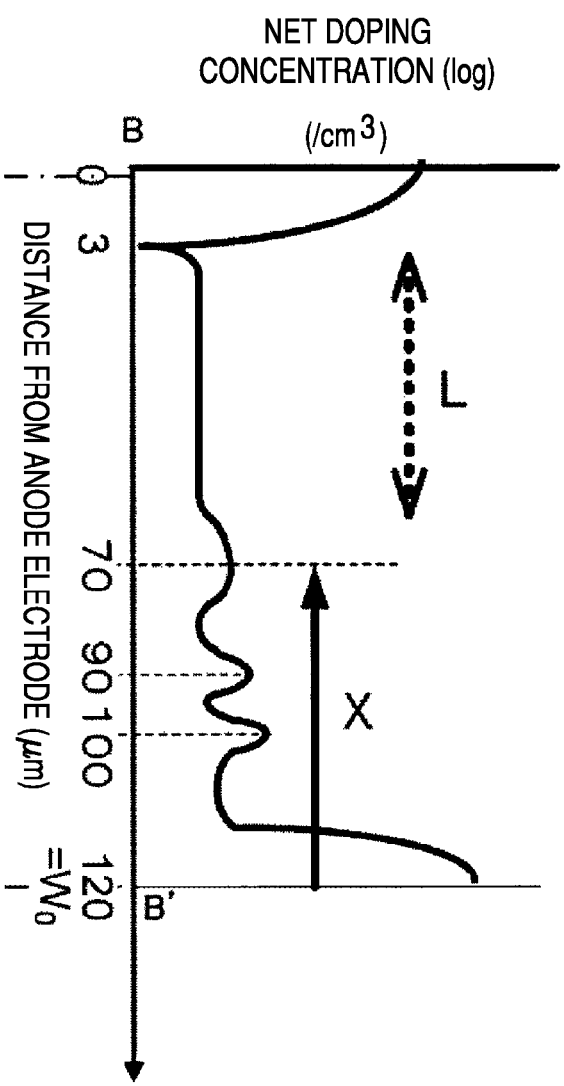

FIG. 46 illustrates another example of the semiconductor device manufactured by the semiconductor device manufacturing method according to Embodiment 5. FIG. 46 is a cross-sectional view illustrating another example of the semiconductor device manufactured by the semiconductor device manufacturing method according to Embodiment 5. Embodiment 5 may be applied to Embodiment 3 to manufacture a diode including a plurality of n+ field stop layers 36 (for example, n+ field stop layers 36a to 36c), as illustrated in FIG. 46. The structure and forming method of the n+ field stop layers 36a to 36c are the same as those of the n+ field stop layers 10a to 10c illustrated in FIG. 45. In another example of the semiconductor device according to Embodiment 5 illustrated in FIG. 46, structures other than the plurality of n+ field stop layers 36 are the same as those in Embodiment 3.

As described above, according to Embodiment 5, it is possible to obtain the same effect as that in Embodiment 1. In addition, according to Embodiment 5, it is possible to form a plurality of (three) field stop layers including hydrogen donors without a disorder.

(Example 2)

Figure 42:
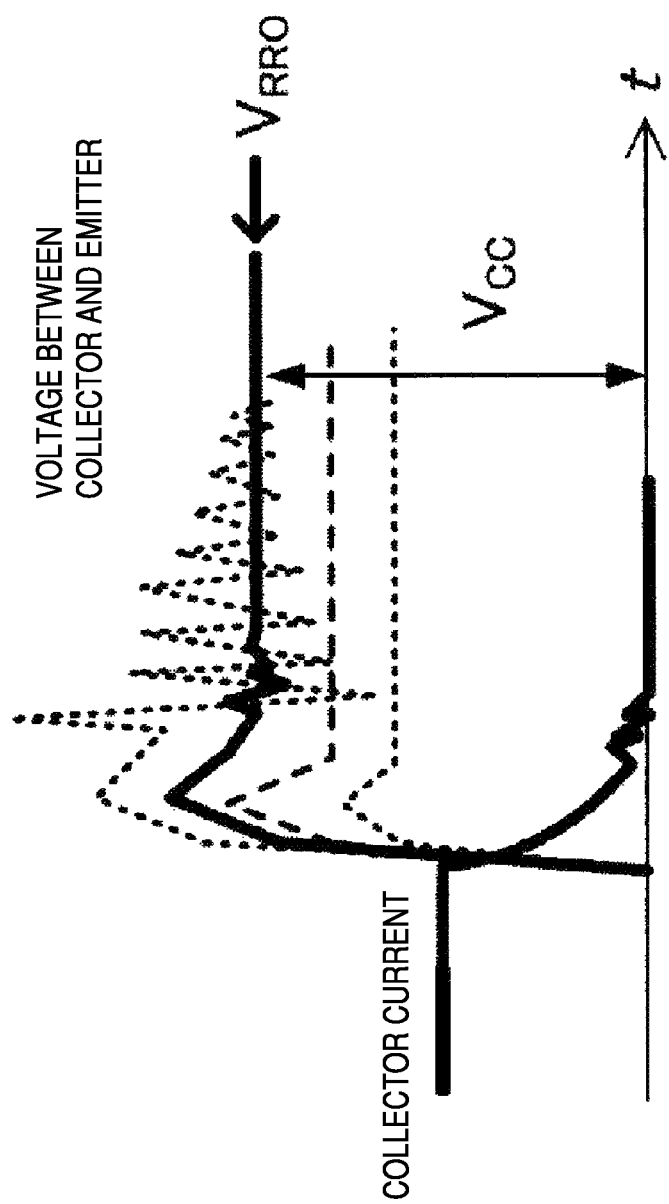
FIG. 42 is a characteristic diagram illustrating a turn-off oscillation waveform of a general IGBT.

Next, the preferred position of a proton peak in a first proton irradiation process among a plurality of proton irradiation processes in the semiconductor device manufacturing method according to the invention will be described as Example 2. FIG. 42 is a characteristic diagram illustrating the turn-off oscillation waveform of a general IGBT. When a collector current is equal to or less than a tenth of a rated current, oscillation is likely to occur before turn-off ends since the number of stored carriers is small. The collector current is fixed to a given value and the IGBT is turned off by a different power supply voltage $V_{CC}$. In this case, when the power supply voltage $V_{CC}$ is greater than a predetermined value, the voltage is greater than the peak value of a general overshoot voltage in a voltage waveform between the collector and the emitter and then an additional overshoot occurs. Then, the additional overshoot (voltage) triggers the oscillation of the subsequent waveform. When the power supply voltage $V_{CC}$ is greater than the predetermined value again, an addition overshoot voltage further increases and the amplitude of the subsequent oscillation increases. As such, a threshold voltage at which the voltage waveform starts to oscillate is referred to as an oscillation start threshold value $V_{RRO}$. As the oscillation start threshold value $V_{RRO}$ increases, the possibility of the IGBT oscillating when the IGBT is turned off is reduced, which is preferable.

The oscillation start threshold value $V_{RRO}$ depends on the position of a first proton peak (closest to a p base region) which a depletion layer (strictly, a space-charge region since there is a hole), which is spread from a pn junction between the p base region and an n− drift layer of the IGBT to an n− drift layer, reaches first. The reason is as follows. When the depletion layer is spread from the pn junction between the p base region and the n− drift layer to the n drift layer at the time the IGBT is turned off, the end of the depletion layer reaches the first field stop layer (closest to the p base region) and the spreading of the depletion layer is suppressed. Therefore, the sweep of the stored carriers is weakened. As a result, the depletion of carriers is suppressed and oscillation is suppressed.

When the IGBT is turned off, the depletion layer is spread in the depth direction from the pn junction between the p base region and the n− drift layer to the collector electrode. Therefore, the peak position of the field stop layer which the end of the depletion layer reaches first is the field stop layer which is closest to the pn junction between the p base region and the n drift layer. It is assumed that the thickness of an n semiconductor substrate (the thickness of a portion interposed between the emitter electrode and the collector electrode) is $W_0$ and the depth of the peak position of the field stop layer which the end of the depletion layer reaches first from the interface between the collector electrode and the rear surface of the n semiconductor substrate (hereinafter, referred to as a distance from the rear surface) is X. Here, a distance index L is introduced. The distance index L is represented by the following Expression (3).

$$L = \sqrt{\frac{\varepsilon_S V_{rate}}{q\left(\frac{J_F}{qv_{sat}} + N_d\right)}} \quad \text{[Equation 3]}$$

The distance index L represented by the above-mentioned Expression (3) is an index indicating the distance of the end of the depletion layer (exactly, a space-charge region) (depletion layer end), which is spread from the pn junction between the p base region and the n⁻ drift layer to the n⁻ drift layer 1, from the pn junction when a voltage $V_{CE}$ between the collector and the emitter that increases at the time the IGBT is turned off is equal to the power supply voltage $V_{CC}$. In a fraction in the square root, a denominator indicates the space-charge density of the space-charge region (depletion layer) when the IGBT is turned off. The known Poisson's equation is represented by divE=ρ/ϵ (where E is electric field intensity, ρ is space-charge density, and ρ=q(p−n+$N_d$−$N_a$) is established). In addition, q is an elementary charge, p is hole concentration, n is electron concentration, $N_d$ is donor concentration, $N_a$ is acceptor concentration, and $\epsilon_S$ is the permittivity of a semiconductor. In particular, the donor concentration $N_d$ is average concentration obtained by integrating the n drift layer in the depth direction and dividing the integrated value by the length of the integration section.

The space-charge density ρ is described by the hole concentration p in the space-charge region (depletion layer) when the IGBT is turned off and the average donor concentration $N_d$ of the n⁻ drift layer. The space-charge density ρ can be represented by ρ≈q(p+$N_d$) since the electron concentration is negligibly less than the space-charge density ρ and there is no acceptor. In this case, the hole concentration p is determined by a breaking current of the IGBT. In particular, the hole concentration p is represented by p=$J_F$/(q$v_{sat}$) since a situation in which the rated current density of the element flows is assumed (where $J_F$ is the rated current density of the element and $v_{sat}$ is a saturated speed at which the speed of carriers is saturated with predetermined electric field intensity).

The Poisson's equation is integrated with respect to the distance x two times and a voltage V satisfies E=−gradV (the relationship between a known electric field E and the voltage V). Therefore, when boundary conditions are appropriate, V=(1/2)(ρ/ϵ)$x^2$ is established. The length x of the space-charge region when the voltage V is half of the rated voltage $V_{rate}$ is the distance index L. The reason is that, in the actual device, such as an inverter, an operating voltage (power supply voltage $V_{CC}$), which is the voltage V, is about half of the rated voltage V. When the doping concentration of the field stop layer is higher than that of the n⁻ drift layer, the field stop layer has a function of making it difficult for the space-charge region to be spread when the IGBT is turned off. In a case in which the collector current of the IGBT starts to be reduced from the breaking current due to the turn-on of a MOS gate, when the peak position of the field stop layer which the depletion layer reaches first is in the range of the length of the space-charge region, it is possible to suppress the spreading of the space-charge region, with the stored carriers remaining in the n⁻ drift layer. Therefore, the sweep of the remaining carriers is suppressed.

For example, in the actual turn-off operation, when an IGBT module is driven by a known PWM inverter, in many cases, the power supply voltage $V_{CC}$ or the breaking current is not fixed, but is variable. Therefore, in this case, the preferred peak position of the field stop layer which the depletion layer reaches first needs to have a certain width. The inventors' examination result proved that the distance X of the peak position of the field stop layer which the depletion layer reached first from the rear surface was as illustrated in FIG. 44. FIG. 44 is a table illustrating the position conditions of the field stop layer which the depletion layer reaches first in the semiconductor device according to the invention. FIG. 44 illustrates the distance X of the peak position of the field stop layer which the end of the depletion layer reaches first from the rear surface at a rated voltage $V_{rate}$ of 600 V to 6500 V. Here, X=W0−γL is established (γ is a coefficient). FIG. 44 illustrates the distance X when the coefficient γ is changed from, for example, 0.7 to 1.6.

As illustrated in FIG. 44, the safe design is made at each rated voltage such that the element (IGBT) has a breakdown voltage that is about 10 percent higher than the rated voltage. As illustrated in FIG. 44, the total thickness of the n semiconductor substrate (the thickness of the n semiconductor substrate during a finishing process after the semiconductor substrate is thinned by, for example, grinding) and the average specific resistance of the n⁻ drift layer 1 are set such that an on-voltage or turn-off loss is sufficiently reduced. The term "average" means the average concentration and specific resistance of the entire n⁻ drift layer 1 including the field stop layer. As illustrated in FIG. 44, the rated current density $J_F$ has a typical value, depending on the rated voltage. The rated current density $J_F$ is set such that energy density which is determined by the product of the rated voltage and the rated current density $J_F$ is substantially constant and substantially has the value illustrated in FIG. 44. When the distance index L is calculated by the above-mentioned Expression (3) on the basis of these values, the value illustrated in FIG. 44 is obtained. The distance X of the peak position of the field stop layer which the end of the depletion layer reaches first from the rear surface is obtained by subtracting the value of γ, which is in the range of 0.7 to 1.6 with respect to the distance index L, from the thickness $W_0$ of the n semiconductor substrate.

Figure 41:
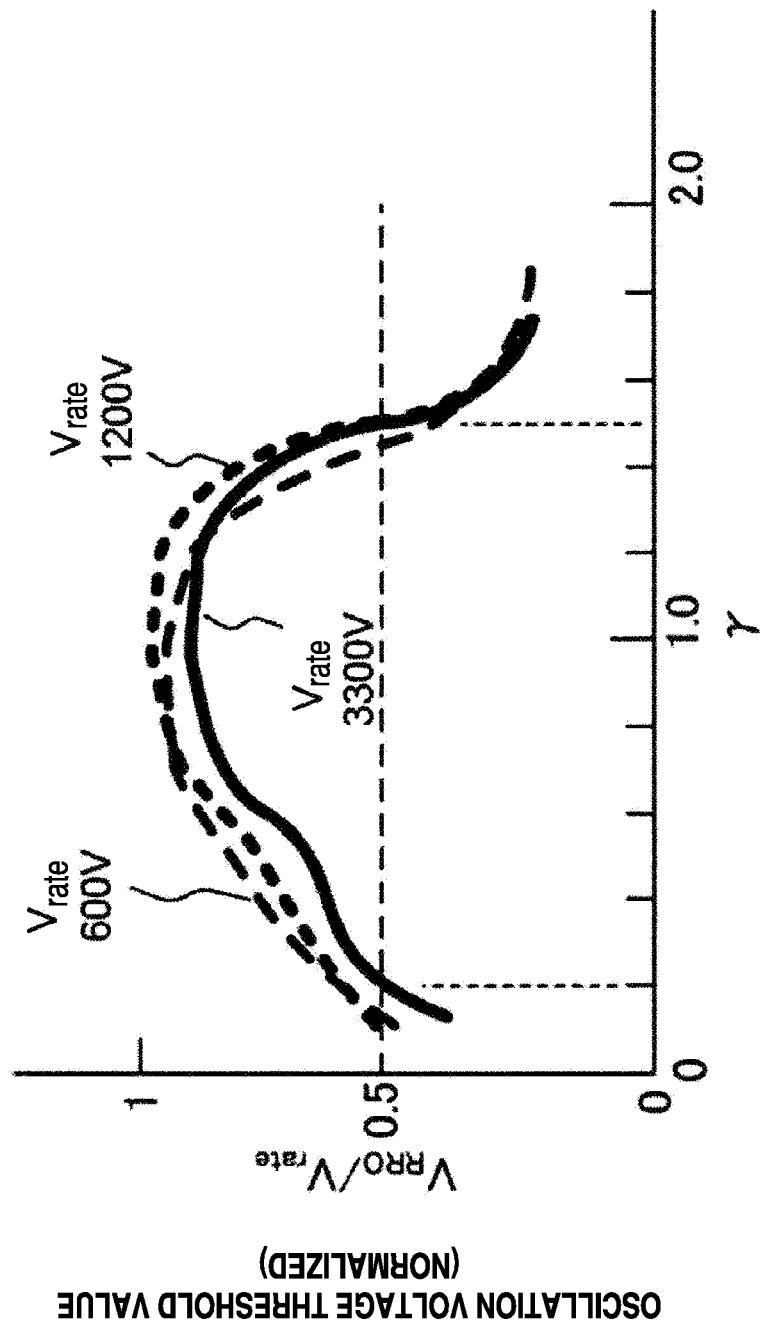
FIG. 41 is a characteristic diagram illustrating a threshold voltage at which a voltage waveform starts to oscillate.

The coefficient γ for determining the distance X of the peak position of the field stop layer which the end of the depletion layer reaches first from the rear surface, at which turn-off oscillation is sufficiently suppressed, with respect to the distance index L and the thickness $W_0$ of the n semiconductor substrate, is as follows. FIG. 41 is a characteristic diagram illustrating a threshold voltage at which the voltage waveform starts to oscillate. FIG. 41 illustrates the dependence of the oscillation start threshold value $V_{RRO}$ on γ at some typical rated voltages $V_{rate}$ (600 V, 1200 V, and 3300 V). Here, the vertical axis indicates a value obtained by normalizing the oscillation start threshold value $V_{RRO}$ with the rated voltage $V_{rate}$. As can be seen from FIG. 41, it is possible to rapidly increase the oscillation start threshold value $V_{RRO}$ together with three rated voltages $V_{rate}$ at γ of 1.6 or less.

As described above, in the actual device, such as an inverter, the operating voltage (power supply voltage $V_{CC}$) which is the voltage V is about half of the rated voltage $V_{rate}$. Therefore, when the power supply voltage $V_{CC}$ is half of the rated voltage $V_{rate}$, at least the turn-off oscillation of the IGBT should not occur. That is, the value of $V_{RRO}/V_{rate}$ needs to be equal to or greater than 0.5. As illustrated in FIG. 41, when γ is equal to or greater than 0.2 and equal to or less than 1.5, the value of $V_{RRO}/V_{rate}$ is equal to or greater than 0.5. Therefore, it is preferable that γ be at least in the range of 0.2 to 1.5.

At a voltage between 600 V and 1200 V (for example, 800 V or 1000 V), a voltage between 1200 V and 3300 V (for example, 1400 V, 1700 V, or 2500 V), and a voltage equal to or higher than 3300 V (for example, 4500 V or 6500 V) which are not illustrated, the value does not greatly deviate from three curves illustrated in FIG. 41 and has the same dependence as the three curves (the oscillation start threshold value $V_{RRO}$ with respect to γ). As can be seen from FIG.

41, there is a region in which the oscillation start threshold value $V_{RRO}$ can be sufficiently increased at any rated voltage $V_{rate}$ when γ is in the range of 0.7 to 1.4.

When γ is less than 0.7, the oscillation start threshold value $V_{RRO}$ is about equal to or higher than 80% of the rated voltage $V_{rate}$, but the avalanche breakdown voltage of the element is likely to be lower than the rated voltage $V_{rate}$ since the field stop layer is close to the p base region. Therefore, it is preferable that γ be equal to or greater than 0.7. When γ is greater than 1.4, the oscillation start threshold value $V_{RRO}$ is rapidly reduced from about 70% of the rated voltage $V_{rate}$ and turn-off oscillation is likely to occur. Therefore, it is preferable that γ be equal to or less than 1.4. In addition, γ is more preferably in the range of 0.8 to 1.3 and most preferably, in the range of 0.9 to 1.2. In this case, it is possible to maximize the oscillation start threshold value $V_{RRO}$ while increasing the avalanche breakdown voltage of the element to be sufficiently higher than the rated voltage $V_{rate}$.

The important point in the effect of the invention illustrated in FIG. 41 is that the range of γ which can sufficiently increase the oscillation start threshold value $V_{RRO}$ is substantially the same (for example, 0.7 to 1.4) at any rated voltage $V_{rate}$. The reason is as follows: it is most effective to set the range of the distance X of the peak position of the field stop layer which the depletion layer reaches first from the rear surface to be substantially centered on $W_0$–L (γ=1). It is most effective to include γ=1.0 since power density (the product of the rated voltage $V_{rate}$ and the rated current density $J_F$) is substantially constant (for example, $1.8\times10^5$ VA/cm$^2$ to $2.6\times10^5$ VA/cm$^2$). That is, when the voltage of the element is equivalent to the rated voltage $V_{rate}$ during switching, such as turn-off, the distance (depth) of the end of the space-charge region is equal to about the distance index L represented by the above-mentioned Expression (3). When the peak position of the field stop layer which is disposed at the deepest position from the rear surface is aligned with the position of the distance index L (that is, γ is about 1.0), it is possible to suppress oscillation during switching. Since power density is substantially constant, the distance index L is proportional to the rated voltage $V_{rate}$. Therefore, in the range which has γ=1.0 substantially as the center, it is possible to sufficiently increase the oscillation start threshold value $V_{RRO}$ at any rated voltage $V_{rate}$ and to maximize the oscillation inhibitory effect during switching.

As described above, when the distance X of the peak position of the field stop layer which the end of the depletion layer reaches first from the rear surface is set in the above-mentioned range, the stored carriers can sufficiently remain in the IGBT when the IGBT is turned off and it is possible to suppress an oscillation phenomenon when the IGBT is turned off. Therefore, for the distance X of the peak position of the field stop layer which the end of the depletion layer reaches first from the rear surface, the coefficient γ of the distance index L may be in the above-mentioned range at any rated voltage $V_{rate}$. In this case, it is possible to effectively suppress the oscillation phenomenon when the IGBT is turned off.

As can be seen from FIG. 44, as described above, when the depth of the first (first-stage) field stop layer, which is disposed at the deepest position from the rear surface, from the rear surface is set such that γ is about 1 at a rated voltage $V_{rate}$ of 600 V or more, the distance index L is greater than 20 μm at any rated voltage $V_{rate}$. That is, the range Rp of protons for forming the first proton peak, which is disposed at the deepest position from the rear surface of the substrate, from the rear surface of the substrate is greater than 15 μm, particularly, equal to or deeper than 20 μm from the rear surface of the substrate in order to maximize the oscillation inhibitory effect.

(Example 3)

Figure 43:
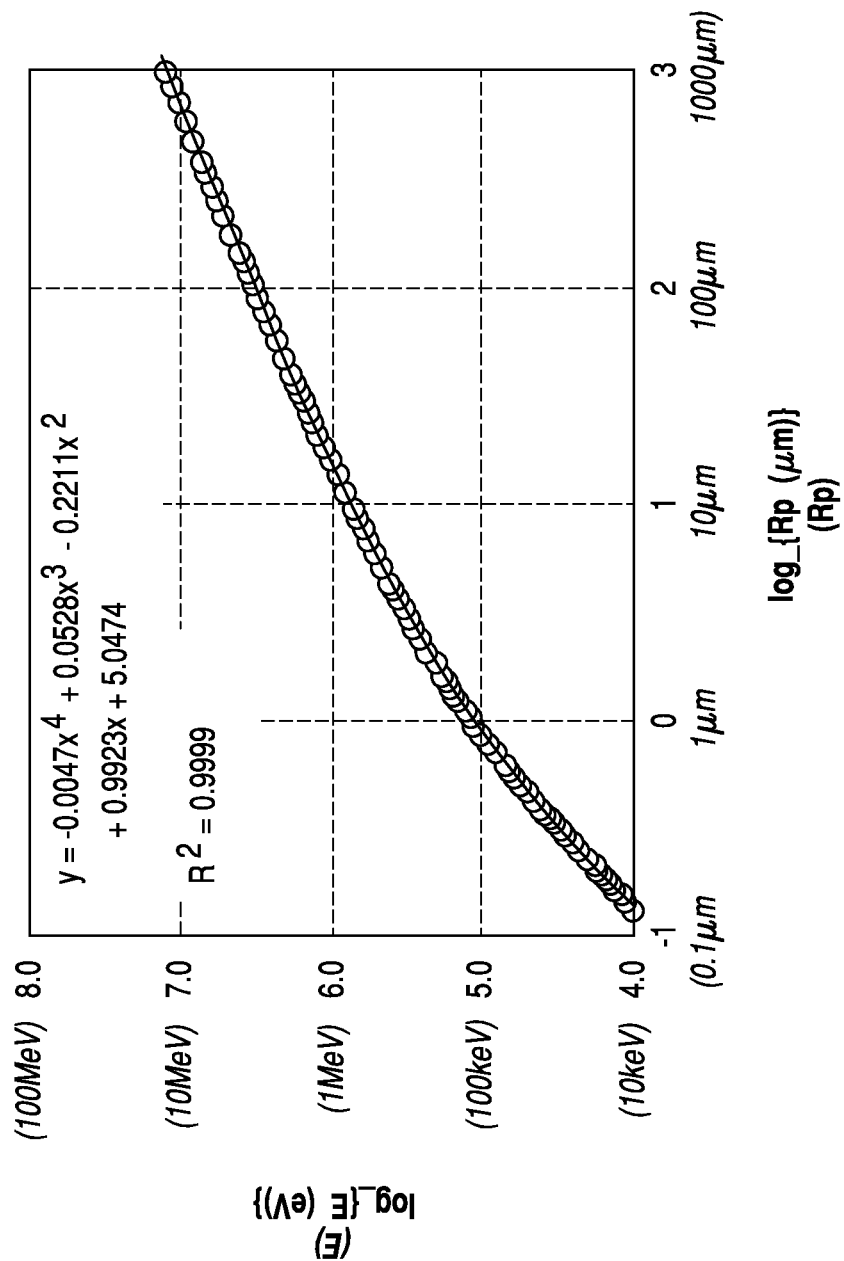
FIG. 43 is a characteristic diagram illustrating between the average range of a proton and the acceleration energy of the proton in the semiconductor device according to the invention.

Next, the acceleration energy of a proton in the semiconductor device manufacturing method according to the invention will be described as Example 3. The acceleration energy of the proton may be determined from the characteristic diagram illustrated in FIG. 43, which will be described below, in order to actually form the field stop layer using proton irradiation such that the peak position of the field stop layer which a depletion layer reaches first has a distance X from the rear surface of a substrate and the above-mentioned range of γ is satisfied. FIG. 43 is the characteristic diagram illustrating the relationship between the average range of the proton and the acceleration energy of the proton in the semiconductor device according to the invention.

The inventors' examination result proved that, when the logarithm log(Rp) of the average range Rp of the proton (the peak position of the field stop layer) was x and the logarithm log(E) of the acceleration energy E of the proton was y, the average range Rp of the proton and the acceleration energy E of the proton satisfied the relationship represented by the following Expression (4).

$$y = -0.0047x^4 + 0.0528x^3 - 0.2211x^2 + 0.9923x + 5.0474 \quad [\text{Expression (4)}]$$

FIG. 43 is the characteristic diagram illustrating the above-mentioned Expression (4) and illustrates the acceleration energy of the proton for obtaining the desired average range Rp of the proton. In FIG. 43, the horizontal axis indicates the logarithm log(Rp) of the average range Rp of the proton and a corresponding average range Rp (μm) is described in parentheses below the axis value of log(Rp). In addition, the vertical axis indicates the logarithm log(E) of the acceleration energy E of the proton and the corresponding acceleration energy E of the proton is described in parentheses on the left side of the axis value of log(E). The above-mentioned Expression (4) is obtained by fitting the logarithm log(Rp) of the average range Rp of the proton and the logarithm log(E) of the acceleration energy of the proton, which are obtained by, for example, experiments, to the quartic of x (=log(Rp)).

When the acceleration energy E of proton irradiation is calculated (hereinafter, referred to as a calculated value E) from the desired average range Rp of the proton by the above-mentioned fitting expression and the proton is implemented into a silicon substrate with the calculated value E of the acceleration energy, the relationship between the actual acceleration energy E' and the average range Rp' (proton peak position) which is actually obtained by a spreading resistance (SR) profiling method may be considered as follows.

When the actual acceleration energy E' is in the range of about E±10% with respect to the calculated value E of the acceleration energy, the actual average range Rp' is in the range of about ±10% of the desired average range Rp, which is in a measurement error range. Therefore, the influence of the deviation of the actual average range Rp' from the desired average range Rp on the electrical characteristics of a diode or an IGBT is small enough to be negligible. When the actual acceleration energy E' is in the range of ±10% of the calculated value E, the actual average range Rp' can be determined to be substantially equal to the set average range Rp. Alternatively, the actual average range Rp' may be in the range of ±10% of the average range Rp which is calculated by substituting the actual acceleration energy E' into the above-mentioned Expression (4).

In the actual accelerator, since both the acceleration energy E and the average range Rp are within the above-mentioned ranges (±10%), it is considered that the actual acceleration energy E' and the actual average range Rp' follow the fitting expression illustrated in the above-mentioned Expression (4) which is represented by the desired average range Rp and the calculated value E and no problem occurs. In addition, the range of a variation or an error may be in the range of ±10% of the average range Rp. It is preferable that the range of the variation or the error be in the range of ±5% of the average range Rp. In this case, it can be considered that the actual acceleration energy E' and the actual average range Rp' perfectly follow the above-mentioned Expression (4).

The use of the above-mentioned Expression (4) makes it possible to calculate the acceleration energy E of the proton required to obtain the desired average range Rp of the proton. When the above-mentioned Expression (4) is used, the acceleration energy E of each proton for forming the field stop layer is substantially equal to a measured value obtained by actually measuring a sample, which is irradiated with protons with the acceleration energy E', using the spreading resistance (SR) profiling method. Therefore, the use of the above-mentioned Expression (4) makes it possible to estimate the required acceleration energy E of the proton with high accuracy on the basis of the average range Rp of the proton.

(Embodiment 6)

A semiconductor device manufacturing method according to Embodiment 6 differs from the semiconductor device manufacturing method according to Embodiment 1 in that a laser annealing process 61 is performed as the first annealing process which is performed after the first ion implantation process for implanting p-type impurity ions 21, such as boron ions, in order to form the $p^+$ collector layer 9 in the rear surface of the substrate. An $n^+$ field stop layer 10 may be provided by one proton irradiation process as in Embodiment 1 or a plurality of $n^+$ field stop layers 10 may be provided by a plurality of proton irradiation processes as in Embodiment 5.

Figure 53:
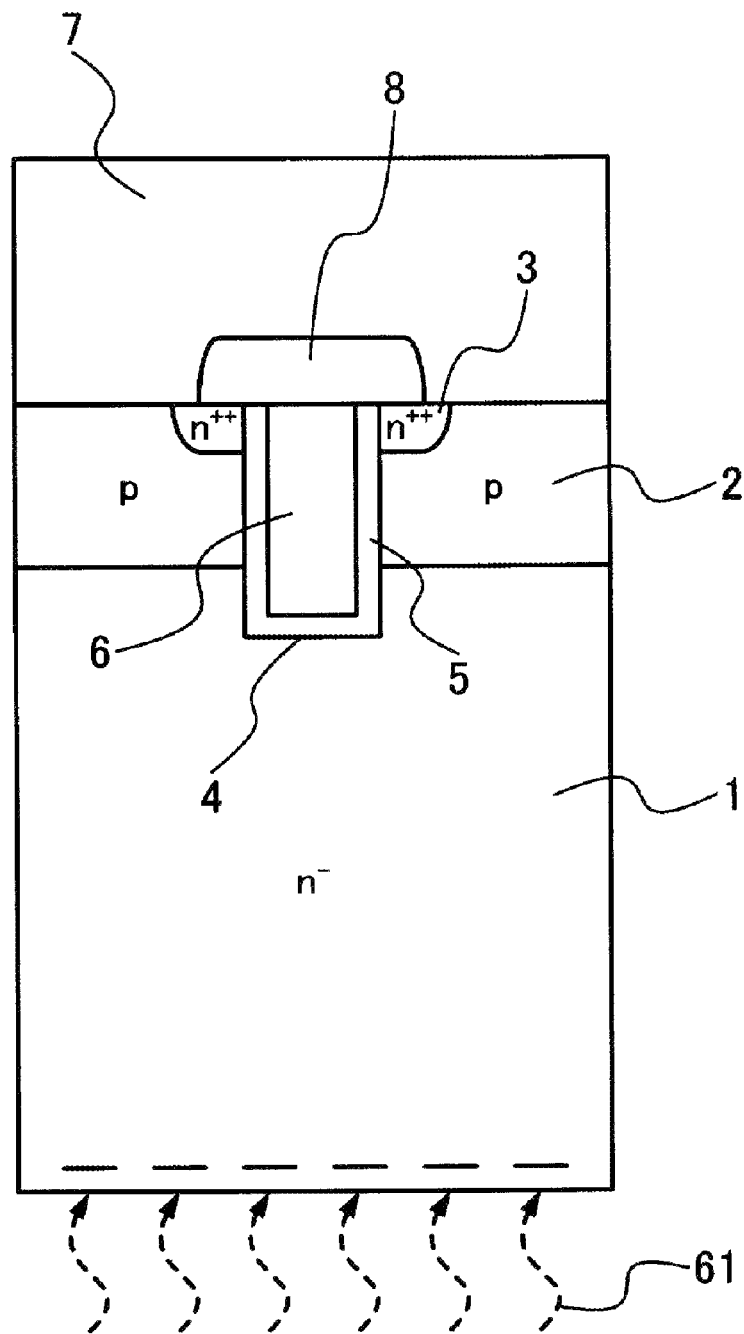
FIG. 53 is a cross-sectional view illustrating a semiconductor device according to Embodiment 6 which is being manufactured.

The semiconductor device manufacturing method according to Embodiment 6 will be described with reference to FIG. 1, FIGS. 3 to 8, and FIG. 53. FIG. 53 is a cross-sectional view illustrating a semiconductor device according to Embodiment 6 which is being manufactured. First, as illustrated in FIGS. 3 to 5, similarly to Embodiment 1, a semiconductor substrate which will be an $n^-$ drift layer 1 is prepared and a trench-gate-type MOS gate structure and an emitter electrode 7 are formed on a front surface of the semiconductor substrate. Then, as illustrated in FIG. 5, similarly to Embodiment 1, a rear surface of the semiconductor substrate is ground and the semiconductor substrate is cleaned to remove adhesive materials. Then, the p-type impurity ions 21 are implanted into the ground rear surface of the semiconductor substrate.

Then, as illustrated in FIG. 53, the laser annealing process 61 is performed as a first annealing process to form a $p^+$ collector layer 9 in a surface layer of the rear surface of the semiconductor substrate, as illustrated in FIG. 6. Then, as illustrated in FIGS. 7 and 8, similarly to Embodiment 1, a proton 22 is radiated to a region that is deeper from the $p^+$ collector layer 9 from the rear surface of the semiconductor substrate and a furnace annealing process is performed as a second annealing process to form an $n^+$ field stop layer 10. Then, similarly to Embodiment 1, a collector electrode 11 is formed on the rear surface of the semiconductor substrate. In this way, the trench gate IGBT illustrated in FIG. 1 is completed.

When a semiconductor device including a plurality of $n^+$ field stop layers 10 illustrated in FIG. 45 is manufactured, the laser annealing process 61 may be performed as the first annealing process (FIGS. 53 and 6) to form the $p^+$ collector layer 9 in the surface layer of the rear surface of the semiconductor substrate and then a plurality of proton irradiation processes and the second annealing process may be performed (FIGS. 48 to 52).

In addition, Embodiment 3 may be applied to Embodiment 6 to manufacture the diode illustrated in FIG. 13 or a diode including a plurality of $n^+$ field stop layers 36 (for example, $n^+$ field stop layers 36a to 36c) as illustrated in FIG. 46. In this case, in the semiconductor device manufacturing method according to Embodiment 6, a laser annealing process may be performed as the first annealing process for forming the $n^+$ cathode layer 35 in the semiconductor device manufacturing method according to Embodiment 3.

As described above, according to Embodiment 6, it is possible to obtain the same effect as that in Embodiment 1. According to Embodiment 6, since the $n^+$ field stop layer is formed after the laser annealing process for forming the $p^+$ collector layer, the $n^+$ field stop layer is not affected by the laser annealing process for forming the $p^+$ collector layer. In particular, when a plurality of $n^+$ field stop layers are formed, the hydrogen donor concentration of the third (with an average range Rp of, for example, 5 μm) $n^+$ field stop layer which is formed at the position close to the $p^+$ collector layer is not reduced by the laser annealing process. Therefore, it is possible to maintain the concentration of the $n^+$ field stop layer at a high level. As a result, it is possible to prevent the disappearance of the $n^+$ field stop layer.

The invention is not limited to the above-described embodiments. The invention can be applied to various semiconductor devices in which the field stop layer can be provided. For example, in Embodiments 1 and 2, the trench gate IGBT is given as an example. However, the invention may be applied to a planar gate IGBT. In Embodiments 2 and 4, the input electrode (the emitter electrode or the anode electrode) is formed after the second annealing process. However, the input electrode may be formed after the first annealing process. In this case, the same effect as that in Embodiment 2 is obtained. In each of the above-described embodiments, a method for introducing impurities to form the semiconductor layers (the collector layer and the cathode layer) which come into contact with the output electrode is not limited to the ion implantation method, but various other methods may be used. In each of the above-described embodiments, the first conductivity type is an n type and the second conductivity type is a p type. However, in the invention, the first conductivity type may be the p type and the second conductivity type may be the n type. In this case, the same effect as described above is obtained.

As described above, the semiconductor device manufacturing method according to the invention is useful for a semiconductor device that is used in a power conversion device, such as a converter or an inverter.

The invention claimed is:

1. A method for manufacturing a semiconductor device including a first electrode that is provided on a front surface of a semiconductor substrate of a first conductivity type and a second electrode that is provided on a rear surface of the semiconductor substrate, the method comprising, in the order recited:

thinning the semiconductor substrate by grinding or etching to uniformly reduce the thickness thereof;

introducing impurities other than protons into the rear surface of the semiconductor substrate;

activating the impurities introduced into the rear surface of the semiconductor substrate using a first annealing process to form a first semiconductor layer, which is a contact portion in contact with the second electrode, in a surface layer of the rear surface of the semiconductor substrate;

radiating protons to the rear surface of the semiconductor substrate with an acceleration energy having a range Rp that extends only within the semiconductor substrate a plurality of times; and activating the protons radiated to the rear surface of the semiconductor substrate using a second annealing process to form a second semiconductor layer of the first conductivity type, which has a plurality of peak impurity concentrations that correspond to the range Rp and which has higher impurity concentrations than the semiconductor substrate, in a region that is deeper than the first semiconductor layer from the rear surface of the semiconductor substrate, wherein the impurity concentrations of the plurality of peak impurity concentrations are not reduced by the first annealing process.

2. The method for manufacturing a semiconductor device according to claim 1, wherein radiating protons is performed three or more times after the first annealing process, and the second annealing process is performed whenever radiating protons is performed, or the second annealing process is performed once after the last radiating protons.

3. The method for manufacturing a semiconductor device according to claim 1, wherein the second electrode is an output electrode which is formed to contact the first semiconductor layer, and wherein the second annealing process is performed before forming the output electrode, or the second annealing process and forming the output electrode are performed at the same time.

4. The method for manufacturing a semiconductor device according to claim 1, wherein the first annealing process is performed at a higher annealing temperature than the second annealing process.

5. The method for manufacturing a semiconductor device according to claim 4, wherein the second annealing process is conducted at a temperature that is equal to or higher than 380° C. and equal to or lower than 450° C.

6. The method for manufacturing a semiconductor device according to claim 1, wherein, during introducing impurities, the impurities are introduced with a dose sufficient to obtain an ohmic contact between the second electrode and the first semiconductor layer.

7. The method for manufacturing a semiconductor device according to claim 1, further comprising forming the first electrode on the front surface of the semiconductor substrate after the first annealing process.

8. The method for manufacturing a semiconductor device according to claim 1, wherein the first annealing process is a laser annealing step.

9. The method for manufacturing a semiconductor device according to claim 1, wherein the second semiconductor layer is a field stop layer which suppresses the spreading of a depletion layer.

10. The method for manufacturing a semiconductor device according to claim 1, wherein the semiconductor device is an insulated gate bipolar transistor (IGBT), the first semiconductor layer is a collector layer of a second conductivity type, and the second electrode is a collector electrode.

11. The method for manufacturing a semiconductor device according to claim 1, wherein the semiconductor device is a diode, the first semiconductor layer is a cathode layer of the first conductivity type, and the second electrode is a cathode electrode.

12. The method for manufacturing a semiconductor device according to claim 1, wherein the protons have a range from the rear surface of the semiconductor substrate that is equal to or greater than 15 μm.

13. The method for manufacturing a semiconductor device according to claim 1, wherein, during radiating protons, acceleration energy E of the protons having a range Rp a plurality of times satisfies Expression (2) as follows:

$$y=-0.0047x^4+0.0528x^3-0.2211x^2+0.9923x+5.0474, \quad \text{Expression (2)}$$

where x is a logarithm log(Rp) of the range Rp and y is a logarithm log(E) of the acceleration energy E.

14. The method for manufacturing a semiconductor device according to claim 1, wherein the second electrode is formed on the rear surface of the semiconductor substrate after the second annealing process.

15. The method for manufacturing a semiconductor device according to claim 1, wherein the first electrode is an input electrode and the second electrode is an output electrode.

16. A method for manufacturing a semiconductor device including a first electrode that is provided on a front surface of a semiconductor substrate of a first conductivity type and a second electrode that is provided on a rear surface of the semiconductor substrate, the method comprising:

introducing impurities into the rear surface of the semiconductor substrate;

activating the impurities introduced into the rear surface of the semiconductor substrate using a first annealing process to form a first semiconductor layer, which is a contact portion in contact with the second electrode, in a surface layer of the rear surface of the semiconductor substrate;

radiating protons to the rear surface of the semiconductor substrate after the first annealing process; and activating the protons radiated to the rear surface of the semiconductor substrate using a second annealing process to form a second semiconductor layer of the first conductivity type, which has a higher impurity concentration than the semiconductor substrate, in a region that is deeper than the first semiconductor layer from the rear surface of the semiconductor substrate, wherein the semiconductor substrate is provided as a drift layer of the first conductivity type, wherein a third semiconductor layer of a second conductivity type is formed in the front surface of the semiconductor substrate, wherein a distance index L is represented by the following Expression (1):

$$L = \sqrt{\frac{\varepsilon_S V_{rate}}{q\left(\frac{J_F}{qv_{sat}} + N_d\right)}}, \qquad (1)$$

when q is an elementary charge, $N_d$ is average concentration of the drift layer, $\varepsilon_S$ is permittivity of the semiconductor substrate, $V_{rate}$ is a rated voltage, $J_F$ is a rated current density, and $v_{sat}$ is a saturated speed at which a speed of carriers is saturated with predetermined electric field intensity, and wherein a position where the carrier concentration of the second semiconductor layer closest to the third semiconductor layer is a peak concentration from the rear surface of the semiconductor substrate is set such that $X=W_0-\gamma L$ is established, where X is depth of said position, $W_0$ is thickness of the semiconductor substrate, and $\gamma$ is equal to or greater than 0.2 and equal to or less than 1.5.

17. The method for manufacturing a semiconductor device according to claim 16, wherein $\gamma$ is equal to or greater than 0.9 and equal to or less than 1.4.

18. The method for manufacturing a semiconductor device according to claim 16, wherein $\gamma$ is equal to or greater than 1.0 and equal to or less than 1.3.

19. The method for manufacturing a semiconductor device according to claim 16, wherein the first electrode is an input electrode and the second electrode is an output electrode.

20. The method for manufacturing a semiconductor device according to claim 16, wherein the semiconductor device is an insulated gate bipolar transistor (IGBT), the first semiconductor layer is a collector layer of a second conductivity type, and the second electrode is a collector electrode.

21. A method for manufacturing a semiconductor device including a first electrode that is provided on a front surface of a semiconductor substrate of a first conductivity type and a second electrode that is provided on a rear surface of the semiconductor substrate, the method comprising:

introducing impurities into the rear surface of the semiconductor substrate;

activating the impurities introduced into the rear surface of the semiconductor substrate using a first annealing process to form a first semiconductor layer, which is a contact portion in contact with the second electrode, in a surface layer of the rear surface of the semiconductor substrate;

radiating protons to the rear surface of the semiconductor substrate after the first annealing process; and activating the protons radiated to the rear surface of the semiconductor substrate using a second annealing process to form a second semiconductor layer of the first conductivity type, which has a higher impurity concentration than the semiconductor substrate, in a region that is deeper than the first semiconductor layer from the rear surface of the semiconductor substrate, wherein, during radiating protons, acceleration energy E of the protons when the second semiconductor layer with a range Rp is formed by the radiation of the protons satisfies the following Expression (2):

$$y=-0.0047x^4+0.0528x^3-0.2211x^2+0.9923x+5.0474,$$

where x is a logarithm log(Rp) of the range Rp and y is a logarithm log(E) of the acceleration energy E.

22. The method for manufacturing a semiconductor device according to claim 21, wherein the first electrode is an input electrode and the second electrode is an output electrode.

23. The method for manufacturing a semiconductor device according to claim 21, wherein the semiconductor device is an insulated gate bipolar transistor (IGBT), the first semiconductor layer is a collector layer of a second conductivity type, and the second electrode is a collector electrode.

* * * * *